(12) United States Patent
Park et al.

(10) Patent No.: US 11,855,122 B2
(45) Date of Patent: Dec. 26, 2023

(54) DISPLAY DEVICE

(71) Applicant: Samsung Display Co., Ltd., Yongin-Si (KR)

(72) Inventors: Do Yeong Park, Hwaseong-si (KR); Kyung Bae Kim, Seongnam-si (KR); No Kyung Park, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 381 days.

(21) Appl. No.: 17/196,869

(22) Filed: Mar. 9, 2021

(65) Prior Publication Data

US 2021/0335883 A1  Oct. 28, 2021

(30) Foreign Application Priority Data

Apr. 24, 2020 (KR) .......................... 10-2020-0049836

(51) Int. Cl.
*H01L 27/15* (2006.01)
*H01L 33/38* (2010.01)
*H01L 33/62* (2010.01)

(52) U.S. Cl.
CPC .......... *H01L 27/156* (2013.01); *H01L 33/387* (2013.01); *H01L 33/62* (2013.01)

(58) Field of Classification Search
None
See application file for complete search history.

(56) References Cited

U.S. PATENT DOCUMENTS

2021/0288033 A1\* 9/2021 Lim ........................ H01L 33/08

FOREIGN PATENT DOCUMENTS

| EP | 3823028 A1 | 5/2021 |
|---|---|---|
| EP | 3836217 A1 | 6/2021 |
| KR | 2017-0141305 A | 12/2017 |
| KR | 2018-0009014 A | 1/2018 |
| KR | 2018-0009015 A | 1/2018 |
| KR | 2018-0011404 A | 2/2018 |
| KR | 2020-0006208 A | 1/2020 |
| WO | 2020-013386 A1 | 1/2020 |
| WO | 2020-032335 A1 | 2/2020 |

OTHER PUBLICATIONS

European Communication corresponding to European Patent Application No. 21156726.8 dated Aug. 3, 2021 10 pages.

\* cited by examiner

*Primary Examiner* — Robert K Carpenter
(74) *Attorney, Agent, or Firm* — Innovation Counsel LLP

(57) ABSTRACT

A display device includes subpixels comprising a plurality of first type subpixels and a plurality of second type subpixels, a plurality of electrodes, each comprising an electrode stem portion and at least one electrode protrusion portion, a plurality of light emitting elements having a shape of extending in one direction and disposed on the electrode stem portion of the one electrode and the electrode protrusion portion of the other electrode, and a plurality of first contact electrodes contacting a first end of the light emitting elements and a plurality of second contact electrodes contacting a second end of the light emitting elements, wherein the light emitting elements comprise first type light emitting elements and second type light emitting elements, and the first ends of the first type light emitting elements and the second type light emitting elements face in opposite directions.

20 Claims, 21 Drawing Sheets

DISPLAY DEVICE

This application claims priority to Korean Patent Application No. 10-2020-0049836 filed on Apr. 24, 2020 in the Korean Intellectual Property Office, and all the benefits accruing therefrom under 35 U.S.C. 119; the Korean Patent Application is incorporated by reference.

BACKGROUND

1. Field

The technical field relates to a display device.

2. Description of the Related Art

Display devices may display images according to input signals. Modern display devices include light emitting display devices and liquid crystal display devices.

A light emitting display device typically includes a light emitting display panel. The light emitting display panel may include light emitting elements such as light emitting diodes (LEDs). The LEDs may be organic light emitting diodes (OLEDs) including an organic fluorescent material or may be inorganic LEDs including an inorganic fluorescent material.

SUMMARY

Embodiments may be related to an inorganic light emitting element display device including an electrode structure configured for preventing a potential short circuit between wires and/or for maximizing an emission area per pixel.

According to an embodiment, a display device comprises subpixels comprising a plurality of first type subpixels and a plurality of second type subpixels which neighbor each other in a first direction and are alternately and repeatedly arranged, a plurality of electrodes, each comprising an electrode stem portion which is disposed in each of the subpixels and extends in a second direction and at least one electrode protrusion portion which is connected to the electrode stem portion and disposed over another subpixel neighboring in the first direction, a plurality of light emitting elements having a shape of extending in one direction and disposed on the electrode stem portion of the one electrode and the electrode protrusion portion of the other electrode, and a plurality of first contact electrodes contacting a first end of the light emitting elements and a plurality of second contact electrodes contacting a second end of the light emitting elements, wherein the light emitting elements comprise first type light emitting elements disposed in each of the first type subpixels and of which the first end is disposed on the electrode stem portion and second type light emitting elements disposed in each of the second type subpixels and of which the first end is disposed on the electrode protrusion portion, and the first ends of the first type light emitting elements and the second type light emitting elements face in opposite directions.

The plurality of electrodes comprises a first electrode whose electrode stem portion is disposed in each of the first type subpixels and a second electrode whose electrode stem portion is disposed in each of the second type subpixels, wherein the electrode protrusion portion of the first electrode is spaced apart from the electrode stem portion of the second electrode in each of the second type subpixels, and the electrode protrusion portion of the second electrode is spaced apart from the electrode stem portion of the first electrode in another the first type subpixels.

A first contact electrode disposed in each of the first type subpixels is disposed on the electrode stem portion of the first electrode, a first contact electrode disposed in each of the second type subpixels is disposed on the electrode protrusion portion of the first electrode, a second contact electrode disposed in each of the first type subpixels is disposed on the electrode protrusion portion of the second electrode, and a second contact electrode disposed in each of the second type subpixels is disposed on the electrode stem portion of the second electrode.

Each of the first contact electrodes directly contacts the first electrode, and each of the second contact electrodes does not contact the second electrode.

The display device further comprises a plurality of electrode contact portions, each disposed in each of the first type subpixels and the second type subpixels and spaced apart from the first electrode and the second electrode.

Each of the first contact electrodes and the second contact electrodes comprises a portion extending in the second direction, and each of the second contact electrodes further comprises a portion contacting an electrode contact portion.

A first power supply voltage is applied to each of the electrode contact portions, a second power supply voltage is applied to the first electrode, the first power supply voltage is transmitted to the second ends of the light emitting elements through each of the second contact electrodes, and the second power supply voltage is transmitted to the first ends of the light emitting elements through each of the first contact electrodes.

Each of the first electrode and the second electrode comprises a first electrode protrusion portion protruding toward a first side of the first direction and a second electrode protrusion portion protruding toward a second side of the first direction, wherein the first electrode protrusion portion of the first electrode is spaced apart from the electrode stem portion of the second electrode in each of the second type subpixels, the second electrode protrusion portion of the second electrode is spaced apart from the electrode stem portion of the first electrode in each of the first type subpixels, and the first electrode protrusion portion of the first electrode is spaced apart from the second electrode protrusion portion of the second electrode in the second direction.

The first type light emitting elements comprise a first light emitting element whose the second end is disposed on the first electrode protrusion portion of the second electrode and a second light emitting element whose the second end is disposed on the second electrode protrusion portion of the second electrode, and the second type light emitting elements comprise a third light emitting element whose the first end is disposed on the first electrode protrusion portion of the first electrode and a fourth light emitting element whose the first end is disposed on the second electrode protrusion portion of the first electrode.

The first contact electrode disposed in each of the first type subpixels is disposed on the electrode stem portion of the first electrode and contacts the first end of the second light emitting element, the second contact electrode disposed in each of the first type subpixels is disposed on the first electrode protrusion portion of the second electrode and contacts the second end of the first light emitting element, and further comprising a third contact electrode which is disposed to contact the first end of the first light emitting element and the second end of the second light emitting element.

The third contact electrode is disposed over the electrode stem portion of the first electrode and the second electrode protrusion portion of the second electrode.

Each of the first electrode and the second electrode further comprises a third electrode protrusion portion which protrudes toward the first side of the first direction, the first type light emitting elements further comprise a fifth light emitting element whose the second end is disposed on the third electrode protrusion portion of the second electrode, and the second type light emitting elements further comprise a sixth light emitting element whose the first end is disposed on the third electrode protrusion portion of the first electrode.

The first contact electrode disposed in each of the first type subpixels is disposed on the electrode stem portion of the first electrode and contacts the first end of the fifth light emitting element, the second contact electrode disposed in each of the first type subpixels is disposed on the first electrode protrusion portion of the second electrode and contacts the second end of the first light emitting element, and further comprising a third contact electrode which is disposed to contact the first end of the first light emitting element and the second end of the second light emitting element and a fourth contact electrode which is disposed to contact the first end of the second light emitting element and the second end of the fifth light emitting element.

According to an embodiment, a display device comprises a plurality of first subpixels and a plurality of second subpixels which neighbor each other in a first direction and are alternately and repeatedly arranged, a first electrode which comprises a first electrode stem portion disposed in each of the first subpixels and extending in a second direction, a first electrode facing portion disposed in each of the second subpixels and extending in the second direction, and an electrode connection portion connecting the first electrode stem portion and the first electrode facing portion, a second electrode which comprises a second electrode stem portion disposed in each of the second subpixels and extending in the second direction, a second electrode facing portion disposed in each of the first subpixels and extending in the second direction, and an electrode separation portion connected to the second electrode facing portion but is separated from the second electrode stem portion, a plurality of light emitting elements which have a first end disposed on the first electrode and a second end disposed on the second electrode, and a plurality of first contact electrodes which are disposed on the first electrode and contacts the first end of the light emitting elements, and a plurality of second contact electrodes which are disposed on the second electrode to contacts the second end of the light emitting elements, wherein the light emitting elements comprise a first light emitting element disposed in each of the first subpixels and of which the first end is disposed on the first electrode stem portion and the second end is disposed on the second electrode facing portion and a second light emitting element disposed in each of the second subpixels and of which the first end is disposed on the first electrode facing portion and the second end is disposed on the second electrode stem portion.

A first contact electrode disposed in each of the first subpixels is disposed on the first electrode stem portion, a first contact electrode disposed in each of the second subpixels is disposed on the first electrode facing portion, a second contact electrode disposed in each of the first subpixels is disposed on the second electrode facing portion, and a second contact electrode disposed in each of the second subpixels is disposed on the second electrode stem portion.

Each of the first contact electrodes directly contacts the first electrode stem portion or the first electrode facing portion, and each of the second contact electrodes directly contacts the second electrode stem portion or the second electrode facing portion.

The first electrode comprises a plurality of electrode connection portions connected to a first side and a second side of the first electrode stem portion in the first direction and a plurality of first electrode facing portions respectively connected to the electrode connection portions and disposed on the first side or the second side of the first electrode stem portion in the first direction, and the second electrode comprises a plurality of second electrode facing portions disposed on a first side or a second side of the second electrode stem portion in the first direction and spaced apart from the second electrode stem portion.

The light emitting elements further comprise a third light emitting element disposed in each of the first subpixels and of which the first end is disposed on the first electrode stem portion and the second end is disposed on a second electrode facing portion disposed on the second side of the second electrode stem portion in the first direction.

The display device further comprises a third contact electrode which is disposed to contact the first end of the first light emitting element and the second end of the third light emitting element.

The third contact electrode directly contacts the second electrode facing portion disposed on the second side of the second electrode stem portion in the first direction.

DETAILED DESCRIPTION

Example embodiments are described with reference to the accompanying drawings. Practical embodiments may be embodied in different forms and should not be construed as limited to the example embodiments.

Although the terms "first," "second," etc. may be used herein to describe various elements, these elements should not be limited by these terms. These terms are used to distinguish one element from another element. For instance, a first element discussed below could be termed a second element without departing from the teachings of the disclosure. Similarly, the second element could also be termed the first element. The description of an element as a "first" element may not require or imply the presence of a second element or other elements. The terms "first," "second," etc. may be used to differentiate different categories or sets of elements. For conciseness, the terms "first," "second," etc. may represent "first-type (or first-set)," "second-type (or second-set)," etc., respectively.

The term "connect" may mean "electrically connect" or "electrically connected through no intervening transistor." The term "insulate" may mean "electrically insulate" or "electrically isolate." The term "conductive" may mean "electrically conductive." The term "drive" may mean "operate" or "control." The term "extension" may mean "protrusion."

Figure 1:
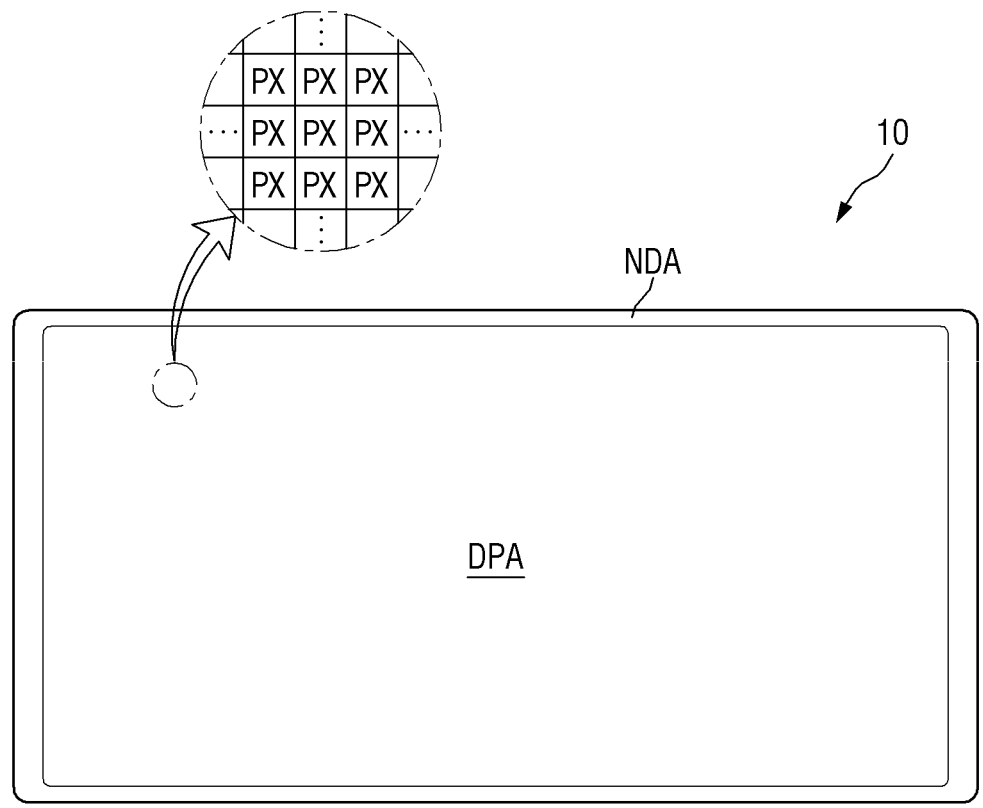
FIG. 1 is a plan view of a display device according to an embodiment.

FIG. 1 is a schematic plan view of a display device 10 according to an embodiment.

The display device 10 may display moving images or still images. The display device 10 may represent an electronic device that includes a display screen. Examples of the display device 10 may include televisions, notebook computers, monitors, billboards, the Internet of things (IoT), mobile phones, smartphones, tablet personal computers (PCs), electronic watches, smart watches, watch phones, head mounted displays, mobile communication terminals, electronic notebooks, electronic books, portable multimedia players (PMPs), navigation devices, game machines, digital cameras and camcorders.

The display device 10 includes a display panel that provides a display screen. Examples of the display panel include inorganic light emitting diode (LED) display panels, organic light emitting display panels, quantum dot light emitting display panels, plasma display panels, and field emission display panels. An inorganic LED display panel is described as an example.

The shape of the display device 10 can be variously modified. For example, the display device 10 may have various shapes such as a horizontally long rectangle, a vertically long rectangle, a square, a quadrangle with rounded corners (vertices), other polygons, and a circle. The shape of a display area DPA of the display device 10 may also be similar to the overall shape of the display device 10. In FIG. 1, each of the display device 10 and the display area DPA is shaped like a horizontally long rectangle.

The display device 10 may include the display area DPA and a non-display area NDA. The display area DPA may be an area where a screen can be displayed, and the non-display area NDA may be an area where no screen is displayed. The display area DPA may also be referred to as an active area, and the non-display area NDA may also be referred to as an inactive area. The display area DPA may generally occupy a center of the display device 10.

The display area DPA may include a plurality of pixels PX. The pixels PX may be arranged in a matrix direction. Each of the pixels PX may be rectangular or square in a plan view of the display area DPA. Each of the pixels PX may also have a rhombic planar shape having each side inclined with respect to a direction. The pixels PX may be alternately arranged in a stripe or PENTILE™ configuration. Each of the pixels PX may include one or more light emitting elements ED which emit light of a specific wavelength band to display a specific color.

The non-display area NDA may be disposed around the display area DPA. The non-display area NDA may entirely or partially surround the display area DPA. The display area DPA may be rectangular, and the non-display area NDA may be disposed adjacent to four sides of the display area DPA. The non-display area NDA may form a bezel of the display device 10. In each non-display area NDA, wires or circuit drivers included in the display device 10 may be disposed, or external devices may be mounted.

Figure 2:
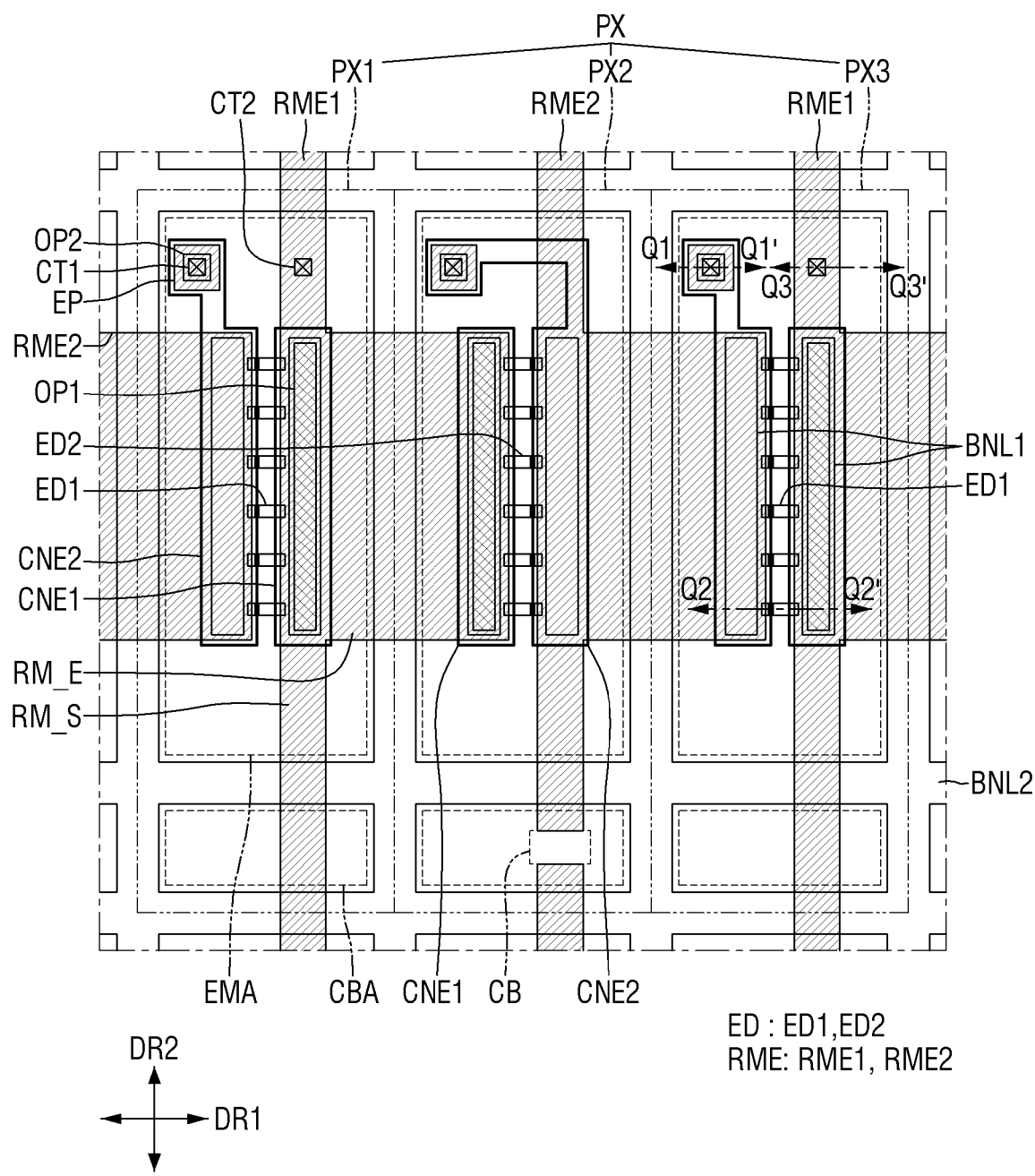
FIG. 2 is a plan view of a pixel of the display device according to the embodiment.

FIG. 2 is a plan view of a pixel PX of the display device 10 according to the embodiment.

Referring to FIG. 2, each of the pixels PX may include a plurality of subpixels PXn (where n is an integer of 1 to 3). For example, one pixel PX may include a first subpixel PX1, a second subpixel PX2, and a third subpixel PX3. The first subpixel PX1 may emit light of a first color, the second subpixel PX2 may emit light of a second color, and the third subpixel PX3 may emit light of a third color. For example, the first color may be blue, the second color may be green, and the third color may be red. The subpixels PXn may emit light of the same color. The pixel PX may include more subpixels PXn.

Each subpixel PXn of the display device 10 may include an emission area EMA and a non-emission area (not illustrated). The emission area EMA may be an area in which light emitting elements ED are disposed to output light of a specific wavelength band, and the non-emission area may be an area in which the light emitting elements ED are not disposed and from which no light is output because light emitted from the light emitting elements ED does not reach this area. The emission area EMA may include an area where the light emitting elements ED are disposed and where light emitted from the light emitting elements ED is output to an area adjacent to the light emitting elements ED.

The emission area EMA may include an area from which light emitted from the light emitting elements ED is output after being reflected or refracted by other members. A plurality of light emitting elements ED may be disposed in each subpixel PXn, and an area where the light emitting elements ED are disposed and an area adjacent to this area may form the emission area EMA.

Each subpixel PXn may include a cut area CBA disposed in the non-emission area. The cut area CBA may be disposed on a side of the emission area EMA in a second direction DR2. The cut area CBA may be disposed between the emission areas EMA of subpixels PXn neighboring each other in the second direction DR2. That is, a plurality of emission areas EMA and a plurality of cut areas CBA may be arranged in the display area DPA of the display device 10.

For example, the emission areas EMA and the cut areas CBA may be repeatedly arranged in a first direction DR1 but may be alternately arranged in the second direction DR2. A second bank BNL2 may be disposed between the cut areas CBA and the emission areas EMA, and a gap between the cut areas CBA and the emission areas EMA may vary according to a width of the second bank BNL2. Light may not be output from the cut areas CBA because the light emitting elements ED are not disposed in the cut areas CBA, but a portion of an electrode RME disposed in each subpixel PXn may be disposed in the cut area CBA. The electrodes RME disposed in some subpixels PXn may be separated from each other in the cut area CBA. The electrodes RME may not be separated from each other in the cut area CBA.

Figure 3:
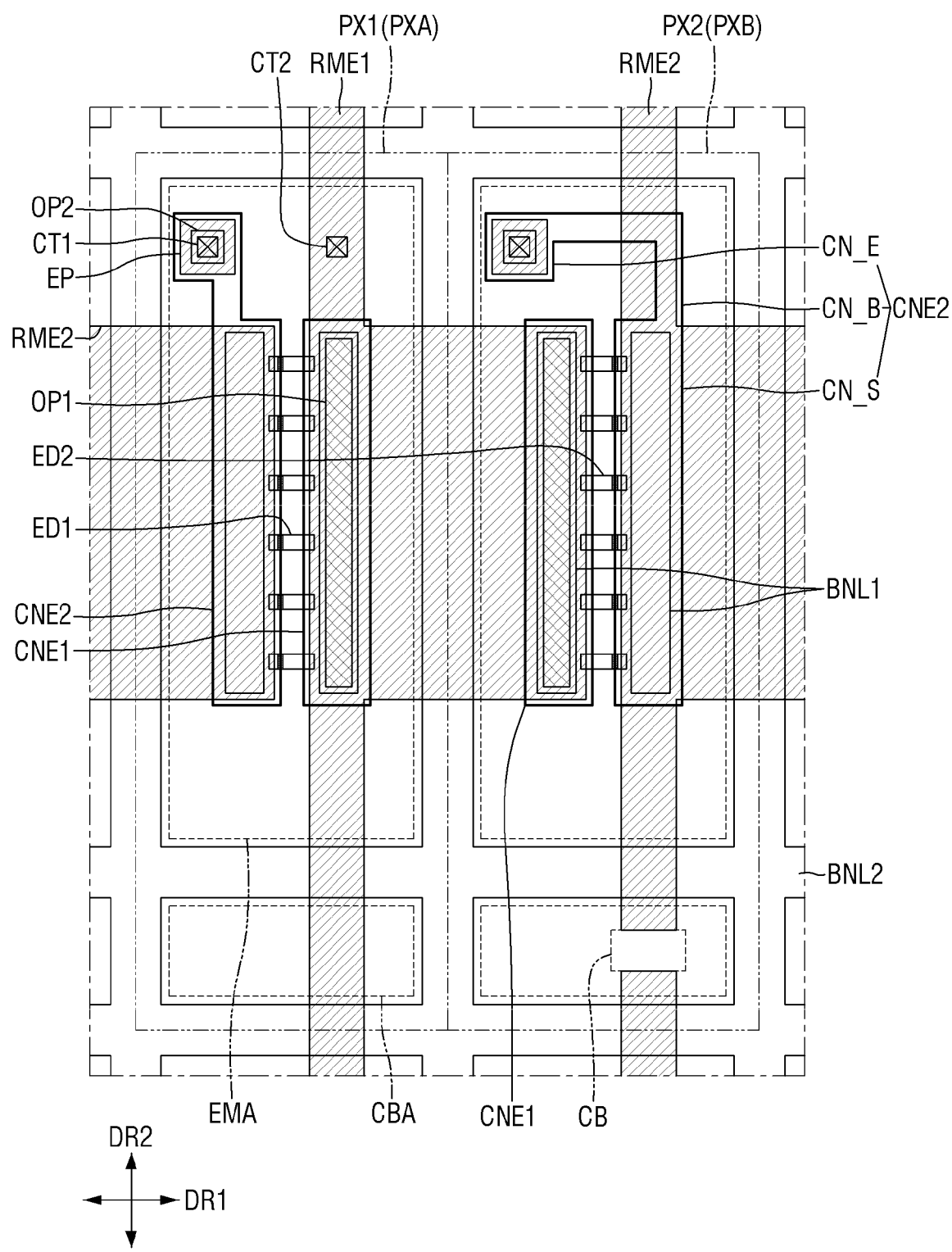
FIG. 3 is a plan view of a first subpixel and a second subpixel of the display device according to the embodiment.
Figure 4:
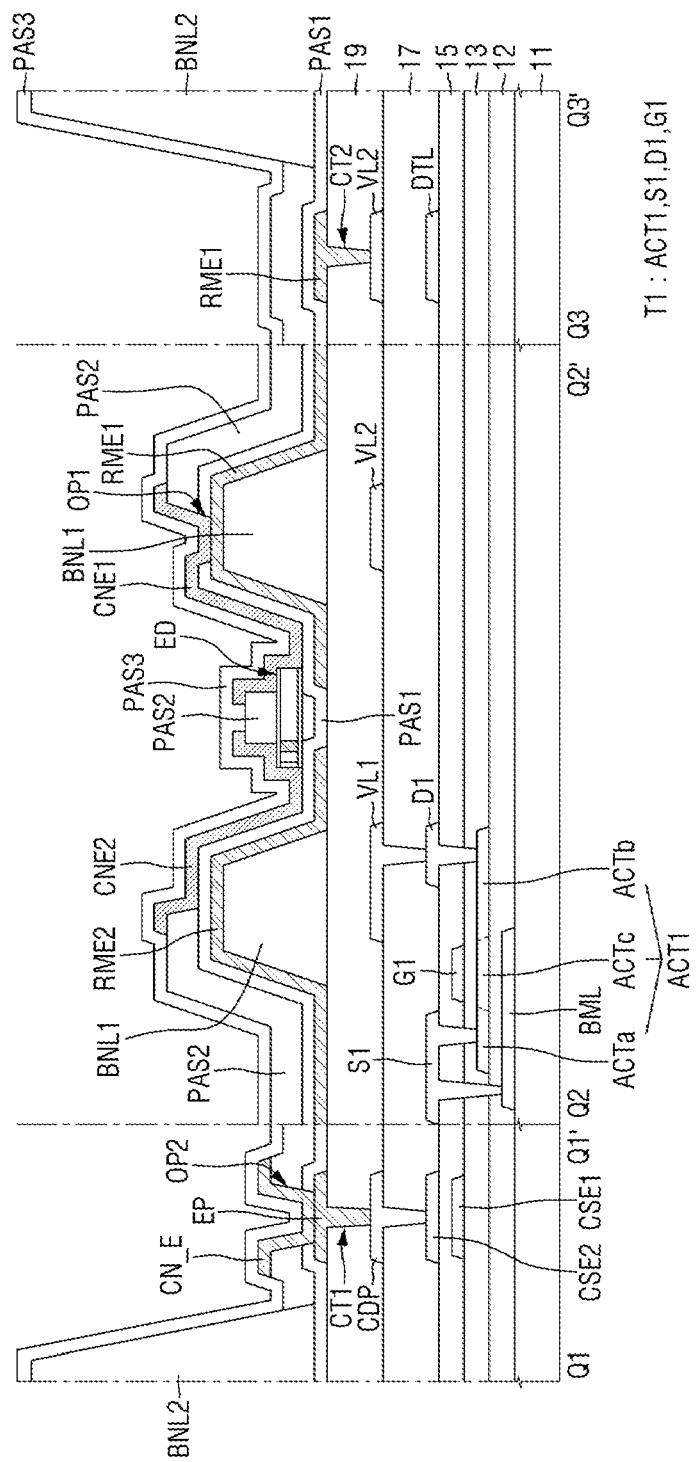
FIG. 4 is a cross-sectional view taken along lines Q1-Q1', Q2-Q2' and Q3-Q3' of FIG. 2 according to the embodiment.

FIG. 3 is a plan view of the first subpixel PX1 and the second subpixel PX2 of FIG. 2. FIG. 4 is a cross-sectional view taken along lines Q1-Q1', Q2-Q2', and Q3-Q3' of FIG. 2. FIG. 4 illustrates a cross section across an end and the other end of a light emitting element ED disposed in the third subpixel PX3.

Referring to FIGS. 3 and 4 in connection with FIG. 2, the display device 10 may include a first substrate 11 and a semiconductor layer, a plurality of conductive layers and a plurality of insulating layers disposed on the first substrate 11. The semiconductor layer, the conductive layers, and the insulating layers may constitute a circuit layer and a light emitting element layer of the display device 10.

Specifically, the first substrate 11 may be an insulating substrate. The first substrate 11 may be made of an insulating material such as glass, quartz, or polymer resin. In addition, the first substrate 11 may be a rigid substrate, but may also be a flexible substrate that can be bent, folded, and rolled.

A light blocking layer BML may be disposed on the first substrate 11. The light blocking layer BML is overlapped by an active layer ACT1 of a first transistor T1 of the display device 10. The light blocking layer BML may include a light blocking material to prevent light from entering the active layer ACT1 of the first transistor T1. For example, the light blocking layer BML may be made of an opaque metal material that blocks transmission of light. The light blocking layer BML may be optional.

A buffer layer 12 may be disposed on the entire surface of the first substrate 11 having the light blocking layer BML. The buffer layer 12 may be formed on the first substrate 11 to protect the first transistors T1 of the pixels PX from moisture introduced through the first substrate 11 which is vulnerable to moisture penetration and may perform a surface planarization function. The buffer layer 12 may be composed of a plurality of inorganic layers stacked alternately. For example, the buffer layer 12 may be a multilayer in which inorganic layers including at least one of silicon oxide (SiOx), silicon nitride (SiNx), and silicon oxynitride (SiOxNy) are (alternately) stacked.

The semiconductor layer is disposed on the buffer layer 12. The semiconductor layer may include the active layer ACT1 of the first transistor T1. The active layer ACT1 may be partially overlapped by a gate electrode G1 of a first gate conductive layer.

The display device 10 may also include more transistors. For example, the display device 10 may include two or three transistors by including one or more transistors in addition to the first transistor T1 in each subpixel PXn.

The semiconductor layer may include polycrystalline silicon, monocrystalline silicon, an oxide semiconductor, or the like. When the semiconductor layer includes an oxide semiconductor, each active layer ACT1 may include a plurality of conducting regions ACTa and ACTb and a channel region ACTc disposed between them. The oxide semiconductor may be an oxide semiconductor containing indium (In). For example, the oxide semiconductor may be indium tin oxide (ITO), indium zinc oxide (IZO), indium gallium oxide (IGO), indium zinc tin oxide (IZTO), indium gallium tin oxide (IGTO), or indium gallium zinc tin oxide (IGZTO).

In an embodiment, the semiconductor layer may include polycrystalline silicon. The polycrystalline silicon may be formed by crystallizing amorphous silicon. In this case, each of the conducting regions ACTa and ACTb of the active layer ACT1 may be a doping region doped with impurities.

A first gate insulating layer 13 is disposed on the semiconductor layer and the buffer layer 12. The first gate insulating layer 13 may be disposed on the buffer layer 12 having the semiconductor layer. The first gate insulating layer 13 may function as a gate insulating film of each transistor. The first gate insulating layer 13 may be an inorganic layer including an inorganic material such as silicon oxide (SiOx), silicon nitride (SiNx) or silicon oxynitride (SiOxNy) or may have a structure in which the above materials are stacked.

The first gate conductive layer is disposed on the first gate insulating layer 13. The first gate conductive layer may include the gate electrode G1 of the first transistor T1 and a first capacitive electrode CSE1 of a storage capacitor. The gate electrode G1 may overlap the channel region ACTc of the active layer ACT1 in a thickness direction. The first capacitive electrode CSE1 may be overlapped by a second capacitive electrode CSE2, which will be described later, in the thickness direction. In an embodiment, the first capacitive electrode CSE1 may be integrally connected to the gate electrode G1. The first capacitive electrode CSE1 may be overlapped by the second capacitive electrode CSE2, and the storage capacitor may be formed between them.

The first gate conductive layer may be a single layer or a multilayer structure made of or including one or more of molybdenum (Mo), aluminum (Al), chromium (Cr), gold (Au), titanium (Ti), nickel (Ni), neodymium (Nd), copper (Cu), and an alloy of some of the metals.

A first interlayer insulating layer 15 is disposed on the first gate conductive layer. The first interlayer insulating layer 15 may function as an insulating film between the first gate conductive layer and other layers disposed on the first gate conductive layer. The first interlayer insulating layer 15 may cover and protect the first gate conductive layer. The first interlayer insulating layer 15 may be an inorganic layer including an inorganic material such as silicon oxide (SiOx), silicon nitride (SiNx) or silicon oxynitride (SiOxNy) or may have a structure in which the above materials are stacked.

A first data conductive layer is disposed on the first interlayer insulating layer 15. The first data conductive layer may include a first source electrode S1 and a first drain electrode D1 of the first transistor T1, a data line DTL, and the second capacitive electrode CSE2.

The first source electrode S1 and the first drain electrode D1 of the first transistor T1 may respectively contact the doping regions ACTa and ACTb of the active layer ACT1 through contact holes penetrating the first interlayer insulating layer 15 and the first gate insulating layer 13. The first source electrode S1 of the first transistor T1 may be electrically connected to the light blocking layer BML through another contact hole.

The data line DTL may transmit a data signal to other transistors (not illustrated) included in the display device 10. Although not illustrated in the drawings, the data line DTL may be connected to source/drain electrodes of other transistors and may transmit a received signal to the source/drain electrodes.

The second capacitive electrode CSE2 overlaps the first capacitive electrode CSE1 in the thickness direction. In an embodiment, the second capacitive electrode CSE2 may be integrally connected to the first source electrode S1.

The first data conductive layer may be a single layer or a multilayer structure made of or including one or more of molybdenum (Mo), aluminum (Al), chromium (Cr), gold (Au), titanium (Ti), nickel (Ni), neodymium (Nd), copper (Cu), and an alloy of some the metals.

A second interlayer insulating layer 17 is disposed on the first data conductive layer. The second interlayer insulating layer 17 may function as an insulating film between the first data conductive layer and other layers disposed on the first data conductive layer. The second interlayer insulating layer 17 may cover and protect the first data conductive layer. The second interlayer insulating layer 17 may be an inorganic layer including an inorganic material such as silicon oxide (SiOx), silicon nitride (SiNx) or silicon oxynitride (SiOxNy) or may have a structure in which the above materials are stacked.

A second data conductive layer is disposed on the second interlayer insulating layer 17. The second data conductive layer may include a first voltage wiring VL1, a second voltage wiring VL2, and a first conductive pattern CDP. A high-potential voltage (or a first power supply voltage) supplied to the first transistor T1 may be applied to the first voltage wiring VL1, and a low-potential voltage (or a second power supply voltage) supplied to a second electrode RME2 may be applied to the second voltage wiring VL2. An alignment signal needed to align the light emitting elements ED may be transmitted to the second voltage wiring VL2 during a manufacturing process of the display device 10.

The first conductive pattern CDP may be connected to the second capacitive electrode CSE2 through a contact hole formed in the second interlayer insulating layer 17. The second capacitive electrode CSE2 may be integrated with the first source electrode S1 of the first transistor T1, and the first conductive pattern CDP may be electrically connected to the first source electrode S1. The first conductive pattern CDP may also contact an electrode RME to be described later, and the first transistor T1 may transmit the first power supply voltage received from the first voltage wire VL1 to a first electrode RME1 through the first conductive pattern CDP. The second data conductive layer may include more first voltage wires VL1 and more second voltage wires VL2.

The second data conductive layer may be, a single layer or a multilayer structure made of or include one or more of molybdenum (Mo), aluminum (Al), chromium (Cr), gold (Au), titanium (Ti), nickel (Ni), neodymium (Nd), copper (Cu), and an alloys of some of the metals.

A first planarization layer 19 is disposed on the second data conductive layer. The first planarization layer 19 may include an organic insulating material such as polyimide (PI) and perform a surface planarization function.

A plurality of first banks BNL1, a plurality of electrodes RME, the light emitting elements ED, a plurality of contact electrodes CNE1 and CNE2, and the second bank BNL2 are disposed on the first planarization layer 19. A plurality of insulating layers PAS1 through PAS3 may be disposed on the first planarization layer 19.

The first banks BNL1 may be directly disposed on the first planarization layer 19. The first banks BNL1 may extend in the second direction DR2 in each subpixel PXn but may be disposed within the emission area EMA without extending to other subpixels PXn neighboring in the second direction DR2. The first banks BNL1 may be spaced apart from each other in the first direction DR1, and the light emitting elements ED may be disposed between them. The first banks BNL1 may be disposed in each subpixel PXn in the display area DPA of the display device 10 to form linear patterns. More first banks BNL1 may be disposed depending on the number of areas where the light emitting elements ED are disposed in each subpixel PXn.

At least a portion of each of the first banks BNL1 may protrude from an upper surface of the first planarization layer 19. The protruding portion of each of the first banks BNL1 may have inclined side surfaces, and light emitted from the light emitting elements ED may be reflected by the electrodes RME disposed on the first banks BNL1 to travel toward above the first planarization layer 19. The first banks BNL1 may provide an area where the light emitting elements ED are disposed while functioning as reflective barriers that reflect light emitted from the light emitting elements ED in an upward direction. Outer surfaces of the first banks BNL1 may also have a curved semi-circular or semi-elliptical shape. The first banks BNL1 may include an organic insulating material such as polyimide (PI).

Each of the electrodes RME (RME1, RME2) includes a portion extending in a direction, and the extending portion is disposed in each subpixel PXn. According to an embodiment, each of the electrodes RME includes an electrode stem portion RM_S extending in the second direction DR2 and an electrode extension portion RM_E connected to the electrode stem portion RM_S and having a greater width. The electrode extension portion RM_E protrudes in the first direction DR1 from a side of the electrode stem portion RM_S in the first direction DR1 and extends to another neighboring subpixel PXn. Each electrode RME may be disposed across a boundary between subpixels PXn neighboring each other. For example, the electrode stem portion RM_S of the electrode RME extends in the second direction DR2 in the middle of each subpixel PXn to lie over the emission area EMA and the cut area CBA. The electrode extension portion RM_E is connected to a portion of the electrode stem portion RM_S disposed in the emission area EMA and has a greater width in the first direction DR1. The electrode extension portion RM_E may be connected to the electrode stem portion RM_S of the electrode RME disposed in one subpixel PXn and may be spaced apart from the electrode stem portion RM_S of another subpixel PXn neighboring the subpixel PXn in the first direction DR1. That is, the electrode extension portion RM_E may be disposed over subpixels PXn neighboring in the first direction DR1.

The electrodes RME of the display device 10 may include the first electrode RME1 whose electrode stem portion RM_S is disposed in each odd-column subpixel PXn and the second electrode RME2 whose electrode stem portion RM_S is disposed in each even-column subpixel PXn. The electrode stem portion RM_S disposed in each of the first subpixel PX1 and the third subpixel PX3 may be the electrode stem portion RM_S of the first electrode RME1, and the electrode stem portion RM_S disposed in the second subpixel PX2 may be the electrode stem portion RM_S of the second electrode RME2. The first electrode RME1 and the second electrode RME2 may be alternately and repeatedly arranged along the first direction DR1, and their electrode stem portions RM_S and electrode extension portions RM_E may be spaced apart from each other in the emission area EMA of each subpixel PXn.

The second electrode RME2 may extend in the second direction DR2 in each subpixel PXn, but may be spaced apart from another second electrode RME2 in the cut area CBA. For example, the cut area CBA may be disposed between the emission areas EMA of subpixels PXn neighboring in the second direction DR2, and the electrode stem portion RM_S of the second electrode RME2 may be, in the cut area CBA, separated from that of another second electrode RME2 disposed in a subpixel PXn neighboring in the second direction DR2. The electrode stem portion RM_S of the electrode RME disposed in each subpixel PXn may not be separated but may extend to a subpixel PXn neighboring in the second direction DR2.

Each of the first electrode RME1 and the second electrode RME2 covers the first banks BNL1. Each electrode RME may be wider than the first banks BNL1 and may cover the first banks BNL1 disposed in different subpixels PXn. For example, the electrode stem portion RM_S of the first electrode RME1 may cover one first bank BNL1 disposed in the first subpixel PX1, and the electrode extension portion RM_E of the first electrode RME1 may cover one first bank BNL1 disposed in the second subpixel PX2. The first electrode RME1 and the second electrode RME2 may respectively cover the first banks BNL1 spaced apart from each other within one subpixel PXn. That is, the first electrode RME1 and the second electrode RME2 may cover different first banks BNL1 disposed in one subpixel PXn and thus may be spaced apart from each other. The first electrode RME1 and the second electrode RME2 may be disposed on the side surfaces of the first banks BNL1, respectively, and a gap between the first electrode RME1 and the second electrode RME2 may be smaller than a gap between the first banks BNL1. At least a portion of each of the first electrode RME1 and the second electrode RME2 may be directly disposed on the first planarization layer 19 so that they lie on the same plane. In some cases, each electrode RME may be narrower than the first banks BNL1. Each electrode RME may cover at least one side surface of a first bank BNL1 to reflect light emitted from the light emitting elements ED.

According to an embodiment, an electrode contact portion EP disposed on the same layer as the electrode RME may be disposed in the emission area EMA of each subpixel PXn. The electrode contact portion EP may be spaced apart from the electrode stem portion RM_S of the electrode RME in the first direction DR1 and spaced apart from the electrode extension portion RM_E in the second direction DR2.

Part of the electrodes RME and the electrode contact portion EP may be electrically connected to the light emitting elements ED, and a predetermined voltage may be applied portion so that the light emitting elements ED can emit light. The electrodes RME and the electrode contact portion EP may be electrically connected to the light emitting elements ED through the contact electrodes CNE1 and CNE2, and electrical signals transmitted to the electrodes RME and the electrode contact portion EP may be transmitted to the light emitting elements ED through the contact electrodes CNE1 and CNE2.

The electrode contact portion EP may contact the first conductive pattern CDP through a first contact hole CT1 penetrating the first planarization layer 19 disposed under the electrode contact portion EP. The electrode contact portion EP may be electrically connected to the first transistor T1 through the first conductive pattern CDP and may also be electrically connected to the contact electrodes CNE1 and CNE2 to be described later. The electrode contact portion EP may serve as a connection electrode by which the contact electrodes CNE1 and CNE2 are electrically connected to the first transistor T1 under the contact electrodes CNE1 and CNE2. Since the electrode contact portion EP is spaced apart from each electrode RME, it may transmit an electrical signal transmitted to the first transistor T1 to the contact electrodes CNE1 and CNE2 regardless of signals transmitted to the electrodes RME. The electrode contact portion EP may be integrated with one of the electrodes RME.

Of the electrodes RME, the first electrode RME1 may contact the second voltage wire VL2 through a second contact hole CT2 penetrating the first planarization layer 19 disposed under the first electrode RME1. The first electrode RME1 may be electrically connected to the second voltage wire VL2 through the second contact hole CT2 formed in the electrode stem portion RM_S and may also be electrically connected to the contact electrodes CNE1 and CNE2 to be described later. The positions of the first contact hole CNT1 and the second contact hole CNT2 can be configured according to embodiments.

Each electrode RME may include a conductive material having high reflectivity. For example, each electrode RME may include a metal such as silver (Ag), copper (Cu) or aluminum (Al) as a material having high reflectivity or may be an alloy including aluminum (Al), nickel (Ni) or lanthanum (La). Each electrode RME may reflect light, which travels toward the side surfaces of the first banks BNL1 after being emitted from the light emitting elements ED, toward above each subpixel PXn.

Each electrode RME may further include a transparent conductive material. For example, each electrode RME may include ITO, IZO, or ITZO. In some embodiments, each electrode RME may have a structure in which a transparent conductive material and a metal layer having high reflectivity are stacked or may be formed as a single layer including the transparent conductive material and/or the metal layer. For example, each electrode RME may have a stacked structure of ITO-Ag-ITO, ITO-Ag-IZO, or ITO-Ag-ITZO-IZO.

Each of the first electrode RME1 and the second electrode RME2 may include more electrode extension portions RM_E or may further include a connection portion or a sub-extension portion connected to the electrode stem portion RM_S. The electrodes RME may further include an electrode having a different shape from the first electrode RME1 and the second electrode RME2.

The electrodes RME may be utilized to form an electric field in each subpixel PXn so as to align the light emitting elements ED. The light emitting elements ED may be placed on the first electrode RME1 and the second electrode RME2 by an electric field formed between the first electrode RME1 and the second electrode RME2. The light emitting elements ED may be sprayed onto the electrodes RME through an inkjet printing process. When an ink including the light emitting elements ED is sprayed onto the electrodes RME, an electric field is generated by transmitting alignment signals to the electrodes RME. The light emitting elements ED dispersed in the ink may be aligned on the electrodes RME by a dielectrophoretic force due to the electric field generated on the electrodes RME.

Each light emitting element ED may include semiconductor layers doped to have different conductivity types, and an end of each light emitting element ED may be oriented to face a specific direction according to the direction of an electric field generated on the electrodes RME. The light emitting elements ED disposed in each subpixel PXn may be oriented by an electric field generated by alignment signals of different signs. Since the electrodes RME to which alignment signals of different signs are transmitted are disposed in each subpixel PXn, the light emitting elements ED may be disposed between the electrodes RME.

When the electrodes RME to which alignment signals of different signs are transmitted are disposed in each subpixel PXn, the number of electrodes RME disposed per unit area of each subpixel PXn may increase. The electrode stem portions RM_S of the electrodes RME may extend in one direction and may be disposed in a wire area located in the non-display area NDA located outside the display area DPA. When a plurality of electrodes RME are disposed in each subpixel PXn of the display area DPA, a large number of electrode stem portions RM_S may be disposed in the wire area, and a gap between the electrode stem portions RM_S may be reduced, causing some electrodes RME to short-circuit each other. In particular, an ultra-high resolution display device 10 may have a large number of subpixels PXn per unit area, and a minimum gap required between electrodes to which different alignment signals are transmitted may be more insufficient.

In the display device 10 according to the embodiment, the shape of each electrode RME is designed such that a portion of one electrode RME is disposed over two neighboring subpixels PXn, thereby reducing the number of electrodes RME disposed in the display area DPA. In one subpixel PXn, the electrodes RME to which different alignments are transmitted, for example, the first electrode RME1 and the second electrode RME2 are disposed. However, since the electrode extension portion RM_E of each electrode RME is disposed in one or more subpixels PXn, different electrodes RME1 and RME2 may be made to be disposed in each subpixel PXn with only a small number of electrodes RME. Accordingly, the number of electrode stem portions RM_S disposed outside the display area DPA may be reduced, and a short circuit between the electrodes RME may be prevented, which may be advantageous for the implementation of the ultra-high resolution display device 10.

Since the electrodes RME1 and RME2 to which different alignment signals are transmitted are disposed across the boundary of each subpixel PXn, the direction of an electric field generated by the alignment signals transmitted to the electrodes RME1 and RME2 during the manufacturing process of the display device 10 may be different. For example, in the first subpixel PX1, the second electrode RME2 is disposed on a left side of a center of the emission area EMA, and the first electrode RME1 is disposed on a right side of the center of the emission area EMA. On the other hand, in the second subpixel PX2, the first electrode RME1 is disposed on the left side of the center of the emission area EMA, and the second electrode RME2 is disposed on the right side of the center of the emission area EMA. Accordingly, the direction of an electric field generated by the electrodes RME1 and RME2 may be different in the first subpixel PX1 and the second subpixel PX2, and the direction of a first end of each light emitting element ED oriented according to the direction of the electric field may also be different. In the display device 10 according to the embodiment, one electrode RME may be disposed over neighboring subpixels PXn, and the direction of the first end of each light emitting element ED may be different in different subpixels PXn. This will be described in more detail later.

A first insulating layer PAS1 is disposed on the first planarization layer 19. The first insulating layer PAS1 may cover the first banks BNL1, the electrodes RME, and the electrode contact portion EP. The first insulating layer PAS1 may protect the electrodes RME while insulating them from each other. In addition, the first insulating layer PAS1 may prevent the light emitting elements ED disposed on the first insulating layer PAS1 from directly contacting other members and thus being damaged.

In an embodiment, the first insulating layer PAS1 may include openings OP1 and OP2 partially exposing the first electrode RME1 and the electrode contact portion EP. For example, a first opening OP1 may partially expose a portion of the electrode extension portion RM_E of the first electrode RME1 which is disposed on an upper surface of the first bank BNL1. The second opening OP2 may expose a portion of an upper surface of the contact electrode EP. A portion of each of the contact electrodes CNE1 and CNE2 to be described later may contact the electrode RME or the electrode contact portion EP exposed through the opening OP1 or OP2. In addition, the openings OP1 and OP2 may simultaneously penetrate the first insulating layer PAS1 and a second insulating layer PAS2 to be described later.

The first insulating layer PAS1 may be stepped such that a portion of an upper surface of the first insulating layer PAS1 is recessed between the first electrode RME1 and the second electrode RME2. For example, since the first insulating layer PAS1 covers the first electrode RME1 and the second electrode RME2, the upper surface of the first insulating layer PAS1 may be stepped according to the shapes of the electrodes RME disposed under the first insulating layer PAS1.

The second bank BNL2 may be disposed on the first insulating layer PAS1. The second bank BNL2 may include portions extending in the first direction DR1 and the second direction DR2 to form a lattice pattern over the entire display area DPA in a plan view of the display device. The second bank BNL2 may be disposed between the boundaries of the subpixels PXn to separate neighboring subpixels PXn.

The second bank BNL2 may surround the emission area EMA and the cut area CBA disposed in each subpixel PXn to separate them from each other. The first electrode RME1 and the second electrode RME2 may extend in the second direction DR2 to cross a portion of the second bank BNL2 extending in the first direction DR1.

The second bank BNL2 may be formed to have a greater height than the first banks BNL1. The second bank BNL2 may prevent ink from overflowing to adjacent subpixels PXn in an inkjet printing process of the manufacturing process of the display device 10. Therefore, the second bank BNL2 may separate inks in which different light emitting elements ED are dispersed for different subpixels PXn so as to prevent the inks from being mixed with each other. Like the first banks BNL1, the second bank BNL2 may include polyimide (PI).

The light emitting elements ED may be disposed on the first insulating layer PAS1. The light emitting elements ED may be spaced apart from each other along the second direction DR2 in which each electrode RME extends and may be aligned substantially parallel to each other. The light emitting elements ED may extend in a direction, and the direction in which each electrode RME extends and the direction in which the light emitting elements ED extend may be substantially perpendicular to each other. The light emitting elements ED may extend in a direction not perpendicular but oblique to the direction in which each electrode RME extends.

The light emitting elements ED disposed in each of the subpixels PXn may include light emitting layers 36 (see FIG. 5) including different materials to emit light of different wavelength bands. Accordingly, the light of the first color, the light of the second color, and the light of the third color may be output from the first subpixel PX1, the second subpixel PX2, and the third subpixel PX3, respectively. The subpixels PXn may include the light emitting elements ED of the same type to emit light of substantially the same color.

Both ends of each light emitting element ED may be respectively disposed on the electrodes RME between the first banks BNL1. A length by which each light emitting element ED extends may be greater than the gap between the first electrode RME1 and the second electrode RME2. An end of each light emitting element ED may be disposed on the electrode stem portion RM_S of one electrode RME, and the other end may be disposed on the electrode extension portion RM_E of another electrode RME. In addition, both ends of each light emitting element ED may be disposed on the first electrode RME1 and the second electrode RME2, respectively. For example, an end of each light emitting element ED disposed in the second subpixel PX2 is disposed on the electrode extension portion RM_E of the first electrode RME1, and the other end is disposed on the electrode stem portion RM_S of the second electrode RME2.

Each light emitting element ED may include a plurality of layers disposed in a direction parallel to an upper surface of the first substrate 11 or the first planarization layer 19. The direction in which each light emitting element ED extends may be parallel to the upper surface of the first planarization layer 19, and a plurality of semiconductor layers included in each light emitting element ED may be sequentially disposed along the direction parallel to the upper surface of the first planarization layer 19. When each light emitting element ED has a different structure, the semiconductor layers may be disposed in a direction perpendicular to the upper surface of the first planarization layer 19.

Both ends of each light emitting element ED may contact the contact electrodes CNE1 and CNE2, respectively. For example, an insulating film 38 (see FIG. 5) may not be formed on end surfaces of each light emitting element ED in the direction in which each light emitting element ED extends, thereby partially exposing the semiconductor layers. The exposed semiconductor layers may contact the contact electrodes CNE1 and CNE2. At least a portion of the insulating film 38 of each light emitting element ED may be removed to partially expose side surfaces of both ends of the semiconductor layers. The exposed side surfaces of the semiconductor layers may directly contact the contact electrodes CNE1 and CNE2.

As will be described later, each light emitting element ED includes a first semiconductor layer 31 (see FIG. 5), a second semiconductor layer 32 (see FIG. 5), and the light emitting layer 36 (see FIG. 5) disposed between them. The first semiconductor layer 31 may be longer than the second semiconductor layer 32, and the first end of each light emitting element ED at which the first semiconductor layer 31 is disposed and a second end at which the second semiconductor layer 32 is disposed may be defined. The light emitting layer 36 may be disposed closer to the second end based on a longitudinal center of each light emitting element ED and may be disposed farther away from the first end.

In the display device 10, one electrode RME may be disposed over neighboring subpixels PXn, and different electrodes RME1 and RME2 may be partially disposed in one subpixel PXn. In some of the subpixels PXn of the display device 10, the first electrode RME1 may be disposed on the left side of the emission area EMA. In the other subpixels PXn, the second electrode RME2 may be disposed on the left side of the emission area EMA. According to an embodiment, the display device 10 may be divided into a first type subpixel PXA and a second type subpixel PXB according to the positions of the first electrode RME1 and the second electrode RME2, and the light emitting elements ED may include first type light emitting elements ED1 disposed in the first type subpixel PXA and second type light emitting elements ED2 disposed in the second type subpixel PXB.

During the manufacturing process of the display device 10, each light emitting element ED may be oriented such that the first end faces in the direction of an electric field generated on the electrodes RME1 and RME2 to which different alignment signals are transmitted. The first end of each light emitting element ED may be disposed on the second electrode RME2, and the second end may be disposed on the first electrode RME1. The first ends of the first type light emitting elements ED1 and the second type light emitting elements ED2 disposed in different types of subpixels may face in opposite directions.

For example, the first subpixel PX1 which is the first type subpixel PXA and the second subpixel PX2 which is the second type subpixel PXB are illustrated in FIG. 3. The third subpixel PX3 of FIG. 2 is the first type subpixel PXA, like the first subpixel PX1. In the first type subpixel PXA, since the first electrode RME1 is disposed on the right side of the center of the emission area EMA, each first type light emitting element ED1 of the first type subpixel PXA may be disposed such that the first end faces a first side of the first direction DR1 or the right side in the drawings. In the second type subpixel PXB, since the first electrode RME1 is disposed on the left side of the center of the emission area EMA, each second type light emitting element ED2 of the second type subpixel PXB may be disposed such that the first end faces a second side of the first direction DR1 or the left side in the drawings. The display device 10 may include the electrodes RME1 and RME2 partially disposed over neighboring subpixels PXn and include different types of subpixels PXA and PXB according to the types of the electrodes RME1 and RME2 disposed in each emission area EMA. Different types of subpixels PXA and PXB may include the light emitting elements ED1 and ED2 whose respective first ends are oriented in different directions.

Although not illustrated in the drawings, a subpixel disposed on a side or a right side of the third subpixel PX3 in the first direction DR1 may be the second type subpixel PXB which is the same as the second subpixel PX2 in the structures of the electrodes RME1 and RME2 and the direction of the first ends of the light emitting elements ED. However, since the first through third subpixels PX1 through PX3 emitting light of different colors may be repeatedly arranged in the display device 10, the subpixel disposed on the right side of the subpixel PX3 may emit light of the same color as the color of light emitted from the first subpixel PX1. In other words, although the subpixel disposed on the right side of the third subpixel PX3 is classified as the second type subpixel PXB based on the structures of the electrodes RME1 and RME2 and the direction of the first ends of the light emitting elements ED, the color of light emitted from the light emitting elements ED of the subpixel may be the same as the color of light emitted from the first subpixel PX1. In the display device 10, the first type subpixel PXA and the second type subpixel PXB distinguished from each other by the structures of the electrodes RME1 and RME2 and the direction of the first ends of the light emitting elements ED may be alternately and repeatedly arranged and, at the same time, may be repeatedly arranged as the first through third subpixels PX1 through PX3 emitting light of different colors. That is, the first type subpixel PXA does not necessarily correspond to the first subpixel PX1 or the third subpixel PX3, and the second type subpixel PXB does not necessarily correspond to the second subpixel PX2.

The second insulating layer PAS2 may be disposed on the first insulating layer PAS1 and the light emitting elements ED to expose both ends of each light emitting element ED. For example, the second insulating layer PAS2 may be entirely disposed on the first insulating layer PAS1 as well as the light emitting elements ED, but a portion of the second insulating layer PAS2 may be disposed on the light emitting elements ED to expose both ends of each light emitting element ED. The second insulating layer PAS2 may be disposed to cover the light emitting elements ED, the electrodes RME and the first insulating layer PAS1 and then removed to expose both ends of each light emitting element ED during the manufacturing process of the display device 10. The second insulating layer PAS2 may extend in the second direction DR2 on the first insulating layer PAS in a plan view and may form a linear or island pattern in each subpixel PXn. The second insulating layer PAS2 may protect the light emitting elements ED while fixing the light emitting elements ED in the manufacturing process of the display device 10.

A plurality of contact electrodes CNE1 and CNE2 may be disposed on the second insulating layer PAS2. The contact electrodes CNE1 and CNE2 may each include a portion extending in a direction and may be disposed on the electrodes RME, respectively. The contact electrodes CNE1 and CNE2 may include a first contact electrode CNE1 disposed on the first electrode RME1 and a second contact electrode CNE2 disposed on the second electrode RME2. Each of the first contact electrode CNE1 and the second contact electrode CNE2 may be disposed on the electrode stem portion RM_S or the electrode extension portion RM_E of the first electrode RME1 or the second electrode RME2. For example, the first contact electrode CNE1 disposed in the first subpixel PX1 may be disposed on the electrode stem portion RM_S of the first electrode RME1, and the first contact electrode CNE1 disposed in the second subpixel PX2 may be disposed on the electrode extension portion RM_E of the first electrode RME1.

In an embodiment, the first contact electrode CNE1 may extend in a direction. Unlike the first contact electrode, CNE1, the second contact electrode CNE2 may include a contact electrode stem portion CN_S disposed on each electrode RME and extending in a direction, a contact electrode extension portion CN_E disposed on the electrode contact portion EP disposed in the emission area EMA of each subpixel PXn, and a contact electrode connection portion CN_B connecting the contact electrode extension portion CN_E and the contact electrode stem portion CN_S. In the second contact electrode CNE2 disposed in the first type subpixel PXA, since the contact electrode stem portion CN_S and the contact electrode extension portion CN_E are disposed side by side, the contact electrode connection portion CN_B may be short. On the other hand, in the second contact electrode CNE2 disposed in the second type subpixel PXB, the contact electrode connection portion CN_B may extend in the first direction DR1 and the second direction DR2 and may be bent. The second contact electrode CNE2 may have substantially the same shape as the first contact electrode CNE1.

The contact electrodes CNE1 and CNE2 may be spaced apart from each other or may face each other. For example, the contact electrode stem portions CN_S of the first contact electrode CNE1 and the second contact electrode CNE2 may be respectively disposed on the first electrode RME1 and the second electrode RME2 and may be spaced apart from each other in the first direction DR1.

Each of the contact electrodes CNE1 and CNE2 may contact the light emitting elements ED. The first contact electrode CNE1 may contact the first ends of the light emitting elements ED, and the second contact electrode CNE2 may contact the second ends of the light emitting elements ED. The semiconductor layers may be exposed on both end surfaces of each light emitting element ED in the direction in which each light emitting element ED extends, and the contact electrodes CNE1 and CNE2 may directly contact and thus be electrically connected to the exposed semiconductor layers of each light emitting element ED, respectively. Respective sides of the contact electrodes CNE1 and CNE2 which contact both ends of each light emitting element ED may be disposed on the second insulating layer PAS2.

A width of each contact electrode CNE1 or CNE2 measured in a direction may be smaller than a width of each electrode RME measured in the direction. The contact electrodes CNE1 and CNE2 may be disposed to contact an end and the other end of each light emitting element ED while partially covering upper surfaces of the first electrode RME1 and the second electrode RME2. The contact electrodes CNE1 and CNE2 may be wider than the electrodes RME to cover both sides of each electrode RME.

The contact electrodes CNE1 and CNE2 may transmit an electrical signal received from the circuit layer disposed under the first planarization layer 19 to the light emitting elements ED. Each of the contact electrodes CNE1 and CNE2 may be electrically connected to the first transistor T1 or the second voltage wire VL2 through the electrode RME or the electrode contact portion EP. For example, the first contact electrode CNE1 may contact the first electrode RME1 through the first opening OP1 penetrating the first insulating layer PAS1 and the second insulating layer PAS2. The second power supply voltage may be transmitted to the first electrode RME1 through the second voltage wire VL2, and the first contact electrode CNE1 may transmit the second power supply voltage to the first end of each light emitting element ED. The contact electrode extension portion CN_E of the second contact electrode CNE2 may contact the electrode contact portion EP through the second opening OP2 penetrating the first insulating layer PAS1 and the second insulating layer PAS2. The first power supply voltage may be transmitted to the electrode contact portion EP through the first transistor T1, and the second contact electrode CNE2 may transmit the first power supply voltage to the second end of each light emitting element ED. The electrode stem portion RM_S of the second electrode RME2 of the second type subpixel PXB may be separated from that of another second electrode RME2 in a cut portion CB of the cut area CBA, may not be electrically connected to the circuit layer thereunder through the first contact hole CT1 or the second contact hole CT2, and may not contact the second contact electrode CNE2. That is, the second electrode RME2 disposed in each second type subpixel PXB may be a floating electrode to which an electrical signal is not transmitted while the display device 10 is driven. The second electrode RME2 may receive an alignment signal during the manufacturing process of the display device 10 and may be in a floating state in each subpixel PXn during the driving of the display device 10. The second contact electrode CNE2 disposed on the second electrode RME1 may receive the first power supply voltage through the electrode contact portion EP and transmit the first power supply voltage to the first end of each light emitting element ED without via the second electrode RME2.

Since the display device 10 includes the first type subpixel PXA and the second type subpixel PXB, the positions of the first electrode RME1 and the second electrode RME2 and the direction of the first ends of the light emitting elements ED1 or ED2 may be different in the first type subpixel PXA and the second type subpixel PXB. Similarly, according to an embodiment, the contact electrodes CNE1 and CNE2 disposed in the first type subpixel PXA and the second type subpixel PXB may be disposed at different positions based on the center of the emission area EMA. For example, in the first type subpixel PXA, the first contact electrode CNE1 may be disposed on the right side of the center of the emission area EMA, and the second contact electrode CNE2 may be disposed on the left side of the center of the emission area EMA. The contact electrodes CNE1 and CNE2 of the second type subpixel PXB may be disposed at opposite positions to those of the first type subpixel PXA.

The contact electrodes CNE1 and CNE2 may include a transparent conductive material. For example, the contact electrodes CNE1 and CNE2 may include ITO, IZO, ITZO, or aluminum (Al). Light emitted from the light emitting elements ED may pass through the contact electrodes CNE1 and CNE2 and proceed toward the electrodes RME.

The number of contact electrodes CNE1 and CNE2 may vary according to the number of electrodes RME disposed in each subpixel PXn.

A third insulating layer PAS3 may be entirely disposed on the entire display area DPA of the first substrate 11. The third insulating layer PAS3 may protect members disposed on the first substrate 11 from the external environment. However, the third insulating layer PAS3 can also be omitted.

Each of the first insulating layer PAS1, the second insulating layer PAS2, and the third insulating layer PAS3 described above may include an inorganic insulating material or an organic insulating material. For example, each of the first insulating layer PAS1, the second insulating layer PAS2, and the third insulating layer PAS3 may include an inorganic insulating material such as silicon oxide (SiOx), silicon nitride (SiNx), silicon oxynitride (SiOxNy), aluminum oxide ($Al_2O_3$), or aluminum nitride (AlN). Each of the first insulating layer PAS1, the second insulating layer PAS2, and the third insulating layer PAS3 may include an organic insulating material such as acrylic resin, epoxy resin, phenolic resin, polyamide resin, polyimide resin, unsaturated polyester resin, polyphenylene resin, polyphenylene sulfide resin, benzocyclobutene, cardo resin, siloxane resin, silsesquioxane resin, polymethyl methacrylate, polycarbonate, or polymethyl methacrylate-polycarbonate synthetic resin.

In the display device 10, since different electrodes RME1 and RME2 are disposed in each subpixel PXn, the light emitting elements ED and the contact electrode CNE1 and CNE2 may have different arrangement structures in the first type subpixel PXA and the second type subpixel PXB described above. Different alignment signals may be transmitted to the electrodes RME disposed in each subpixel PXn during the manufacturing process of the display device 10, and the arrangement of the light emitting elements ED and the contact electrodes CNE1 and CNE2 may be different in the first type subpixel PXA and the second type subpixel PXB even if the electrodes RME of the same shape are disposed over neighboring subpixels PXn. Since the display device 10 includes the electrodes RME structured to reduce the number of electrodes RME disposed per unit area of the display device 10, a short circuit between adjacent electrodes RME can be prevented. In addition, the display device 10 may include the first type subpixel PXA and the second type subpixel PXB in each of which the arrangement of the light emitting elements ED and the contact electrodes CNE1 and CNE2 is different.

Figure 5:
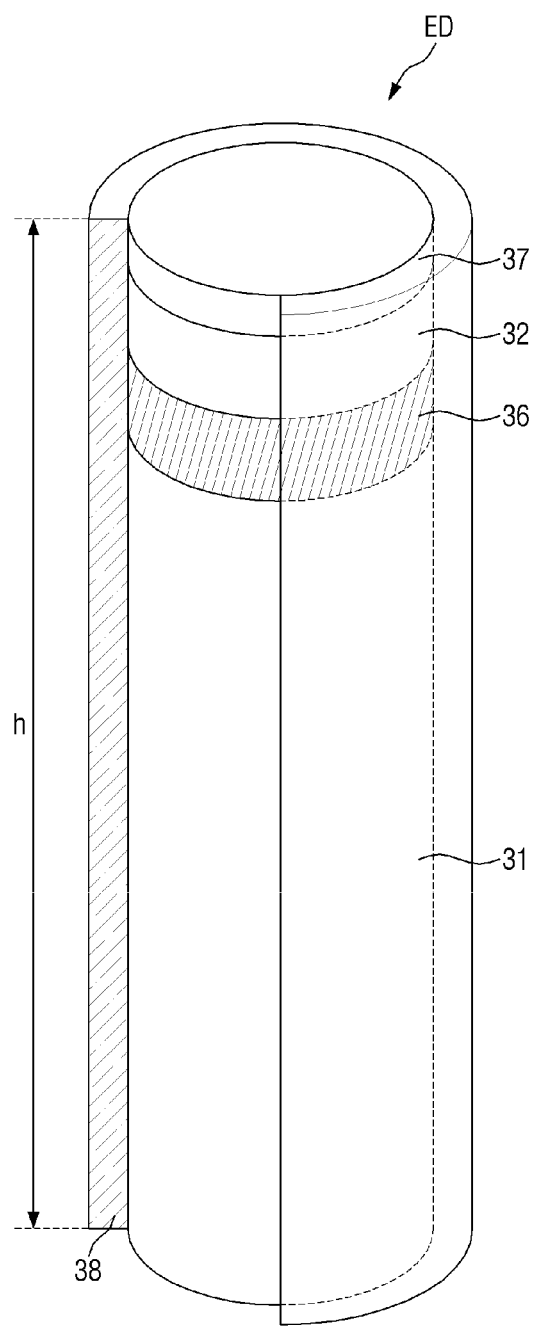
FIG. 5 is a schematic (perspective) view of a light emitting element according to an embodiment.

FIG. 5 is a schematic view of a light emitting element ED according to an embodiment.

The light emitting element ED may be an LED. Specifically, the light emitting element ED may be an inorganic LED having a size of micrometers or nanometers and made of an inorganic material. When an electric field is formed in a specific direction between two electrodes facing each other, the inorganic LED may be aligned between the two electrodes in which polarity is formed. The LED may be aligned between the electrodes by the electric field formed on the two electrodes.

The light emitting element ED according to the embodiment may extend in one direction. The light emitting element ED may be shaped like a cylinder, a rod, a wire, a tube, or the like. The light emitting element ED may have various shapes including polygonal prisms, such as a cube, a rectangular parallelepiped and a hexagonal prism, and a shape extending in a direction and having a partially inclined outer surface. A plurality of semiconductors included in the light emitting element ED may be sequentially disposed or stacked along the one direction.

The light emitting element ED may include a semiconductor layer doped with impurities of any conductivity type (e.g., a p type or an n type). The semiconductor layer may receive an electrical signal from an external power source and emit light of a specific wavelength band.

Referring to FIG. 5, the light emitting element ED may include the first semiconductor layer 31, the second semiconductor layer 32, the light emitting layer 36, an electrode layer 37, and the insulating film 38.

The first semiconductor layer 31 may be an n-type semiconductor. When the light emitting element ED emits light in a blue wavelength band, the first semiconductor layer 31 may include a semiconductor material having a chemical formula of $Al_xGa_yIn_{1-x-y}N$ ($0 \leq x \leq 1$, $0 \leq y \leq 1$, $0 \leq x+y \leq 1$). For example, the semiconductor material included in the first semiconductor layer 31 may be one or more of n-type doped AlGaInN, GaN, AlGaN, InGaN, AlN, and InN. The first semiconductor layer 31 may be doped with an n-type dopant, and the n-type dopant may be Si, Ge, Sn, or the like. For example, the first semiconductor layer 31 may be n-GaN doped with n-type Si. A length of the first semiconductor layer 31 may be in the range of 1.5 μm to 5 μm. The first end of the light emitting element ED may be a portion where the first semiconductor layer 31 is disposed based on the light emitting layer 36.

The second semiconductor layer 32 is disposed on the light emitting layer 36 to be described later. The second semiconductor layer 32 may be a p-type semiconductor. When the light emitting element ED emits light in a blue or green wavelength band, the second semiconductor layer 32 may include a semiconductor material having a chemical formula of $Al_xGa_yIn_{1-x-y}N$ ($0 \leq x \leq 1$, $0 \leq y \leq 1$, $0 \leq x+y \leq 1$). For example, the semiconductor material included in the second semiconductor layer 32 may be one or more of p-type doped AlGaInN, GaN, AlGaN, InGaN, AlN, and InN. The second semiconductor layer 32 may be doped with a p-type dopant, and the p-type dopant may be Mg, Zn, Ca, Se, Ba, or the like. For example, the second semiconductor layer 32 may be p-GaN doped with p-type Mg. A length of the second semiconductor layer 32 may be in the range of 0.05 μm to 0.10 µm. The second end of the light emitting element ED may be a portion where the second semiconductor layer 32 is disposed based on the light emitting layer 36.

Each of the first semiconductor layer 31 and the second semiconductor layer 32 may include more layers, for example, may further include a clad layer or a tensile strain barrier reducing (TSBR) layer depending on the material of the light emitting layer 36.

The light emitting layer 36 is disposed between the first semiconductor layer 31 and the second semiconductor layer 32. The light emitting layer 36 may include a material having a single or multiple quantum well structure. When the light emitting layer 36 includes a material having a multiple quantum well structure, it may have a structure in which a plurality of quantum layers and a plurality of well layers are alternately stacked. The light emitting layer 36 may emit light through combination of electron-hole pairs according to electrical signals received through the first semiconductor layer 31 and the second semiconductor layer 32. When the light emitting layer 36 emits light in the blue wavelength band, it may include a material such as AlGaN or AlGaInN. In particular, when the light entitling layer 36 has a multiple quantum well structure in which a quantum layer and a well layer are alternately stacked, the quantum layer may include a material such as AlGaN or AlGaInN, and the well layer may include a material such as GaN or InN. For example, the light emitting layer 36 may include AlGaInN as a quantum layer and AlInN as a well layer to emit blue light whose central wavelength band is in the range of 450 to 495 nm.

The light emitting layer 36 may have a structure in which a semiconductor material having a large band gap energy and a semiconductor material having a small band gap energy are alternately stacked or may include different group 3 to 5 semiconductor materials depending on the wavelength band of light that it emits. Light emitted from the light emitting layer 36 is not limited to light in the blue wavelength band. In some cases, the light emitting layer 36 may emit light in a red or green wavelength band. A length of the active layer 36 may be in the range of 0.05 µm to 0.10 µm.

Light emitted from the light emitting layer 36 may be radiated not only through an outer surface of the light emitting element ED in a longitudinal direction, but also through both side surfaces. The direction of light emitted from the light emitting layer 36 is not limited to one direction.

The electrode layer 37 may be an ohmic contact electrode. The electrode layer 37 may be a Schottky contact electrode. The light emitting element ED may include at least one electrode layer 37. The light emitting element ED may include more electrode layers 37, or the electrode layer 37 may be optional. The following description of the light emitting element ED may apply equally even when the light emitting element ED includes a different number of electrode layers 37 or further includes another structure.

When the light emitting element ED is electrically connected to the electrodes RME or the contact electrodes CNE1 and CNE2 in the display device 10 according to the embodiment, the electrode layer 37 may reduce the resistance between the light emitting element ED and the electrodes RME or the contact electrodes CNE1 and CNE2. The electrode layer 37 may include a conductive metal. For example, the electrode layer 37 may include at least one of aluminum (Al), titanium (Ti), indium (In), gold (Au), silver (Ag), indium-tin oxide (ITO), indium-zinc oxide (IZO), and indium-tin-zinc oxide (ITZO)). In addition, the electrode layer 37 may include an n-type or p-type doped semiconductor material.

The insulating film 38 surrounds outer surfaces of the semiconductor layers and the electrode layer described above. For example, the insulating film 38 may surround an outer surface of at least the light emitting layer 36 and extend in the direction in which the light emitting element ED extends. The insulating film 38 may protect the above members. The insulating film 38 may surround side surfaces of the above members but may expose both ends of the light emitting element ED in the longitudinal direction.

In the drawing, the insulating film 38 extends in the longitudinal direction of the light emitting element ED to cover from side surfaces of the first semiconductor layer 31 to side surfaces of the electrode layer 37. The insulating film 38 may cover outer surfaces of only some semiconductor layers as well as the light emitting layer 36 or may cover only a portion of an outer surface of the electrode layer 37 to partially expose the outer surface of each electrode layer 37. An upper surface of the insulating film 38 may be rounded in cross section in an area adjacent to at least one end of the light emitting element ED.

A thickness of the insulating film 38 may be in the range of 10 µm to 1.0 µm. The thickness of the insulating film 38 may preferably be about 40 nm.

The insulating film 38 may include an insulating material such as silicon oxide (SiOx), silicon nitride (SiNx), silicon oxynitride (SiOxNy), aluminum nitride (AlN), or aluminum oxide ($Al_2O_3$). Accordingly, it can prevent an electrical short circuit that may occur when the light emitting layer 36 directly contacts an electrode that transmits an electrical signal to the light emitting element ED. In addition, since the insulating film 38 protects the outer surface of the light emitting element ED including the light emitting layer 36, a reduction in luminous efficiency can be prevented.

An outer surface of the insulating film 38 may be treated. The light emitting element ED dispersed in a predetermined ink may be sprayed onto electrodes and then aligned. Here, the surface of the insulating film 38 may be hydrophobic or hydrophilic-treated so that the light emitting element ED is kept separate in the ink without being agglomerated with other adjacent light emitting elements ED. For example, the outer surface of the insulating film 38 may be treated with a material such as stearic acid or 2,3-naphthalene dicarboxylic acid.

A length h of the light emitting element ED may be in the range of 1 µm to 10 µm or the range of 2 µm to 6 µm and may preferably be in the range of 3 to 5 µm. A diameter of the light emitting element ED may be in the range of 30 to 700 nm, and an aspect ratio of the light emitting element ED may be 1.2 to 100. Light emitting elements ED included in the display device 10 may have different diameters according to a difference in composition of the light emitting layer 36. The diameter of the light emitting element ED may preferably be about 500 nm.

In the light emitting element ED, the first semiconductor layer 31 and the second semiconductor layer 32 may be semiconductor layers doped to have different conductivity types, and a dipole moment facing the longitudinal direction of the light emitting element ED may be formed between the first end and the second end of the light emitting element ED. When the light emitting element ED is placed in an electric field generated on the electrodes RME to which different alignment signals are transmitted, the light emitting element ED having the dipole moment may be disposed on the electrodes RME as its position and orientation direction are changed by a dielectrophoretic force applied to the light emitting element ED. The direction that the first end of the light emitting element ED faces may vary according to the direction of the dipole moment and the direction of the electric field. Since the subpixels PXn include different types of subpixels PXA and PXB, electric fields generated in different types of subpixels PXA and PXB during the manufacturing process of the display device 10 may face different directions, and the direction of the first end of the light emitting element ED may be different in each type of subpixel PXA or PXB.

Figure 6:
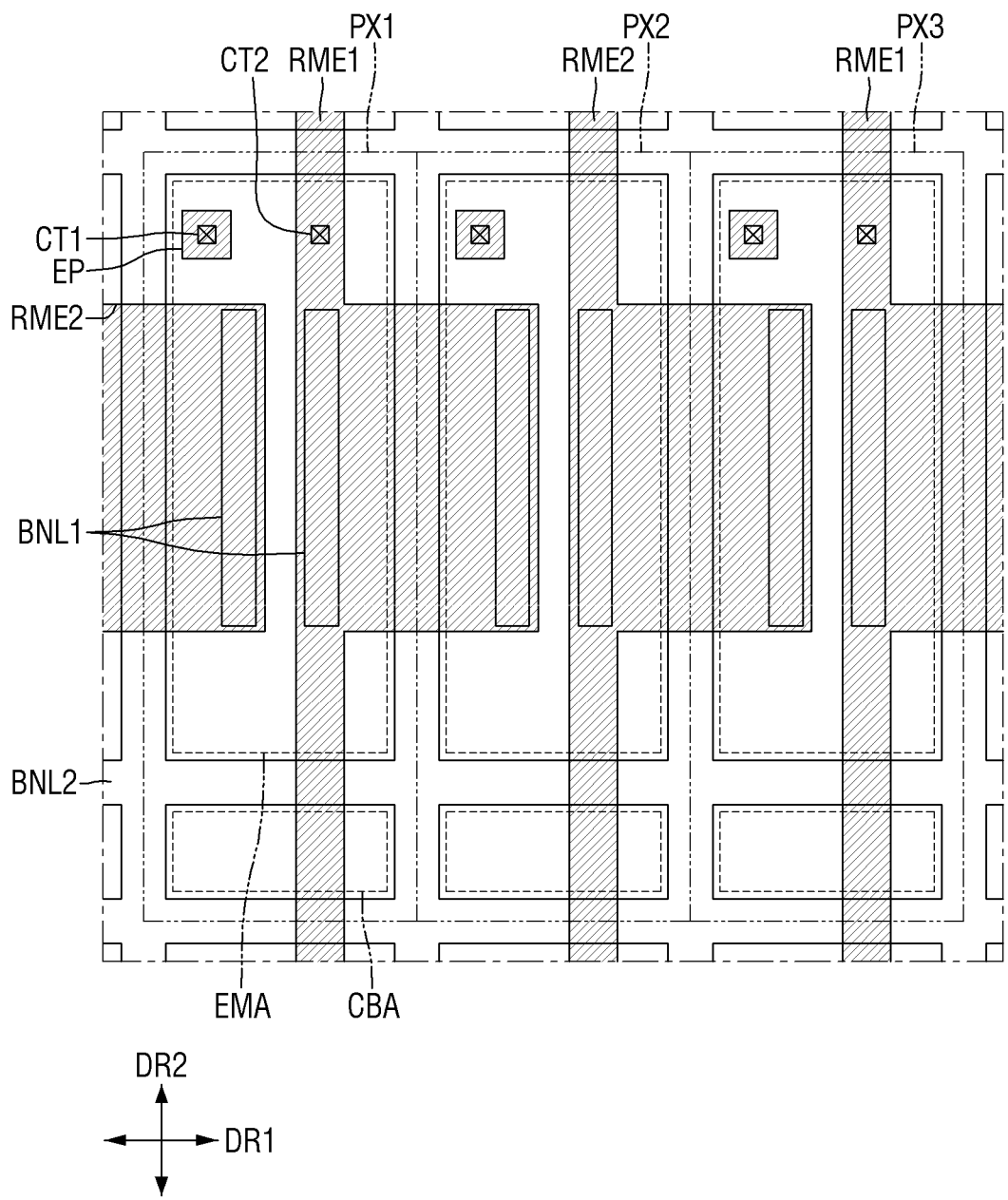
FIG. 6 and FIG. 7 are plan views illustrating some operations in a process of manufacturing a display device according to an embodiment.
Figure 7:
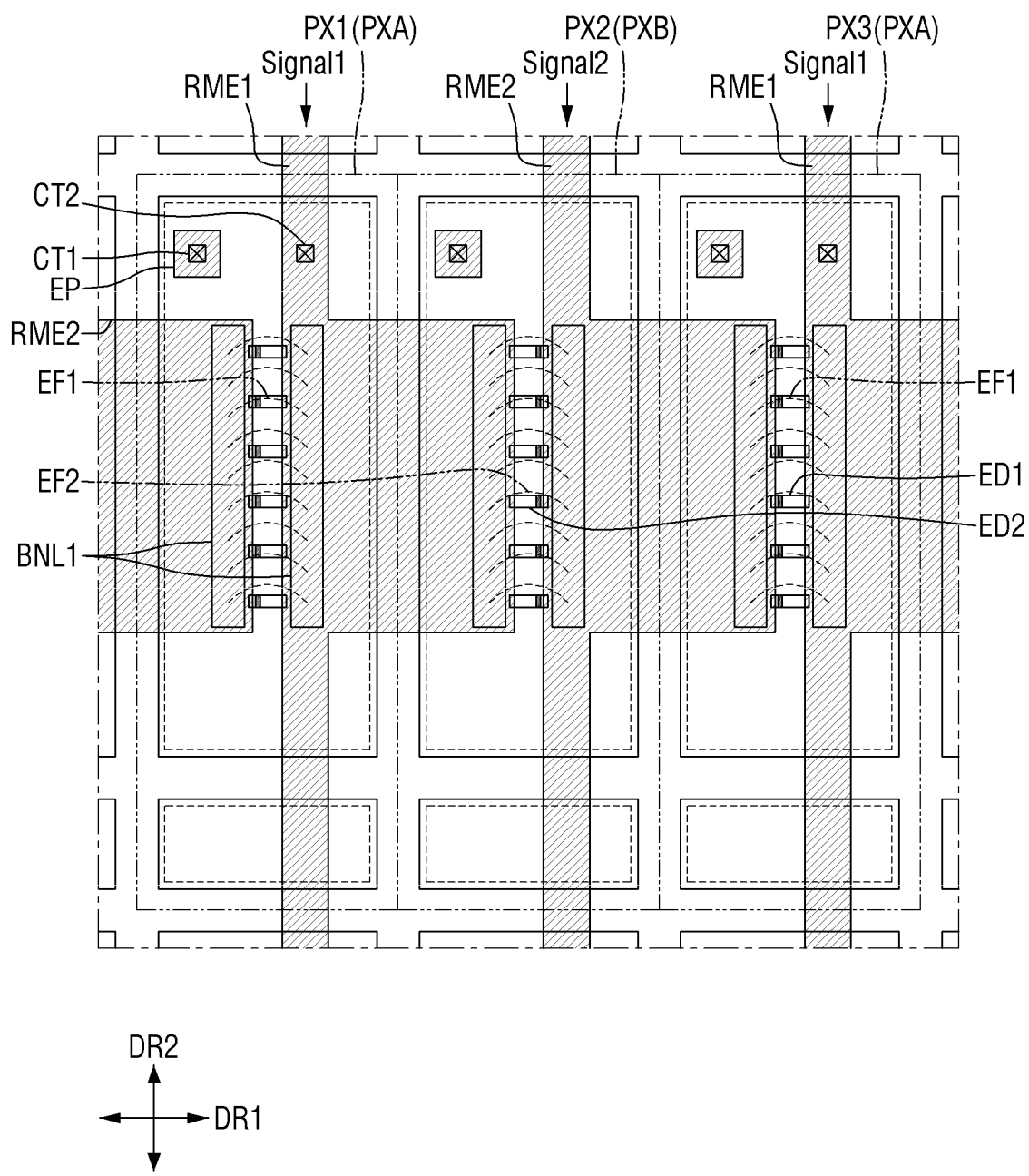

FIGS. 6 and 7 are plan views illustrating some operations in a process of manufacturing a display device 10 according to an embodiment.

First, referring to FIG. 6, the process of manufacturing the display device 10 may include forming first banks BNL1, a plurality of electrodes RME and an electrode contact portion EP in each subpixel PXn and forming a second bank BNL2 disposed at a boundary of each subpixel PXn. The shapes of the first banks BNL1 and the second bank BNL2 are the same as those described above.

The electrodes RME may each include an electrode stem portion RM_S and an electrode extension portion RM_E and thus may have substantially the same shape. The electrode stem portion RM_S extends in the second direction DR2 beyond an emission area EMA and a cut area CBA. The electrode stem portions RM_S of the electrodes RME disposed in subpixels PXn neighboring in the second direction DR2 may be connected to each other. The electrode extension portion RM_E may be connected to the electrode stem portion RM_S in the emission area EMA and may be disposed across the boundaries of different subpixels PXn neighboring in the first direction DR1. The electrode contact portion EP may be spaced apart from each of the electrode stem portion RM_S and the electrode extension portion RM_E disposed in the emission area EMA.

An odd-column subpixel PXn such as a first subpixel PX1 or a third subpixel PX3 may be a first type subpixel PXA in which the electrode stem portion RM_S of a first electrode RME1 is disposed. An even-column subpixel PXn such as a second subpixel PX2 may be a second type subpixel PXB in which the electrode stem portion RM_S of a second electrode RME2 is disposed. However, during the manufacturing process of the display device 10, the same electrodes RME may be disposed in each subpixel PXn, and the first electrode RME1 and the second electrode RME2 may be arbitrarily defined regardless of their shape and position.

Next, referring to FIG. 7, light emitting elements ED are placed in the emission area EMA of each subpixel PXn. In an embodiment, the light emitting elements ED may be dispersed in an ink and then sprayed onto the emission area EMA through an inkjet printing process. The second bank BNL2 may prevent the ink from overflowing to the emission areas EMA of other neighboring subpixels PXn.

When the ink is sprayed onto the emission area EMA, an electric field EF1 or EF2 is generated on the electrodes RME by transmitting alignment signals Signal1 and Signal2 to the electrodes RME, respectively. The light emitting elements ED dispersed in the ink may receive a dielectrophoretic force due to the electric field EF1 or EF2. Accordingly, both ends of each light emitting element ED may be disposed on different electrodes RME1 and RME2.

Different alignment signals Signal1 and Signal2 may be transmitted to the electrodes RME1 and RME2 disposed in each subpixel PXn, and the electric field EF1 or EF2 may be generated by a voltage difference between the alignment signals Signal1 and Signal2. To generate the electric field EF1 or EF2 between the first electrode RME1 and the second electrode RME2 spaced apart from each other, a first alignment signal Signal1 may be transmitted to the first electrode RME1, and a second alignment signal Signal2 may be transmitted to the second electrode RME2.

Each of the alignment signals Signal1 and Signal2 may be transmitted to the electrode extension portion RM_E of the electrode RME1 or RME2 through the electrode stem portion RM_S. The electric field EF1 or EF2 may be generated in each subpixel PXn by an alignment signal transmitted to the electrode stem portion RM_S and an alignment signal transmitted to the electrode extension portion RM_E. Different alignment signals Signal1 and Signal2 are transmitted to subpixels PXn neighboring in the first direction DR1 based on the electrode stem portion RM_S. For example, in odd-column subpixels PXn, the first alignment signal Signal1 is transmitted to the electrode stem portion RM_S of the first electrode RME1, and the second alignment signal Signal2 is transmitted to the electrode extension portion RM_E of the second electrode RME2. In even-column subpixels PXn, the second alignment signal Signal2 is transmitted to the electrode stem portion RM_S of the second electrode RME2, and the first alignment signal Signal1 is transmitted to the electrode extension portion RM_E of the first electrode RME1. Since the electrode extension portion RM_E is disposed on the left side of a center of the emission area EMA in each subpixel PXn and the electrode stem portion RM_S is disposed on the right side, the arrangement of the electrode stem portion RM_S and the electrode extension portion RM_E may be the same in the subpixels PXn, but the alignment signals Signal1 and Signal2 transmitted to the subpixels PXn may be opposite to each other. When the direction of the electric field EF1 or EF2 generated by the alignment signals Signal1 and Signal2 is defined as a direction from an electrode to which the first alignment signal Signal1 is transmitted toward an electrode to which the second alignment signal Signal2 is transmitted, the directions of the electric fields EF1 and EF2 generated in the subpixels PXn may be opposite to each other.

In the odd-column subpixels PXn, a first electric field EF facing the electrode extension portion RM_E to which the second alignment signal Signal2 is transmitted is generated. In the even-column subpixels PXn, a second electric field EF2 facing the electrode stem portion RM_S to which the second alignment signal Signal2 is transmitted is generated. Accordingly, the electric fields EF1 and EF2 in opposite directions may be generated in the odd-column subpixels PXn and the even-column subpixels PXn, and directions of first ends of the light emitting elements ED disposed in the odd-column subpixels PXn and the even-column pixels PXn may be opposite to each other.

According to an embodiment, in the display device 10, the first alignment signal Signal1 may be transmitted to the electrode stem portion RM_S of the first type subpixel PXA in which the electrode stem portion RM_S of the first electrode RME1 is disposed, and the second alignment signal Signal2 may be transmitted to the electrode stem portion RM_S of the second type subpixel PXB in which the electrode stem portion RM_S of the second electrode RME2 is disposed. Since the first electric field EF1 is generated in the first type subpixel PXA and the second electric field EF2 is generated in the second type subpixel PXB, first type light emitting elements ED1 whose first ends are oriented to face the first side of the first direction DR1 may be disposed in the first type subpixel PXA, and second type light emitting elements ED2 whose first ends are oriented to face the second side of the first direction DR1 may be disposed in the second type subpixel PXB. Since the display device 10 includes the electrodes RME1 and RME2 designed to minimize the number of electrodes RME1 and RME disposed per unit area, it may include subpixels PXn in which the first ends of the light emitting element ED face different directions.

Next, although not illustrated in the drawings, after the light emitting elements ED are disposed, a second insulating layer PAS2 is formed, and the electrode stem portion RM_S of the second electrode RME2 disposed in the second type subpixel PXB is split in the cut area CBA. Then, openings OP1 and OP2 and contact electrodes CNE1 and CNE2 are formed to complete the display device 10. The shape and arrangement of the openings OP1 and OP2 and the contact electrodes CNE1 and CNE2 are the same as those described above.

Figure 8:
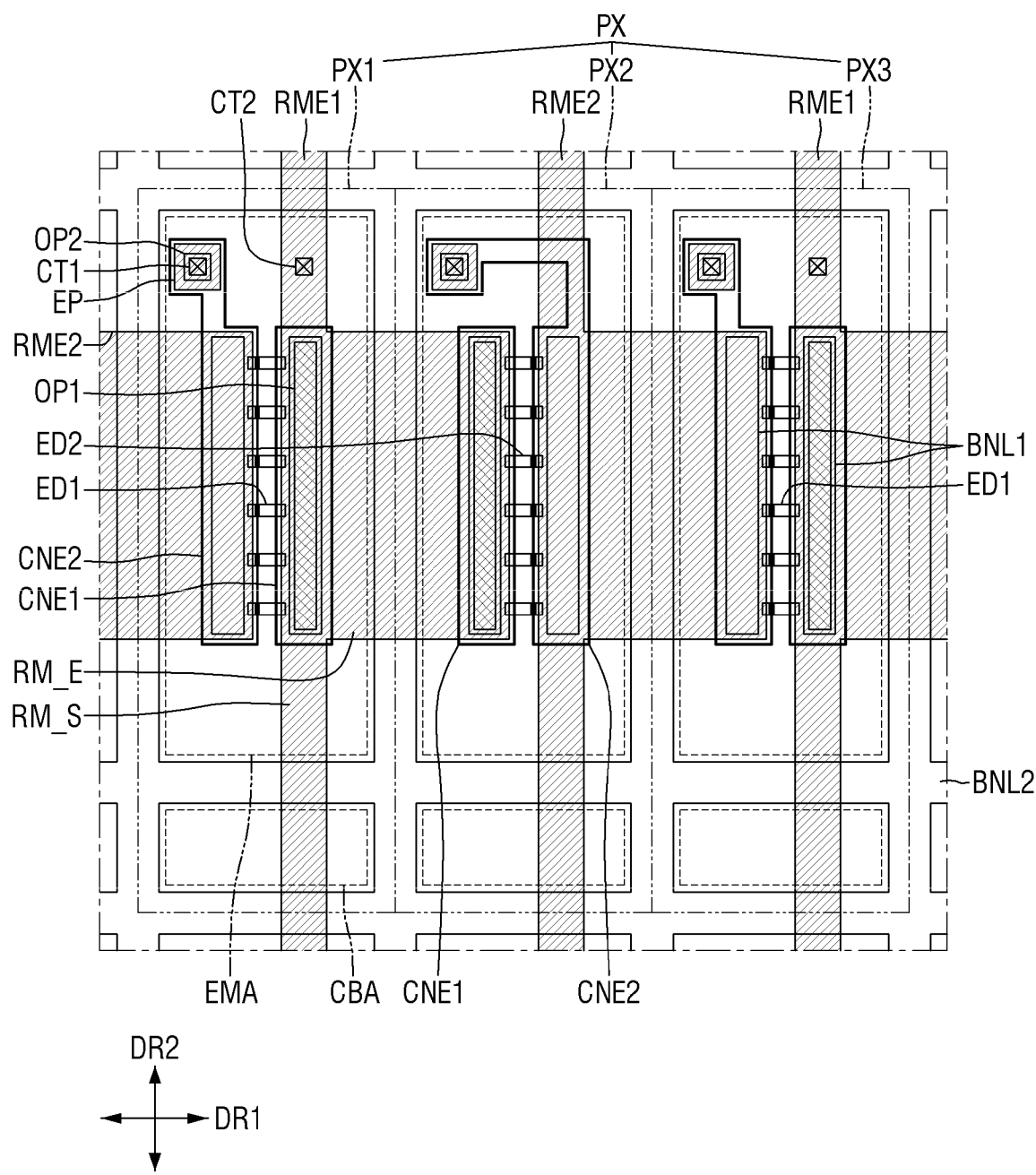
FIG. 8 is a plan view of a pixel of a display device according to an embodiment.

FIG. 8 is a plan view of a pixel of a display device 10 according to an embodiment.

Referring to FIG. 8, in the display device 10, an electrode stem portion RM_S of a second electrode RME2 disposed in a second type subpixel PXB may also be connected without being split in a cut area CBA. During a manufacturing process of the display device 10, alignment signals Signal1 and Signal2 transmitted to a first electrode RME1 and the second electrode RME2 may respectively be directly transmitted to the electrodes RME1 and RME2 through a separate alignment device. Accordingly, the second electrode RME2 may not be connected to an underlying circuit layer, and the second electrode RME2 disposed in each subpixel PXn may be in a floating state even if the electrode stem portions RM_S are not separated by a cut portion CB. Since a second contact electrode CNE2 does not directly contact the second electrode RME2, the second electrodes RME2 disposed in subpixels PXn neighboring in the second direction DR2 may be connected to each other. In the display device 10, since a process of splitting the second electrode RME2 is omitted, the number of manufacturing processes can be reduced. Other details are the same as those of the embodiment of FIG. 2 described above.

Figure 9:
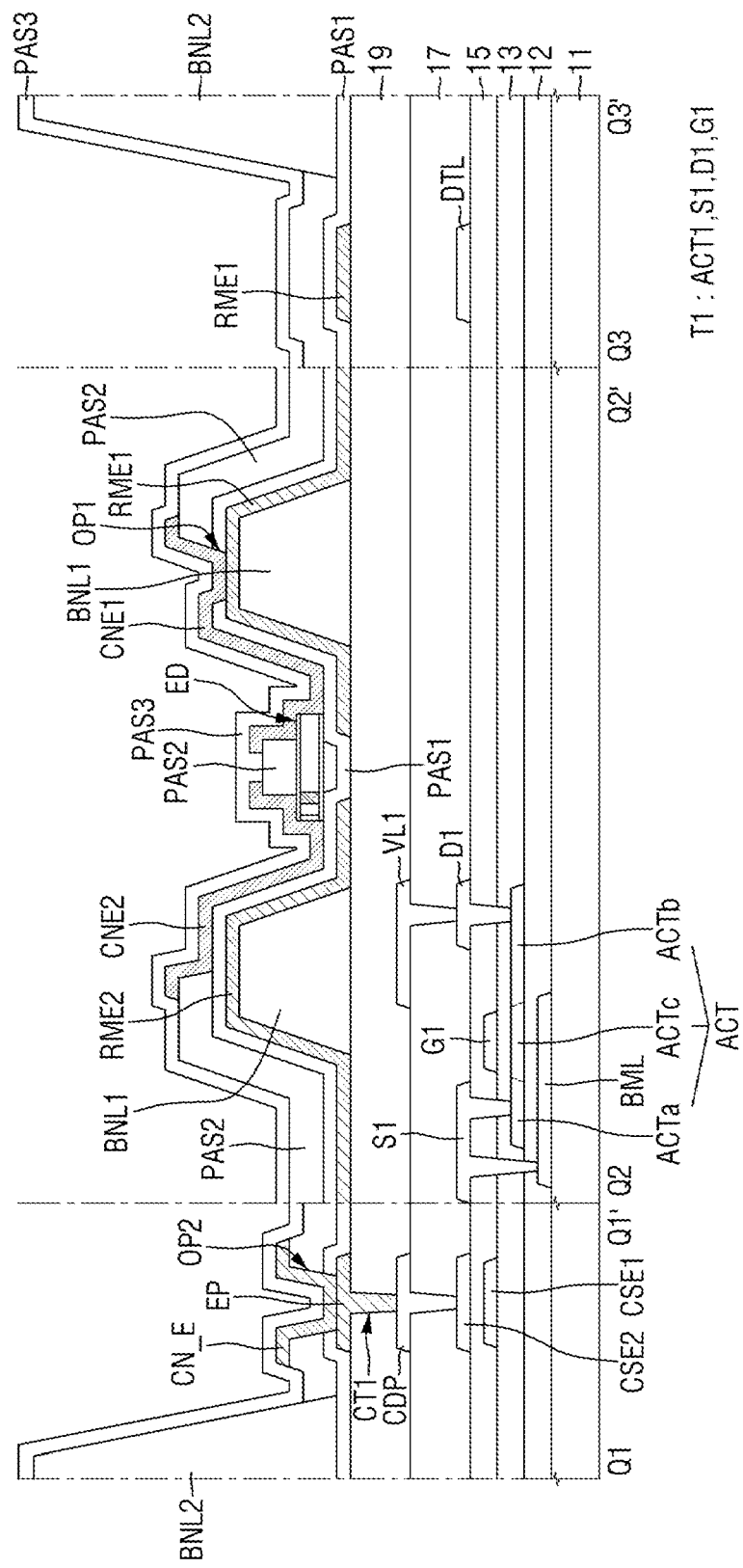
FIG. 9 is a cross-sectional view of a display device according to an embodiment.

FIG. 9 is a partial cross-sectional view of a display device 10 according to an embodiment.

Referring to FIG. 9, in the display device 10, a second voltage wire VL2 may be omitted, and a second contact hole CT2 may not be formed in a first planarization layer 19. Electrode stem portions RM_S of first electrodes RME1 may be connected to each other and thus directly connected to a voltage pad (not illustrated) disposed in a non-display area NDA. A second power supply voltage may be directly applied to the first electrodes RME1, and the second voltage wire VL2 may be omitted. Even when the second power supply voltage is simultaneously applied to a plurality of subpixels PXn because the second power supply voltage is applied to the first electrodes RME1, light emitting elements ED may emit light in response to a first power supply voltage received from a first transistor T1 through a second contact electrode CNE2. Since the second contact electrode CNE2 receives the first power supply voltage through an electrode contact portion EP disposed in each subpixel PXn, even if the second power supply voltage is simultaneously applied to the first electrodes RME1 of the subpixels PXn, the subpixels PXn may be driven separately. In the display device 10, since the second voltage wire VL2 is omitted, the number of processes of manufacturing a circuit layer can be reduced, and a second data conductive layer can be omitted if a first voltage wire VL1 is disposed on another layer. The current embodiment is different from the embodiment of FIG. 4 in that the second voltage wire VL2 is omitted. Other details are the same as those described above.

If the number of electrodes RME1 and RME2 to which alignment signals Signal1 and Signal2 are transmitted during the manufacturing process of the display device 10 can be reduced, the structure of each electrode RME1 or RME2 may be designed in various ways. For example, as long as each electrode RME1 or RME2 includes the electrode stem portion RM_S and a portion connected to the electrode stem portion RM_S and disposed over subpixels PXn neighboring in the first direction DR1, it can have a different shape from an electrode extension portion RM_E. In addition, if the electrodes RME1 and RME2 are separated so that the first power supply voltage applied to the light emitting elements ED can be applied to each subpixel PXn separately, the first power supply voltage and the second power supply voltage may be transmitted through each electrode RME1 or RME2, and the electrode contact portion EP may be optional or may be connected to one of the electrodes RME1 and RME2.

Figure 10:
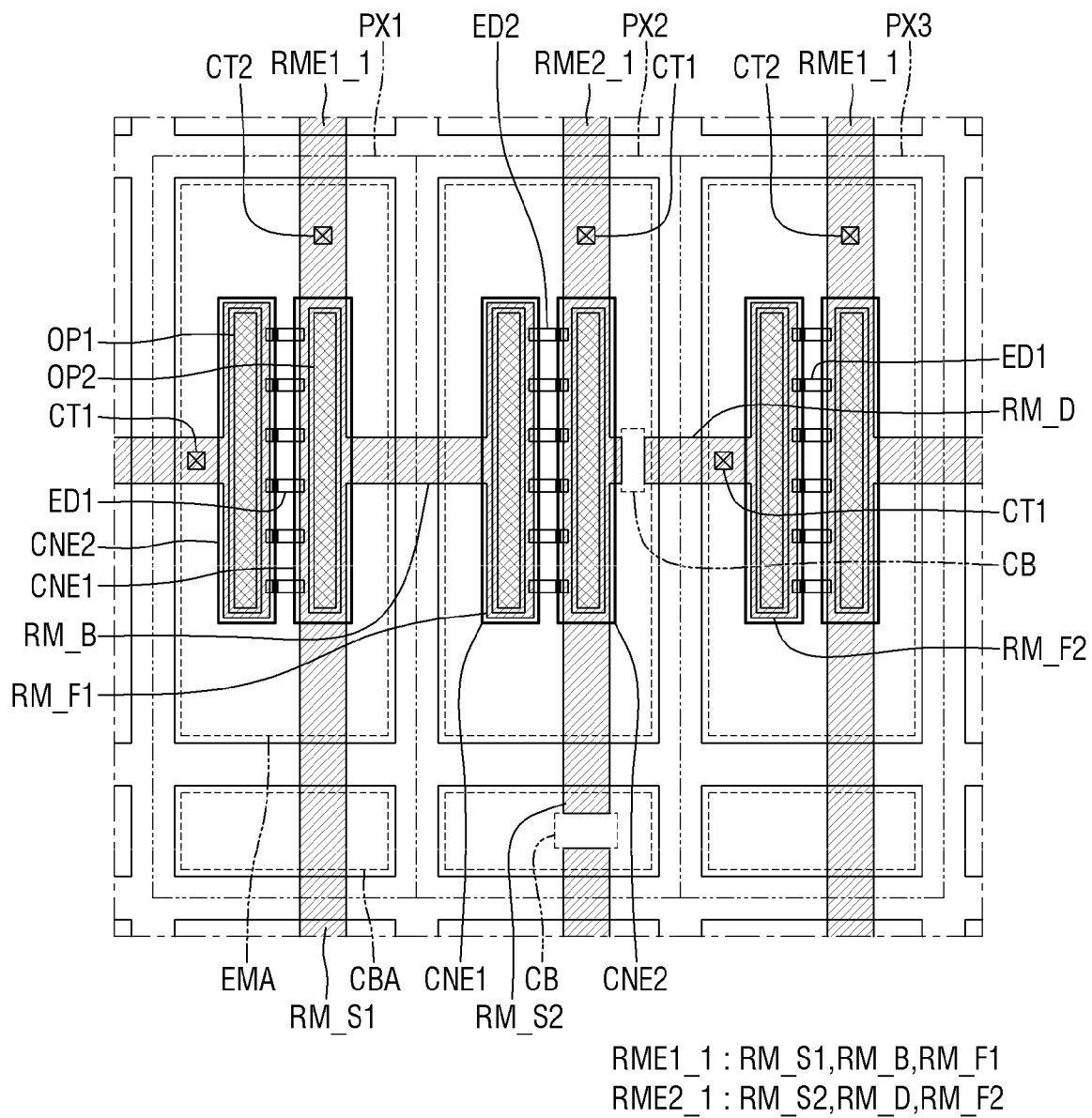
FIG. 10 is a plan view of a pixel of a display device according to an embodiment.
Figure 11:
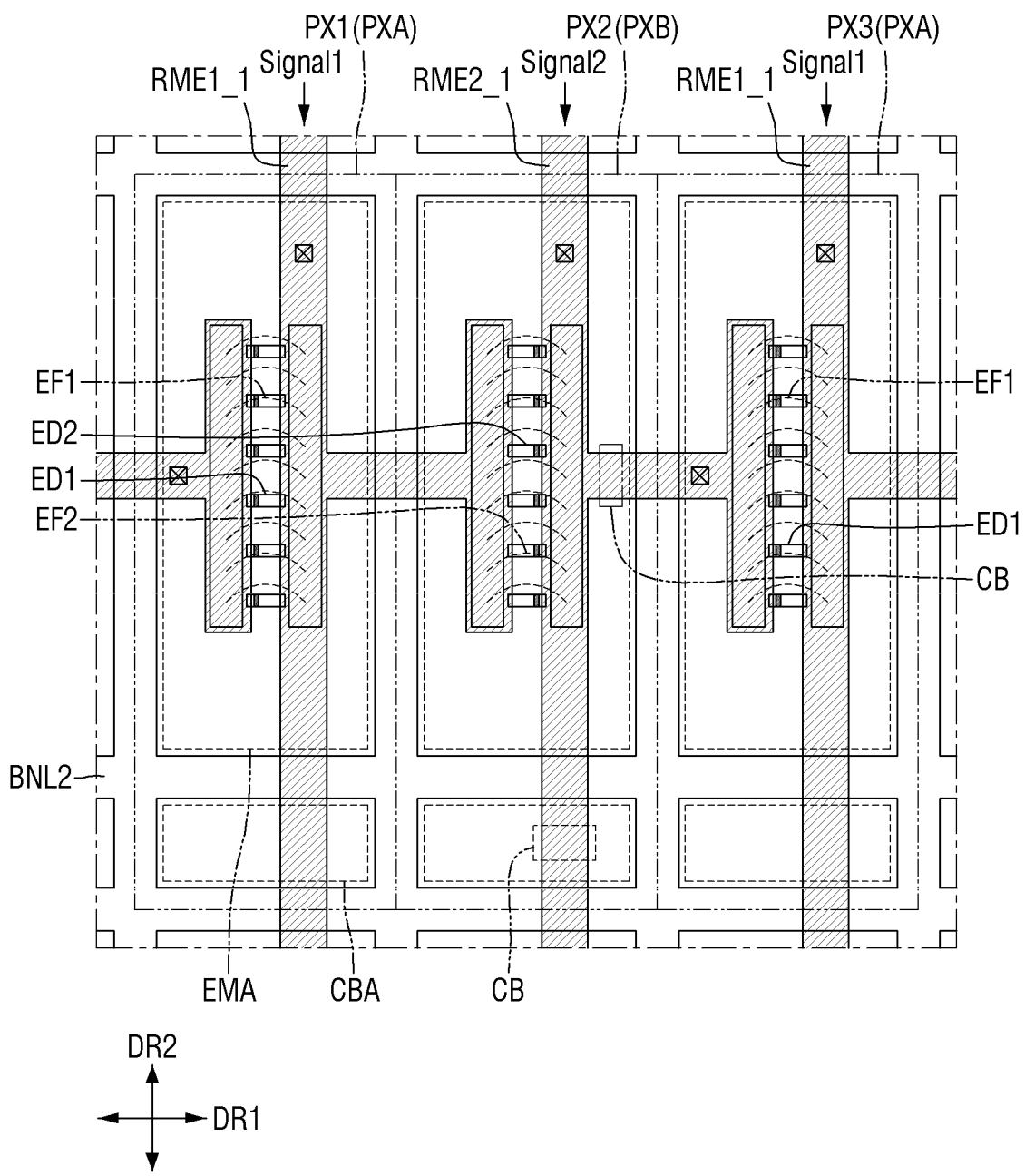
FIG. 11 is a plan view illustrating an operation in a process of manufacturing the display device of FIG. 10 according to an embodiment.

FIG. 10 is a plan view of a pixel of a display device 10 according to an embodiment. FIG. 11 is a plan view illustrating one operation in a process of manufacturing the display device 10 of FIG. 10. FIG. 11 is a plan view illustrating an operation of aligning light emitting elements ED during the manufacturing process of the display device 10 of FIG. 10 and illustrates a state in which each electrode RME1_1 or RME2_1 is not split in a cut portion CB.

Referring to FIGS. 10 and 11, a first electrode RME1_1 and a second electrode RME2_1 may be disposed over subpixels PXn neighboring in the first direction DR1 even if they do not necessarily include an electrode extension portion RM_E having a wide width. For example, the first electrode RME1_1 includes a first electrode stem portion RM_S1, a first electrode facing portion RM_F1, and an electrode connection portion RM_B connecting the first electrode stem portion RM_S1 and the first electrode facing portion RM_F1. The second electrode RME2_1 includes a second electrode stem portion RM_S2, a second electrode facing portion RM_F2, and an electrode separation portion RM_D connected to the second electrode facing portion RM_F2 but separated from the second electrode stem portion RM_S2. In the display device 10, each electrode RME1_1 or RME2_1 is disposed over subpixels PXn neighboring in the first direction DR1, but some of them may be split after the alignment of the light emitting elements ED. Accordingly, different types of subpixels PXA and PXB in which different electrode stem portions RM_S1 and RM_S2 are disposed may be different in the structures of the electrodes RME1_1 and RME2_1 disposed in an emission area EMA. The embodiment of FIGS. 10 and 11 is different from the embodiment of FIGS. 2 and 7 in the shapes of the first electrode RME1_1 and the second electrode RME2_1. Hereinafter, any redundant description will be omitted, and differences will be mainly described.

The first electrode RME1_1 includes the first electrode stem portion RM_S1 extending in the second direction DR2, the first electrode facing portion RM_F1 disposed in the emission area EMA of another subpixel PXn and spaced apart from the second electrode RME2_1 to face the second electrode RME2_1, and the electrode connection portion RM_B connecting the first electrode stem portion RM_S1 and the first electrode facing portion RM_F1. The first electrode stem portion RM_S1 is disposed in a first type subpixel PXA and extends in the second direction DR2. The first electrode stem portion RM_S1 extends beyond boundaries with subpixels PXn neighboring in the second direction DR2, and one first electrode stem portion RM_S1 may be disposed in first type subpixels PXA disposed in the same odd-numbered column. The first electrode stem portion RM_S1 may be electrically connected to a second voltage wire VL2 thereunder through a second contact hole CNT2. That is, the first electrode stem portion RM_S1 may have substantially the same shape as the electrode stem portion RM_S included in the first electrode RME1 of FIG. 2.

The first electrode facing portion RM_F1 may be disposed in the emission area EMA of a second type subpixel PXB neighboring in the first direction DR1 and may extend in the second direction DR2. The first electrode facing portion RM_F1 may be spaced apart from the second electrode stem portion RM_S2 of the second electrode RME2_1, and first ends of second type light emitting elements ED2 disposed in the second type subpixel PXB may be disposed on the first electrode facing portion RM_F1.

The electrode connection portion RM_B may extend in the first direction DR1 to connect the first electrode stem portion RM_S1 and the first electrode facing portion RM_F1 and may be disposed across a boundary between the first type subpixel PXA and the second type subpixel PXB. The first electrode facing portion RM_F1 and the electrode connection portion RM_B may have the same width as the first electrode stem portion RM_S1, unlike the electrode extension portion RM_E. In the first electrode RME1_1, the first electrode stem portion RM_S1, the first electrode facing portion RM_F1, and the electrode connection portion RM_B may be integrated into one electrode and may transmit a second power supply voltage received through the second voltage wire VL2. For example, the first electrode RME1_1 may be electrically connected to the second voltage wire VL2 through the second contact hole CT2 formed to overlap the first electrode stem portion RM_S1 of the first type subpixel PXA. As in the embodiment of FIG. 9, the second power supply voltage may be directly applied to the first electrode RME1_1, in which case the second contact hole CT2 may be optional.

The second electrode RME2_1 includes the second electrode stem portion RM_S2 extending in the second direction DR2, the second electrode facing portion RM_F2 disposed in the emission area EMA of another subpixel PXn and spaced apart from the first electrode RME1_1 to face the first electrode RME_1, and the electrode separation portion RM_D connected to the second electrode facing portion RM_F2 but separated from the second electrode stem portion RM_S2. The second electrode stem portion RM_S2 may be disposed in the second type subpixel PXB to extend in the second direction DR2 but may be separated from the second electrode stem portion RM_S2 of a subpixel PXn neighboring in the second direction DR2 in the cut portion CB of a cut area CBA. One second electrode stem portion RM_S2 may be disposed in second type subpixels PXB disposed in the same even-numbered column.

The second electrode facing portion RM_F2 may be disposed in the emission area EMA of the first type subpixel PXA neighboring in the first direction DR1 and may extend in the second direction DR2. The second electrode facing portion RM_F2 may be spaced apart from the first electrode stem portion RM_S1 of the first electrode RME1_1, and second ends of first type light emitting elements ED1 disposed in the first type subpixel PXA may be disposed on the second electrode facing portion RM_F2.

The electrode separation portion RM_D may be connected to the second electrode facing portion RM_F2 to extend in the first direction DR1 and may be disposed across the boundary between the first type subpixel PXA and the second type subpixel PXB. The electrode separation portion RM_D may be connected to the second electrode stem portion RM_S2 during the manufacturing process of the display device 10 and then split in the cut portion CB after the alignment process of the light emitting elements ED. The electrode separation portion RM_D and the second electrode facing portion RM_F2 may receive the same alignment signal during the manufacturing process of the display device 10 but may receive different signals while the display device 10 is being driven because they are disposed in different types of subpixels PXA and PXB. The second electrode facing portion RM_F2 and the electrode separation portion RM_D may also have the same width as the second electrode stem portion RM_S2, unlike the electrode extension portion RM_E. The second electrode RME2_1 may include the first electrode stem portion RM_S1, the second electrode facing portion RM_F2 and the electrode separation portion RM_D separated from the first electrode stem portion RM_S1 and may transmit a first power supply voltage received through a first transistor T1.

The second electrode RME2_1 may receive the first power supply voltage through the first transistor T1. According to an embodiment, each of the second electrode stem portion RM_S2 and the electrode separation portion RM_D of the second electrode RME2_1 may contact a first conductive pattern CDP thereunder through a first contact hole CT1. The first contact hole CT1 may be formed to overlap the electrode separation portion RM_D in the first type subpixel PXA and may be formed to overlap the second electrode stem portion RM_S2 in the second type subpixel PXB. In different types of subpixels PXA and PXB, the position of the first conductive pattern CDP of a circuit layer disposed under the first electrode RME1_1 and the second electrode RME1_1 may be designed according to the shapes of the first electrode RME1_1 and the second electrode RME1_1 to transmit the first power supply voltage to the second electrode RME1_1. The first contact hole CT1 may also be formed at positions different from those of FIG. 10. In some embodiments, an electrode contact portion EP may be disposed in each subpixel PXn, and the first power supply voltage may be applied through the electrode contact portion EP.

First banks BNL1 may be disposed under the first electrode stem portion RM_S1 or RM_S2 or the electrode facing portion RM_F1 or RM_F2 in the emission area EMA of each subpixel PXn. The first banks BNL1 may be spaced apart from each other, and the electrode stem portion RM_S1 or RM_S2 and the electrode facing portion RM_F1 or RM_F2 disposed on the first banks BNL1 may also be spaced apart from each other. Thus, the light emitting elements ED may be disposed on the electrode stem portion RM_S1 or RM_S2 and the electrode facing portion RM_F1 or RM_F2.

The light emitting elements ED include the first type light emitting elements ED1 disposed in the first type subpixel PXA and the second type light emitting elements ED2 disposed in the second type subpixel PXB. The first type light emitting elements ED1 have first ends disposed on the first electrode stem portion RM_S1 and the second ends disposed on the second electrode facing portion RM_F2. The second type light emitting element ED2 have the first ends disposed on the first electrode facing portion RM_F1 and second ends disposed on the second electrode stem portion RM_S2. The first type light emitting elements ED1 and the second type light emitting elements ED2 are disposed such that their first ends face in opposite directions.

A first contact electrode CNE1 is disposed on the first electrode stem portion RM_S1 or the first electrode facing portion RM_F1 of the first electrode RME1_1. The first contact electrode CNE1 disposed in the first type subpixel PXA is disposed on the first electrode stem portion RM_S1 to contact the first ends of the first type light emitting elements ED1. In addition, the first contact electrode CNE1 of the first type subpixel PXA may contact the first electrode stem portion RM_S1 through a second opening OP2 and transmit the second power supply voltage transmitted to the first electrode RME1_1 to the first ends of the first type light emitting elements ED1. The first contact electrode CNE1 disposed in the second type subpixel PXB is disposed on the first electrode facing portion RM_F1 to contact the first ends of the second type light emitting elements ED2. The first contact electrode CNE1 of the second type subpixel PXB may contact the first electrode facing portion RM_F1 through the first opening OP1 and transmit the second power supply voltage supplied to the first electrode RME1_1 to the first ends of the second type light emitting elements ED2.

A second contact electrode CNE2 is disposed on the second electrode stem portion RM_S2 or the second electrode facing portion RM_F2 of the second electrode RME2_1. The second contact electrode CNE2 disposed in the first type subpixel PXA is disposed on the second electrode facing portion RM_F2 to contact the second ends of the first type light emitting elements ED1. In addition, the second contact electrode CNE2 of the first type subpixel PXA may contact the second electrode facing portion RM_F2 through the first opening OP1 and transmit the first power supply voltage transmitted to the second electrode facing portion RM_F2 to the second ends of the first type light emitting elements ED1. The second contact electrode CNE2 disposed in the second type subpixel PXB is disposed on the second electrode stem portion RM_S2 to contact the second ends of the second type light emitting elements ED2. The second contact electrode CNE2 of the second type subpixel PXB may contact the second electrode stem portion RM_S2 through the second opening OP2 and transmit the first power supply voltage transmitted to the second electrode RME2_1 to the second ends of the second type light emitting elements ED2.

Unlike in the embodiment of FIGS. 2 and 3, the second contact electrode CNE2 according to the current embodiment may extend in one direction and directly contact the second electrode RME2_1, not the electrode contact portion EP. The first electrode RME1_1 and the second electrode RME2_1 designed to be disposed over neighboring subpixels PXn may directly contact the contact electrodes CNE1 and CNE2 to transmit the first power supply voltage and the second power supply voltage to the contact electrodes CNE1 and CNE2, respectively. Even if the electrode contact portion EP is omitted, the second contact electrode CNE2 may receive the first power supply voltage through the second electrode stem portion RM_S2 or the second electrode facing portion RM_F2. However, the second electrode RME2_1 may not be in a floating state but may receive the first power supply voltage through the first transistor T1, and a signal may be individually driven for each subpixel PXn. To this end, the second electrode facing portion RM_F2 of the first type subpixel PXA and the second electrode stem portion RM_S2 of the second type subpixel PXB need to be separate from each other. In the display device 10, the first electrode RME1_1 and the second electrode RME2_1 may be formed in substantially the same structure, and then a process of partially splitting the second electrode RME2_1 may be performed after the alignment of the light emitting elements ED.

Referring to FIG. 11, the first electrode RME1_1 and the second electrode RME2_1 include the electrode stem portions RM_S1 and RM_S2 and the electrode facing portions RM_F1 and RM_F2, respectively. The first electrode RME1_1 includes the electrode connection portion RM_B, and the second electrode RME2_1 includes the electrode separation portion RM_D. The electrode separation portion RM_D is in a state of being connected to the second electrode stem portion RM_S2 in the operation of aligning the light emitting elements ED.

A first alignment signal Signal1 is transmitted to the first electrode RME1_1 whose first electrode stem portion RM_S1 is disposed in the first type subpixel PXA, and a second alignment signal Signal2 is transmitted to the second electrode RME2_1 whose second electrode stem portion RM_S2 is disposed in the second type subpixel PXB. When the direction of an electric field EF1 or EF2 is defined as a direction from an electrode to which the first alignment signal Signal1 is transmitted toward an electrode to which the second alignment signal Signal2 is transmitted, a first electric field EF1 is generated in the first type subpixel PXA, and a second electric field EF2 is generated in the second type subpixel PXB. Accordingly, the light emitting elements ED are aligned such that the first ends are disposed on the first electrode RME1_1, and the first ends of the first type light emitting elements ED1 and the second type light emitting elements ED face in opposite directions.

The second power supply voltage applied to the first electrode RME1_1 may be transmitted from the first electrode stem portion RM_S1 and the first electrode facing portion RM_F1 to the first end of each light emitting element ED1 or ED2 through the first contact electrode CNE1. The second power supply voltage may be applied to the first end of each light emitting element ED1 or ED2 in each subpixel PXn. Since each subpixel PXn may emit light in response to the first power supply voltage applied to the second electrode RME2_1, the second electrode RME2_1 needs to be split so that neighboring subpixels PXn can emit light individually. According to an embodiment, in the second electrode RME2_1, the second electrode stem portion RM_S2 and the electrode separation portion RM_D may be separated from each other in a cut portion CB, and the second electrode stem portion RM_S2 may be split in the cut portion CB of the cut area CBA. The second electrode stem portion RM_S2 and the electrode separation portion RM_D of the second electrode RME2_1 may be separated from each other, and the first power supply voltage may be individually transmitted to each of the second electrode stem portion RM_S2 and the second electrode facing portion RM_F2 disposed in the emission areas EMA of the subpixels PXn.

In the display device 10, each electrode RME1_1 or RME2_1 may be partially disposed over different types of subpixels PXA and PXB even through it does not include the electrode extension portion RM_E, unlike in the embodiment of FIGS. 2 and 7. The display device 10 can prevent a short circuit between the electrodes RME1_1 and RME2_1 because the number of electrodes RME1_1 and RME2_1 to which the alignment signals Signal1 and Signal2 are transmitted for the alignment of the light emitting elements ED is reduced and can have various electrode structures.

In each of the electrodes RME1 and RME2 of the display device 10, a portion disposed in each emission area EMA can be designed in various modified structures as long as one electrode stem portion RM_S is disposed in each subpixel PXn. In each of the electrodes RME1 and RME2 of the display device 10 according to the embodiment, the structure and number of electrode extension portions RM_E or electrode facing portions RM_F1 or RM_F2 disposed in each emission area EMA can be changed, and a plurality of light emitting elements connected in series to each other can be included in one subpixel PXn.

Figure 12:
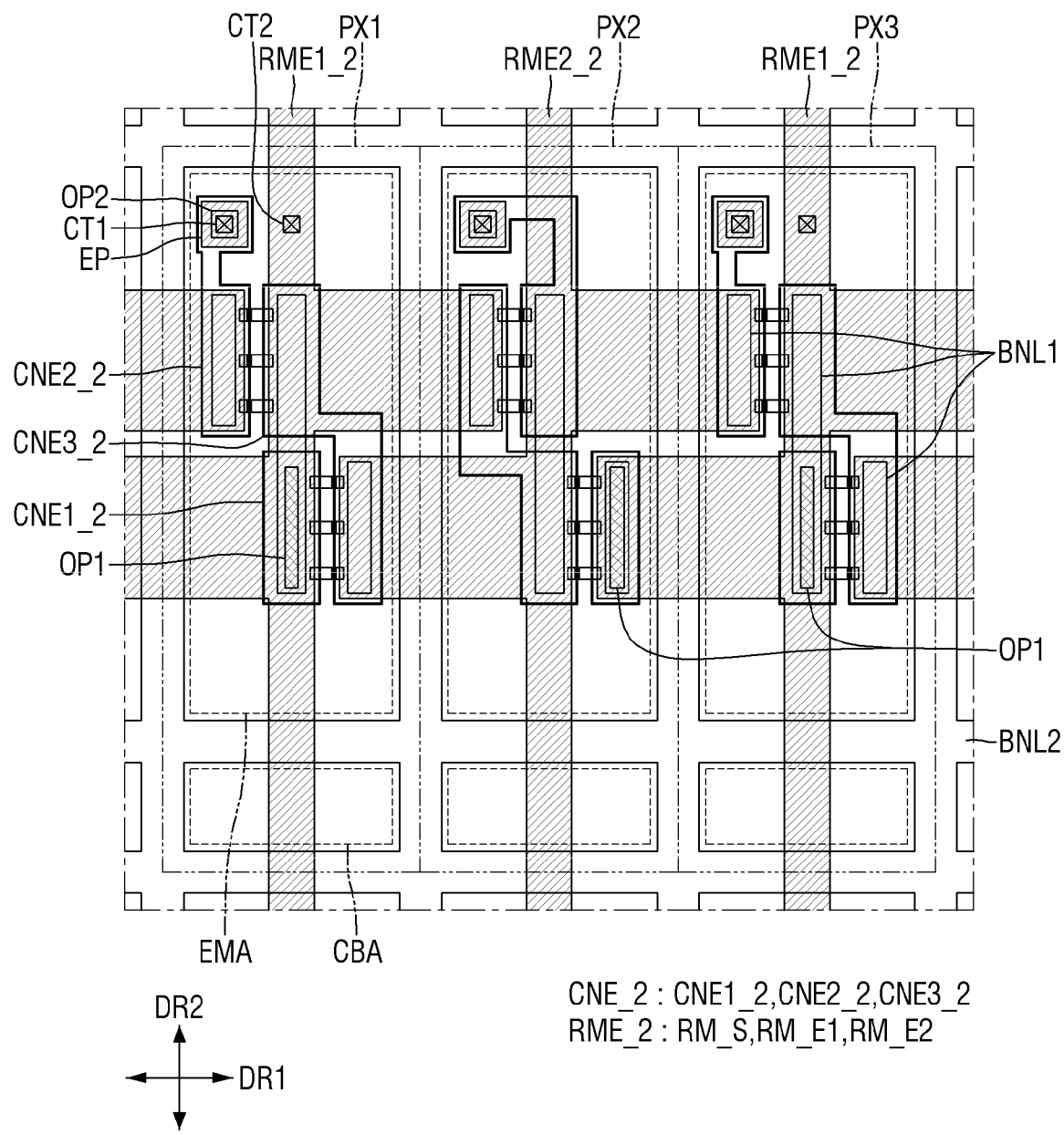
FIG. 12 is a plan view of a pixel of a display device according to an embodiment.
Figure 13:
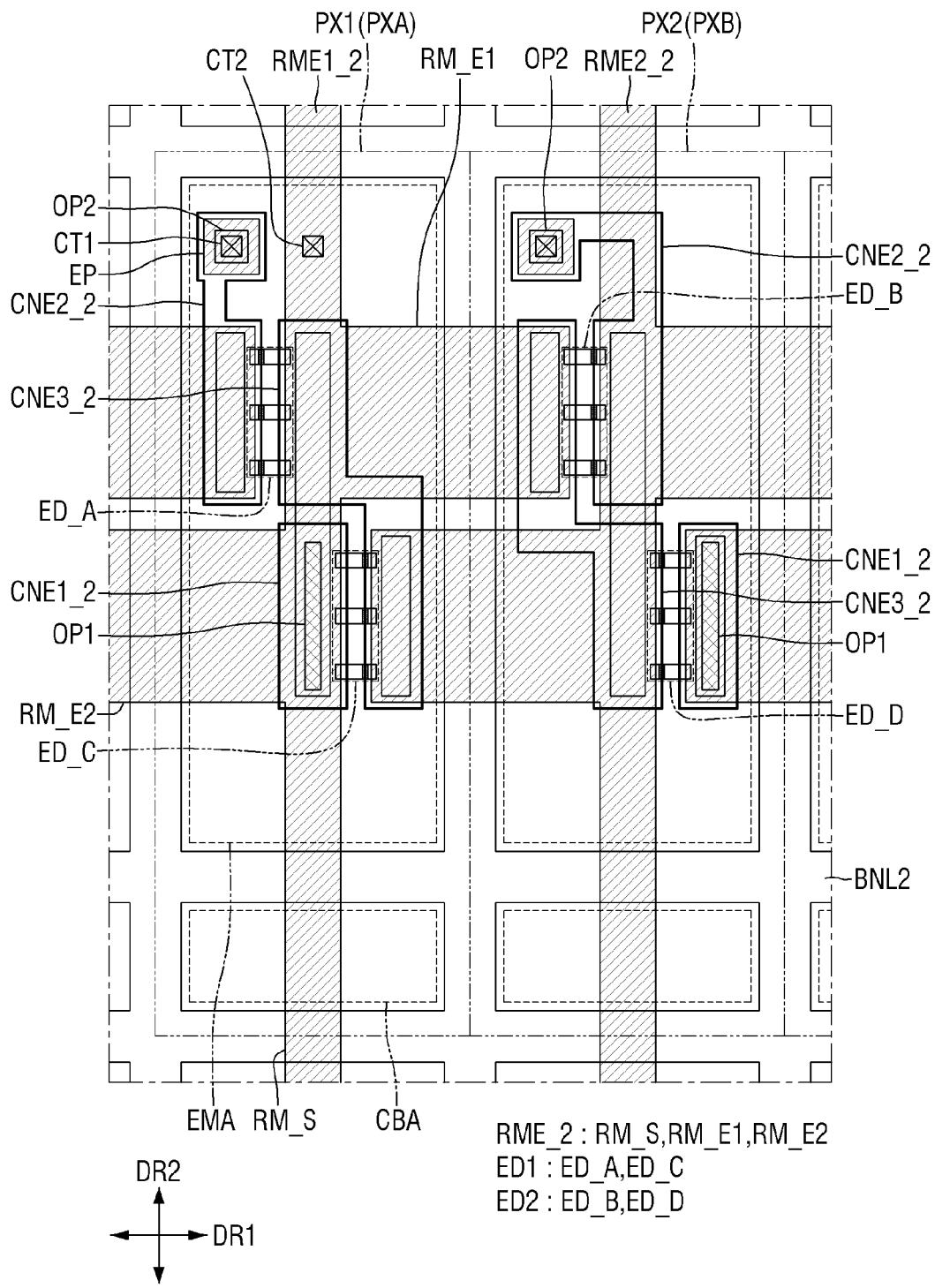
FIG. 13 is a plan view of a first type subpixel and a second type subpixel of the display device of FIG. 12 according to an embodiment.
Figure 14:
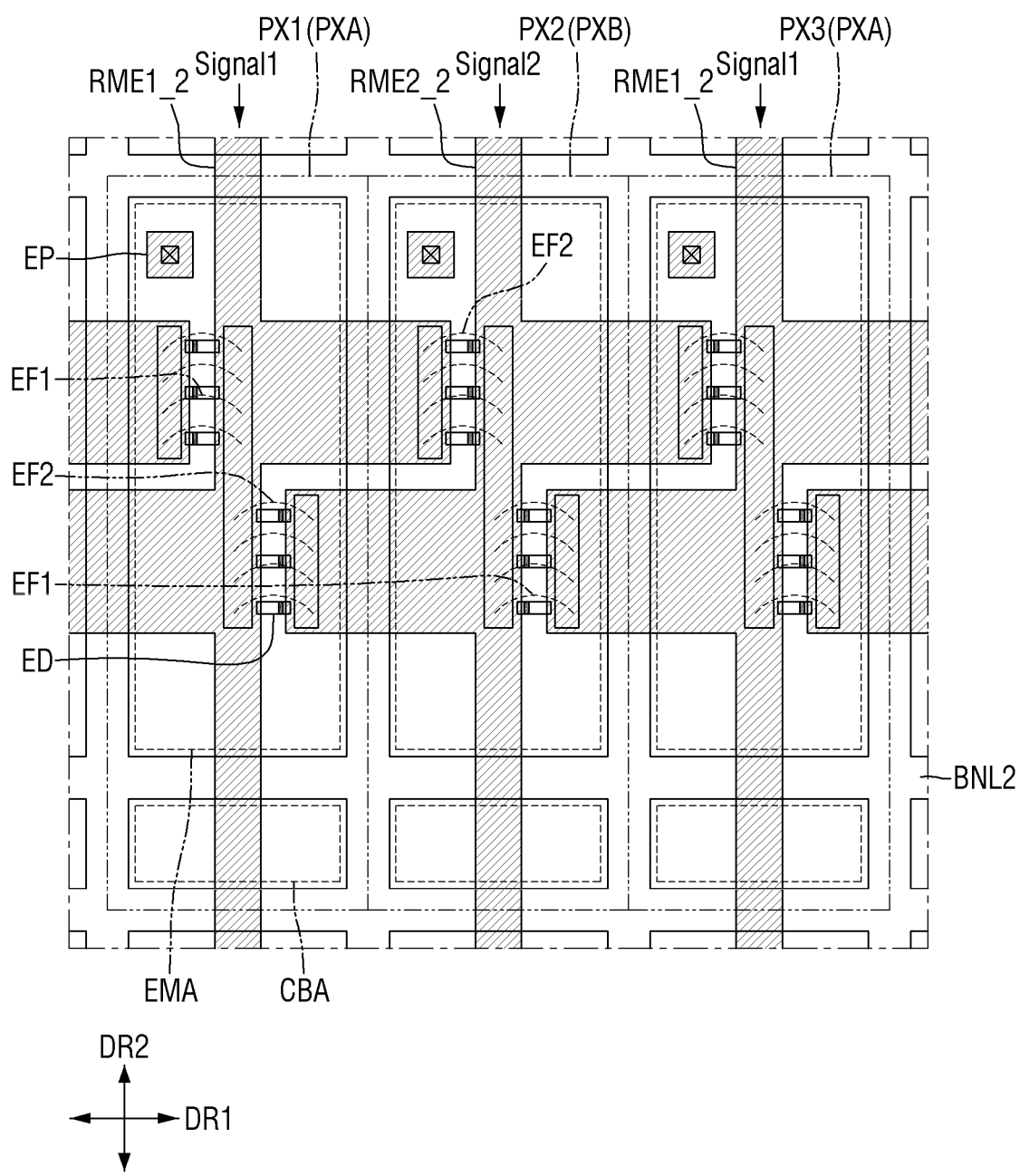
FIG. 14 is a plan view illustrating an operation in a process of manufacturing the display device of FIG. 12 according to an embodiment.

FIG. 12 is a plan view of a pixel of a display device 10 according to an embodiment. FIG. 13 is a plan view of a first type subpixel PXA and a second type subpixel PXB of FIG. 12. FIG. 14 is a plan view illustrating one operation in a process of manufacturing the display device 10 of FIG. 12. FIG. 14 illustrates an operation of aligning light emitting elements ED during the manufacturing process of the display device 10.

Referring to FIGS. 12 through 14, each electrode RME_2 (RME1_2 or RME2_2) of the display device 10 may further include an electrode stem portion RM_S and a plurality of electrode extension portions RM_E1 and RM_E2 connected to the electrode stem portion RM_S. Since one electrode RME_2 includes more electrode extension portions RM_E1 and RM_E2, more space in which the light emitting elements ED may be disposed can be secured in each subpixel PXn. Each subpixel PXn may include the light emitting elements ED whose ends are disposed on different electrode extension portions RM_E1 and RM_E2, and structures of contact electrodes CNE1_2, CNE2_2 and CNE3_2 may be designed to connect the light emitting elements ED in series. The current embodiment is different from the embodiment of FIG. 8 in the structures of the electrodes RME1_2 and RME2_2 and the contact electrodes CNE1_2, CNE2_2 and CNE3_2 and the arrangement of the light emitting elements ED. Hereinafter, any redundant description will be omitted, and differences will be mainly described.

Each of a first electrode RME1_2 and a second electrode RME2_2 includes the electrode stem portion RM_S and a first electrode extension portion RM_E1 and a second electrode extension portion RM_E2 connected to the electrode stem portion RM_S. According to an embodiment, one electrode RME1_2 or RME2_2 includes the electrode stem portion RM_S and a plurality of electrode extension portions RM_E1 and RM_E2 disposed over different subpixels PXn.

The electrode stem portion RM_S is disposed in substantially the same manner as in the embodiment of FIG. 8. The electrode stem portion RM_S of the first electrode RME1_2 extends in the second direction DR2 in the first type subpixel PXA, and the electrode stem portion RM_S of the second electrode RME2_2 extends in the second direction DR2 in the second type subpixel PXB. The electrode stem portion RM_S of the first electrode RME1_2 may be connected to a second voltage wire VL2 through a second contact hole CT2, and the electrode stem portion RM_S of the second electrode RME2_2 may be disposed in a floating state.

The first electrode extension portion RM_E1 may be disposed in the same manner as in the embodiment of FIG. 8, but its length measured in the second direction DR2 may be short. The first electrode extension portion RM_E1 is connected to a side of the electrode stem portion RM_S in the first direction DR1 and has a wider width. The first electrode extension portion RM_E1 may protrude from the side of the electrode stem portion RM_S toward the first side of the first direction DR1 and may be disposed over another subpixel PXn neighboring in the first direction DR1.

The second electrode extension portion RM_E2 may be disposed in a direction opposite to the first electrode extension portion RM_E1. The second electrode extension portion RM_E2 is connected to the other side of the electrode stem portion RM_S and protrudes toward the second side of the first direction DR1. For example, in the case of a second subpixel PX2, the electrode stem portion RM_S of the second electrode RME2_2 is disposed in the second subpixel PX2 and extends in the second direction DR2. The first electrode extension portion RM_E1 of the second electrode RME2_2 protrudes toward the first side of the first direction DR1 and is disposed across a boundary with a third subpixel PX3, and the second electrode extension portion RM_E2 protrudes toward the second side of the first direction DR1 and is disposed across a boundary with a first subpixel PX1. The first electrode extension portion RM_E1 and the second electrode extension portion RM_E2 may protrude toward different subpixels PXn and may be staggered in one subpixel PXn in a plan view. The first electrode extension portion RM_E1 of the second electrode RME2_2 may be spaced apart from the electrode stem portion RM_S of the first electrode RME1_2 disposed in the third subpixel PX3, and the second electrode extension portion RM_E2 may be spaced apart from the electrode stem portion RM_S of the first electrode RME1_2 disposed in the first subpixel PX1. In each emission area EMA, the first electrode extension portion RM_E1 and the second electrode extension portion RM_E2 spaced apart from each other in the second direction DR2 may be disposed.

A plurality of first banks BNL1 may be disposed to overlap the electrode stem portion RM_S of each subpixel PXn or to overlap protruding sides of the electrode extension portions RM_E1 and RM_E2. A first bank BNL1 overlapping the electrode stem portion RM_S may have a greater length in the second direction DR2 than first banks BNL1 overlapping the protruding sides of the electrode extension portions RM_E1 and RM_E2.

In the emission area EMA of each subpixel PXn, one electrode stem portion RM_S and two electrode extension portions RM_E1 and RM_E2 are spaced apart from each other. The electrode stem portion RM_S and the first electrode extension portion RM_E1 of another electrode are spaced apart from each other on an upper side of a center of the emission area EMA, and light emitting elements E_A or ED_B are disposed between them. In addition, the electrode stem portion RM_S and the second electrode extension portion RM_E2 of another electrode are spaced apart from each other on a lower side of the center of the emission area EMA, and light emitting elements ED_C or ED_D may also be disposed between them.

For example, in the first subpixel PX1 which is the first type subpixel PXA, first light emitting elements ED_A having first ends disposed on the electrode stem portion RM_S of the first electrode RME1_2 and second ends disposed on the first electrode extension portion RM_E1 of the second electrode RME2_2 may be disposed. In the second subpixel PX2 which is the second type subpixel PXB, second light emitting elements ED_A having first ends disposed on the first electrode extension portion RM_E1 of the first electrode RME1_2 and second ends disposed on the electrode stem portion RM_S of the second electrode RME2_2 may be disposed. In addition, in the first subpixel PX1, third light emitting elements ED_C having first ends disposed on the electrode stem portion RM_S of the first electrode RME1_2 and second ends disposed on the second electrode extension portion RM_E2 of the second electrode RME2_2 may be disposed. In the second subpixel PX2, fourth light emitting elements ED_D having first ends disposed on the second electrode extension portion RM_E2 of the first electrode RME1_2 and second ends disposed on the electrode stem portion RM_S of the second electrode RME2_2 may be disposed.

First type light emitting elements ED1 disposed in the first type subpixel PXA include the first light emitting elements ED_A and the third light emitting elements ED_C, and second type light emitting elements ED2 disposed in the second type subpixel PXB include the second light emitting elements ED_B and the fourth light emitting elements ED_D. According to an embodiment, since different electrode extension portions RM_E1 and RM_E2 are disposed on both sides of the electrode stem portion RM_S and spaced apart from each other, the first ends of the first light emitting elements ED_A and the third light emitting elements ED_C may face in opposite directions. In addition, the first ends of the second light emitting elements ED_B and the fourth light emitting elements ED_D may face in opposite directions. Different light emitting elements ED_A or ED_B and ED_C or ED_D disposed in each subpixel PXn may be staggered in the emission area EMA in a plan view, similarly to the electrode extension portions RM_E1 and RM_E2 being staggered. That is, an area where the first light emitting elements ED_A are disposed and an area where the third light emitting elements ED_C are disposed may be staggered with each other in the second direction DR2.

As illustrated in FIG. 14, when a first alignment signal Signal1 is transmitted to the first electrode RME1_2 of the first type subpixel PXA and a second alignment signal Signal2 is transmitted to the second electrode RME2_2 of the second type subpixel PXB, electric fields EF1 and EF2 may be generated between each electrode stem portion RM_S and the electrode extension portions RM_E1 and RM_E2 in a direction toward an electrode to which the second alignment signal Signal2 is transmitted. Since the electrode extension portions RM_E1 and RM_E2 are disposed on one side and the other side of the electrode stem portion RM_S in the first direction DR1 in each subpixel PXn, a first electric field EF1 and a second electric field EF2 may be generated in each subpixel PXn. As the electric fields EF1 and EF2 facing in opposite directions are generated in one subpixel PXn, the light emitting elements ED of each subpixel PXn may include a plurality of light emitting elements ED_A or ED_B and ED_C or ED_D whose first ends face in opposite directions.

When the light emitting elements ED in each subpixel PXn are disposed in different spaces, the arrangement of the contact electrodes CNE1_2, CNE2_2 and CNE3_2 connecting the light emitting elements ED may be designed to connect the light emitting elements ED in series. According to an embodiment, each subpixel PXn may include a first contact electrode CNE1_2 contacting the first electrode RME1_2 and the first ends of one group of light emitting elements, a second contact electrode CNE2_2 contacting an electrode contact portion EP and the second ends of another group of light emitting elements, and a third contact electrode CNE3_2 contacting the second ends and the first ends of the different groups of light emitting elements.

For example, in the first type subpixel PXA, the first contact electrode CNE1_2 may contact the electrode stem portion RM_S of the first electrode RME1_2 through a first opening OP1 and contact the first ends of the third light emitting elements ED_C. The second contact electrode CNE2_2 may contact the electrode contact portion EP through a second opening OP2 and contact the second ends of the first light emitting elements ED_A. A first power supply voltage may be transmitted to the second ends of the first light emitting elements ED_A through the second contact electrode CNE2_2, and a second power supply voltage may be transmitted to the first ends of the third light emitting elements ED_C through the first contact electrode CNE1_2.

The third contact electrode CNE3_2 may contact the first ends of the first light emitting elements ED_A and the second ends of the third light emitting elements ED_C. The third contact electrode CNE3_2 may include the electrode stem portion RM_S of the first electrode RME1_2 and a portion disposed on the second electrode extension portion RM_E2 of the second electrode RME2_2 and further include a connection portion connecting them. The third contact electrode CNE3_2 may not directly contact each electrode RME1_2 or RME2_2 but may contact only the light emitting elements ED. The first power supply voltage and the second power supply voltage applied to the first contact electrode CNE1_2 and the second contact electrode CNE2_2 may flow through the third contact electrode CNE3_2, and the light emitting elements ED_A or ED_B and ED_C or ED_D disposed in each subpixel PXn may be connected in series to each other.

According to the current embodiment, since the light emitting elements ED disposed in each subpixel PXn are connected in series, the amount of light emitted per unit area can be increased, and luminance and light emission efficiency can be improved. In addition, since the electrode extension portions RM_E1 and RM_E2 of each electrode RME1_2 or RME2_2 are staggered, areas where the light emitting elements ED_A or ED_B and ED_C or ED_D are disposed may also be staggered. Due to the staggered arrangement of the electrode extension portions RM_E1 and RM_E2, the first ends of the first light emitting elements ED_A and the second ends of the third light emitting elements ED_C may be disposed to face the same direction, and the third contact electrode CNE3_2 may contact ends of different light emitting elements ED_A or ED_B and ED_C or ED_D without crossing the electrode stem portion RM_S. In the display device 10 according to the embodiment, the structure of each electrode RME1_2 or RME2_2 may be designed as in the current embodiment to connect a plurality of light emitting elements ED in series in each subpixel PXn and to minimize a space wasted by a contact electrode connecting the light emitting elements ED. That is, a contact electrode for serial connection or a space from the contact electrode is not required in each subpixel PXn, and an area where the light emitting elements ED are not disposed can be sufficiently secured in each emission area EMA.

Figure 15:
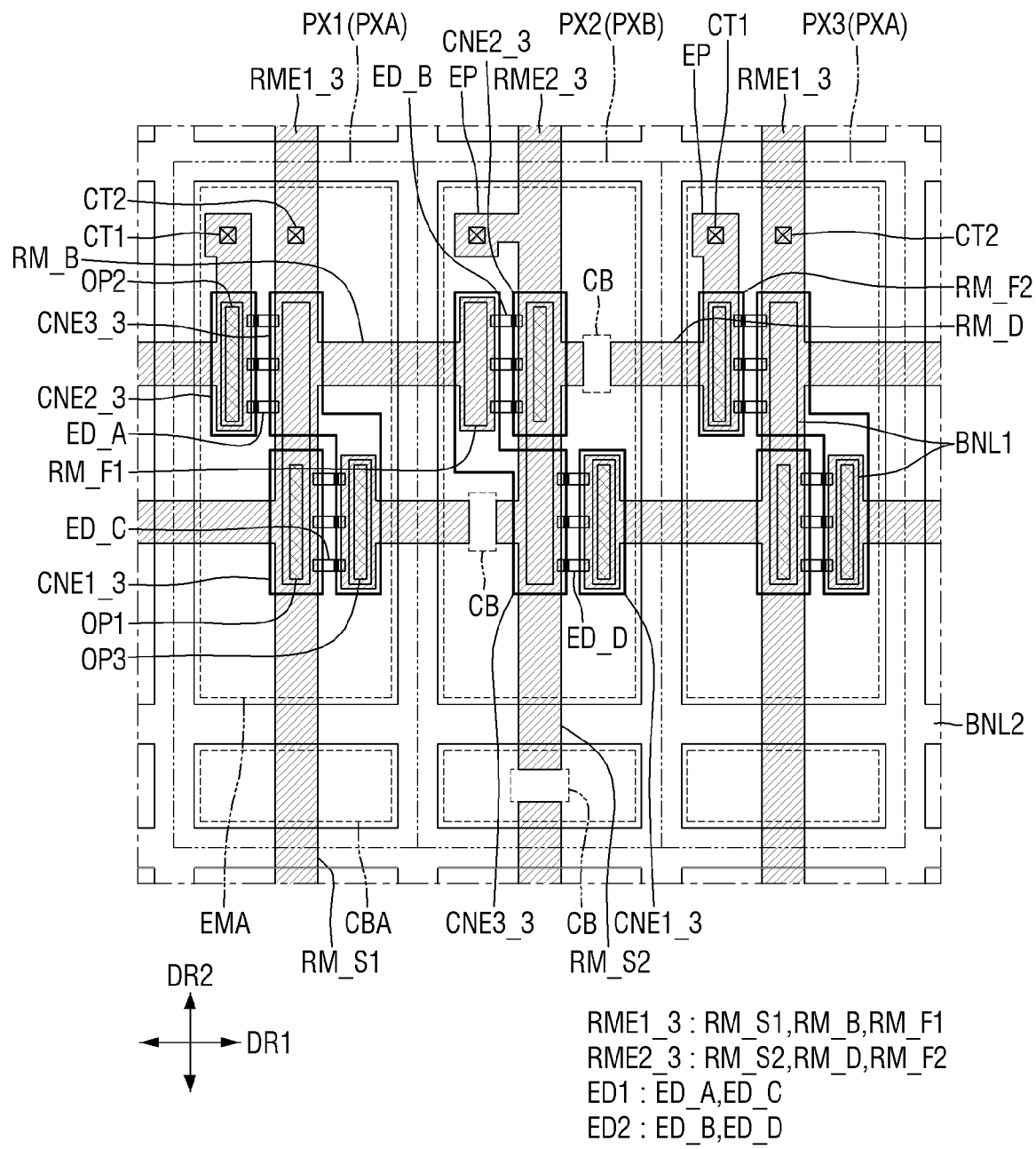
FIG. 15 is a plan view of a pixel of a display device according to an embodiment.

FIG. 15 is a plan view of a pixel of a display device 10 according to an embodiment.

Referring to FIG. 15, in the display device 10 according to the embodiment, a first electrode RME1_3 includes a first electrode stem portion RM_S1, a plurality of first electrode facing portions RM_F1, and a plurality of electrode connection portions RM_B connecting the first electrode facing portions RM_F1 to the first electrode stem portion RM_S1. A second electrode RME2_3 includes a second electrode stem portion RM_S2, a plurality of second electrode facing portions RM_F2, and a plurality of electrode separation portions RM_D connected to the second electrode facing portions RM_S2 but separated from the second electrode stem portion RM_S2. The current embodiment is similar to the embodiment of FIG. 10 in the shape of each electrode RME1_3 or RME2_3, but each electrode RME1_3 or RME2_3 may include a plurality of electrode facing portions RM_F1 or RM_F2 and a plurality of electrode connection portions RM_B or a plurality of electrode separation portions RM_D as in the embodiment of FIG. 12. Accordingly, each subpixel PXn may include a plurality of light emitting elements ED_A or ED_B and ED_C or ED_D, and the light emitting elements ED_A or ED_B and ED_C or ED_D may be connected in series through a third contact electrode CNE3_3. The current embodiment may be derived through a combination of the embodiment of FIG. 10 and the embodiment of FIG. 12. Hereinafter, any redundant description will be omitted, and differences will be mainly described.

The first electrode RME1_3 includes the first electrode stem portion RM_S1, the first electrode facing portions RM_F1, and the electrode connection portions RM_B connecting the first electrode stem portion RM_S1 and the first electrode facing portions RM_F1. The first electrode facing portions RM_F1 may be spaced apart from the second electrode stem portion RM_S2 of the second electrode RME2_3.

The second electrode RME2_3 may include the second electrode stem portion RM_S2, the second electrode facing portions RM_F2, and the electrode separation portions RM_D separated from the second electrode stem portion RM_S2. The second electrode facing portions RM_F2 may be spaced apart from the first electrode stem portion RM_S1 of the first electrode RME1_3.

The second electrode facing portions RM_F2 disposed in a first type subpixel PXA may be connected and integrated with an electrode contact portion EP. The second electrode stem portion RM_S2 disposed in a second type subpixel PXB may also be connected and integrated with an electrode contact portion EP. The electrode contact portion EP may be electrically connected to a first transistor T1 to receive a first power supply voltage, and the first power supply voltage may be transmitted to the second electrode facing portions RM_F2 or the second electrode stem portion RM_S2. Since the second electrode stem portion RM_S2 is split in a cut portion CB of a cut area CBA, the first power supply voltage applied to the electrode contact portion EP may not be transmitted to another subpixel PXn.

First light emitting elements ED_A and third light emitting elements ED_C of first type light emitting elements ED1 have first ends disposed on the first electrode stem portion RM_S1 and second ends disposed on the second electrode facing portions RM_F2. Second light emitting elements ED_B and fourth light emitting elements ED_D of second type light emitting elements ED2 have first ends disposed on the first electrode facing portions RM_F1 and second ends disposed on the second electrode stem portion RM_S2.

A first contact electrode CNE1_3 may be disposed on the first electrode stem portion RM_S1 to contact the first ends of the third light emitting elements ED_C and contact the first electrode stem portion RM_S1 through a first opening OP1. The first contact electrode CNE1_3 may be disposed on a first electrode facing portion RM_F1 to contact the first ends of the fourth light emitting elements ED_D and contact the first electrode facing portion RM_F1 through the first opening OP1. A second contact electrode CNE2_3 may be disposed on a second electrode facing portion RM_F2 to contact the second ends of the first light emitting elements ED_A and contact the second electrode facing portion RM_F2 through a second opening OP2. The second contact electrode CNE2_3 may be disposed on the second electrode stem portion RM_S2 to contact the second ends of the second light emitting elements ED_B and contact the second electrode stem portion RM_S2 through the second opening OP2.

A second power supply voltage may be applied to the first contact electrode CNE1_3 through the first electrode RME1_3, and the first power supply voltage may be applied to the second contact electrode CNE2_3 through the second electrode stem portion RM_S2 or the second electrode facing portion RM_F2 connected or integrated with the electrode contact portion EP.

The third contact electrode CNE3_3 may contact the first ends of the first light emitting elements ED_A and the second ends of the third light emitting elements ED_C. The third contact electrode CNE3_3 may contact the first ends of the second light emitting elements ED_B and the second ends of the fourth light emitting elements ED_D. The third contact electrode CNE3_3 may be disposed on a second electrode facing portion RM_F2 disposed in the first type subpixel PXA and may contact the second electrode facing portion RM_F2 through a third opening OP3. The second electrode facing portion RM_F2 may be separated from the second electrode stem portion RM_S2 and thus may be in a floating state. However, since the second electrode facing portion RM_F2 is connected to the third contact electrode CNE3_3, it may not float when the first type subpixel PXA emits light. Instead, a predetermined voltage may be applied to the second electrode facing portion RM_F2. Other details are substantially the same as those described above.

Figure 16:
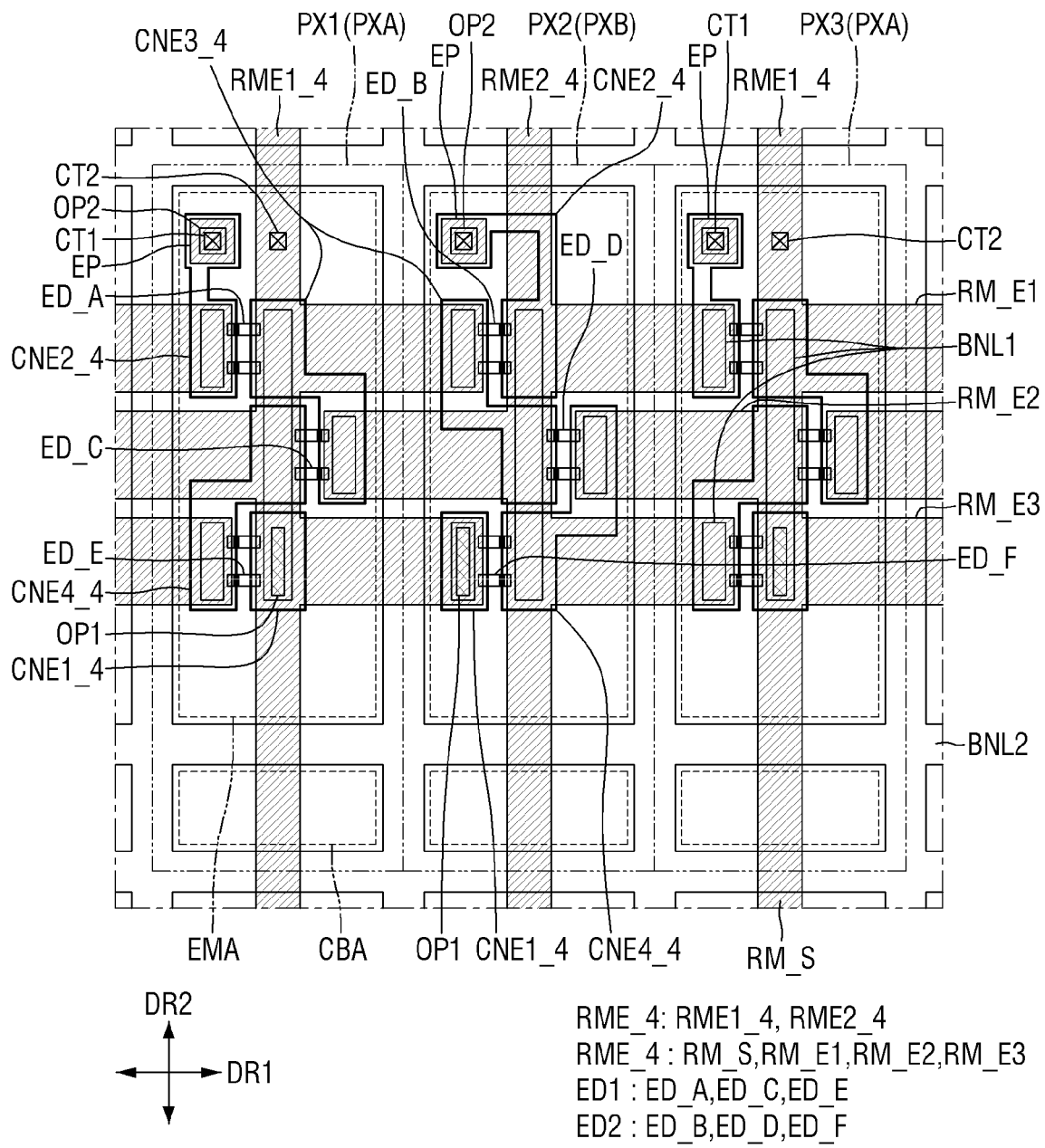
FIG. 16 is a plan view of a pixel of a display device according to an embodiment.

FIG. 16 is a plan view of a pixel of a display device 10 according to an embodiment.

Referring to FIG. 16, in the display device 10, each electrode RME1_4 or RME2_4 may further include more electrode extension portions RM_E1, RM_E2 and RM_E3, and each subpixel PXn may include more light emitting elements ED and more contact electrodes CNE1_4, CNE2_4, CNE3_4 and CNE4_4. The current embodiment is different from the embodiment of FIG. 12 in that each electrode RME1_4 or RME2_4 further includes a third electrode extension portion RM_E3. Hereinafter, any redundant description will be omitted, and the added third electrode extension portion RM_E3, fourth contact electrode CNE4_4, and fifth and sixth light emitting elements ED_E and ED_F will be described.

The third electrode extension portion RM_E3 is disposed in substantially the same shape as a first electrode extension portion RM_E1. The first electrode extension portion RM_E1, a second electrode extension portion RM_E2, and the third electrode extension portion RM_E3 may be sequentially disposed along a direction in which an electrode stem portion RM_S extends but may be staggered in the second direction DR2 in a plan view. That is, the first electrode extension portion RM_E1 and the third electrode extension portion RM_E3 may protrude toward the first side of the first direction DR1, and the second electrode extension portion RM_E2 may protrude toward the second side of the first direction DR1.

A plurality of first banks BNL1 may be disposed to overlap the electrode stem portion RM_S of each subpixel PXn or to overlap protruding sides of the electrode extension portions RM_E1, RM_E2, RM_E3 and RM_E4. A first bank BNL1 overlapping the electrode stem portion RM_S may have a greater length in the second direction DR2 than first banks BNL1 overlapping the protruding sides of the electrode extension portions RM_E1, RM_E2, RM_E3 and RM_E4.

In a first type subpixel PXA, the third electrode extension portion RM_E3 of a second electrode RME2_4 is spaced apart from the electrode stem portion RM_S of a first electrode RME1_4, and the fifth light emitting elements ED_E are disposed on them. First ends of the fifth light emitting elements ED_E are disposed on the electrode stem portion RM_S of the first electrode RME1_4, and second ends are disposed on the third electrode extension portion RM_E3 of the second electrode RME2_4. In a second type subpixel PXB, the third electrode extension portion RM_E3 of the first electrode RME1_4 is spaced apart from the electrode stem portion RM_S of the second electrode RME2_4, and the sixth light emitting elements ED_F are disposed on them. First ends of the sixth light emitting elements ED_F are disposed on the third electrode extension portion RM_E3 of the first electrode RME1_4, and second ends are disposed on the electrode stem portion RM_S of the second electrode RME2_4.

A first contact electrode CNE1_4 is disposed on the electrode stem portion RM_S or the third electrode extension portion RM_E3 of the first electrode RME1_4. The first contact electrode CNE1_4 may contact the first ends of the fifth light emitting elements ED_E and contact the electrode stem portion RM_S of the first electrode RME1_4 through a first opening OP1. The first contact electrode CNE1_4 may contact the first ends of the sixth light emitting elements ED_F and contact the third electrode extension portion RM_E3 of the first electrode RME1_4 through a first opening OP1.

A second contact electrode CNE2_4 is disposed on the electrode stem portion RM_S or the first electrode extension portion RM_E1 of the second electrode RME2_4. The second contact electrode CNE2_4 may contact second ends of first light emitting elements ED_A and contact an electrode contact portion EP through a second opening OP2. The second contact electrode CNE2_4 may contact second ends of second light emitting elements ED_B and contact an electrode contact portion EP through a second opening OP2.

A third contact electrode CNE3_4 may be disposed over the electrode stem portion RM_S of the first electrode RME1_4 and the second electrode extension portion RM_E2 of the second electrode RME2_4 or may be disposed over the first electrode extension portion RM_E1 of the first electrode RME1_4 and the electrode stem portion RM_S of the second electrode RME2_4. The third contact electrode CNE3_4 is disposed to contact first ends of the first light emitting elements ED_A and second ends of third light emitting elements ED_C. The third contact electrode CNE3_4 is disposed to contact first ends of the second light emitting elements ED_B and second ends of fourth light emitting elements ED_D.

The fourth contact electrode CNE4_4 may be disposed over the electrode stem portion RM_S of the first electrode RME1_4 and the third electrode extension portion RM_E3 of the second electrode RME2_4 or may be disposed over the electrode stem portion RM_S of the second electrode RME2_4 and the second electrode extension portion RM_E2 of the first electrode RME1_4. The fourth contact electrode CNE4_4 is disposed to contact first ends of the third light emitting elements ED_C and the second ends of the fifth light emitting elements ED_E. The fourth contact electrode CNE4_4 is disposed to contact first ends of the fourth light emitting elements ED_D and the second ends of the sixth light emitting elements ED_F.

In the display device 10 according to the embodiment, since each electrode RME1_4 or RME2_4 further includes the third electrode extension portion RM_E3, light emitting elements ED may be disposed in a 3-series structure in each subpixel PXn. The luminance of the display device 10 per unit area can be further improved.

Figure 17:
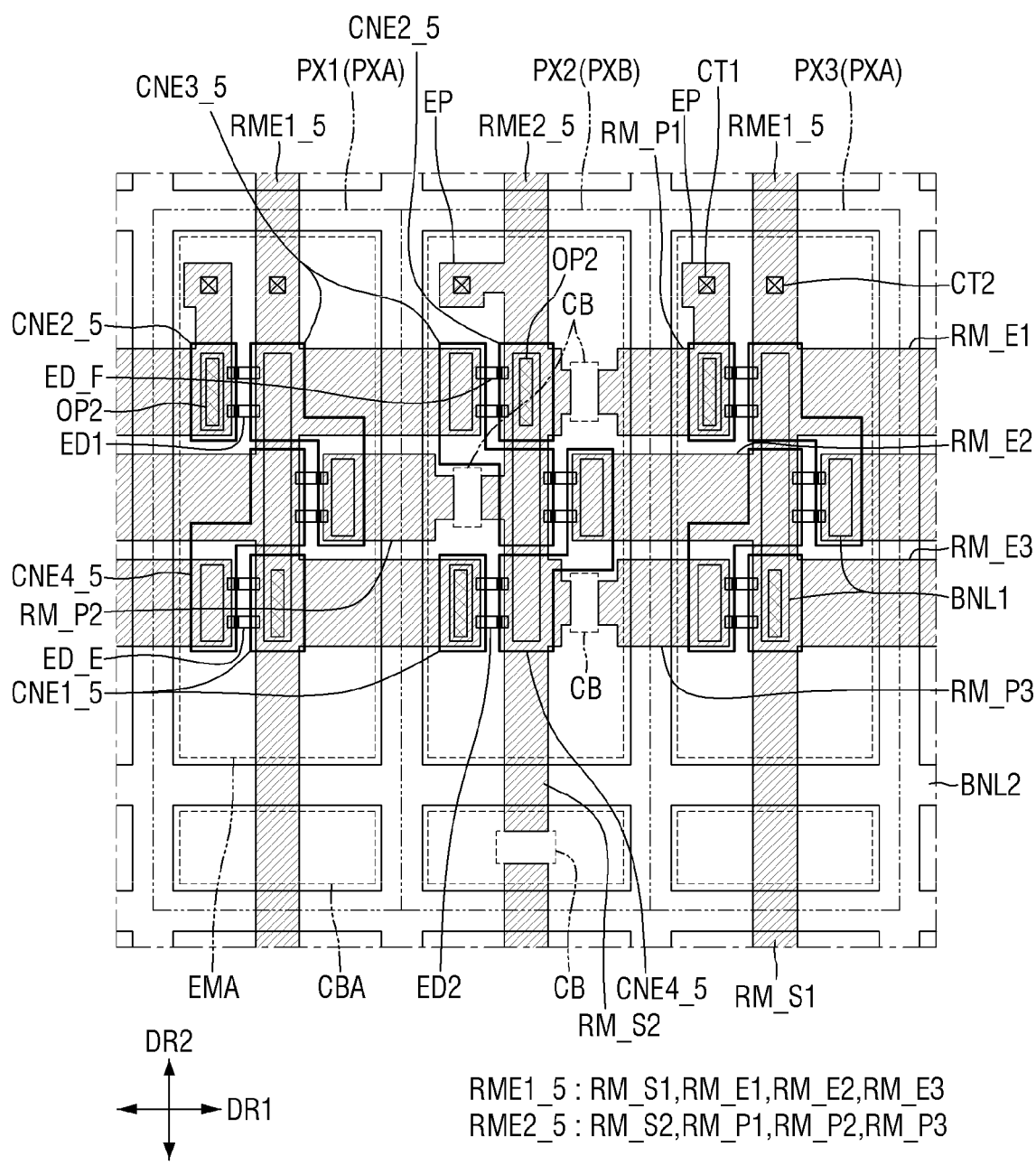
FIG. 17 is a plan view of a pixel of a display device according to an embodiment.

FIG. 17 is a plan view of a pixel of a display device 10 according to an embodiment.

Referring to FIG. 17, the display device 10 according to the embodiment is different from the embodiment of FIG. 16 in that a second electrode RME2_5 includes a plurality of electrode patterns RM_P1, RM_P2 and RM_P3 separated from a second electrode stem portion RM_S2. The current embodiment is the same as the embodiment of FIG. 16 in that a first electrode RME1_5 includes a first electrode stem portion RM_S1 and a plurality of electrode extension portions RM_E1, RM_E2 and RM_E3, but is different from the embodiment of FIG. 16 in that the second electrode RME2_5 has a similar shape to that of the embodiment of FIG. 15. Hereinafter, any redundant description will be omitted, and the second electrode RME2_5 will be described.

The second electrode RME2_5 includes the second electrode stem portion RM_S2 and the electrode patterns RM_P1, RM_P2 and RM_P3 separated from the second electrode stem portion RM_S2. The second electrode stem portion RM_S2 is disposed in a second type subpixel PXB to extend in the second direction DR2 but is split in a cut portion CB of a cut area CBA. The second electrode stem portion RM_S2 may be connected to an electrode contact portion EP, but a first power supply voltage applied to the electrode contact portion EP may not be transmitted to another subpixel PXn.

A first electrode pattern RM_P1 and a third electrode pattern RM_P3 of the second electrode RME2_5 are separated from a side of the second electrode stem portion RM_S2 and disposed over another subpixel PXn located on the first side of the first direction DR1. A second electrode pattern RM_P2 of the second electrode RME2_5 is separated from the other side of the second electrode stem portion RM_S2 and is disposed over another subpixel PXn located on the second side of the first direction DR1. In the case of a second subpixel PX2, the first electrode pattern RM_P1 and the third electrode pattern RM_P3 may be disposed in a third subpixel PX3, and the second electrode pattern RM_P2 may be disposed in a first subpixel PX1. Each of the electrode patterns RM_P1, RM_P2 and RM_P3 may be spaced apart from the first electrode stem portion RM_S1 of the first electrode RME1_5. However, the first electrode pattern RM_P1 of the second electrode RME2_5 may be connected or integrated with an electrode contact portion EP disposed in a first type subpixel PXA to receive the first power supply voltage.

Fifth light emitting elements ED_E of the first type subpixel PXA have first ends disposed on the first electrode stem portion RM_S1 of the first electrode RME1_5 and second ends disposed on the third electrode pattern RM_P3 of the second electrode RME2_6. Sixth light emitting elements ED_F of the second type subpixel PXB have first ends disposed on the third electrode extension portion RM_E3 of the first electrode RME1_5 and second ends disposed on the second electrode stem portion RM_S2 of the second electrode RME2_5.

A first contact electrode CNE1_5 is disposed on the first electrode stem portion RM_S1 or a third electrode extension portion RM_E3 of the first electrode RME1_5. A second contact electrode CNE2_5 is disposed on the second electrode stem portion RM_S2 or the first electrode pattern RM_P1 of the second electrode RME2_5.

A third contact electrode CNE3_5 may be disposed over the first electrode stem portion RM_S1 of the first electrode RME1_5 and the second electrode pattern RM_P2 of the second electrode RME_5 or may be disposed over a first electrode extension portion RM_E1 of the first electrode RME1_5 and the second electrode stem portion RM_S2 of the second electrode RME2_5. A fourth contact electrode CNE4_5 may be disposed over the first electrode stem portion RM_S1 of the first electrode RME1_5 and the third electrode pattern RM_P3 of the second electrode RME2_5 or may be disposed over the second electrode stem portion RM_S2 of the second electrode RME2_5 and a second electrode extension portion RM_E2 of the first electrode RME1_5.

The contact relationship between the contact electrodes and the light emitting elements ED is substantially the same as that of the embodiment of FIG. 16.

In the display device 10 including the electrode stem portion RM_S and the electrode extension portions RM_E1, RM_E2 and RM_E3 or the electrode patterns RM_P1, RM_P2 and RM_P3 connected to the electrode stem portion RM_S, portions of the electrode RME1 or RME2 disposed in each subpixel PXn may be staggered with each other. When each electrode RME1_4 or RME2_4 includes the electrode extension portions RM_E1, RM_E2 and RM_E3 as in the embodiment of FIG. 16, the electrode extension portions RM_E1, RM_E2 and RM_E3 may protrude in opposite directions, and the electrode extension portions RM_E1, RM_E2 and RM_E3 of each of the first electrode RME1_4 and the second electrode RME2_4 may be staggered with each other in a plan view. The structure of each electrode RME may be designed such that more light emitting elements ED and more contact electrodes CNE are disposed per unit area of a subpixel PXn. The display device 10 according to the embodiment may be designed such that the electrode stem portion RM_S of each of the first electrode RME1 and the second electrode RME2 is disposed in one subpixel PXn, and more light emitting elements ED and more contact electrodes CNE versus the area of the subpixel PXn are disposed.

Figure 18:
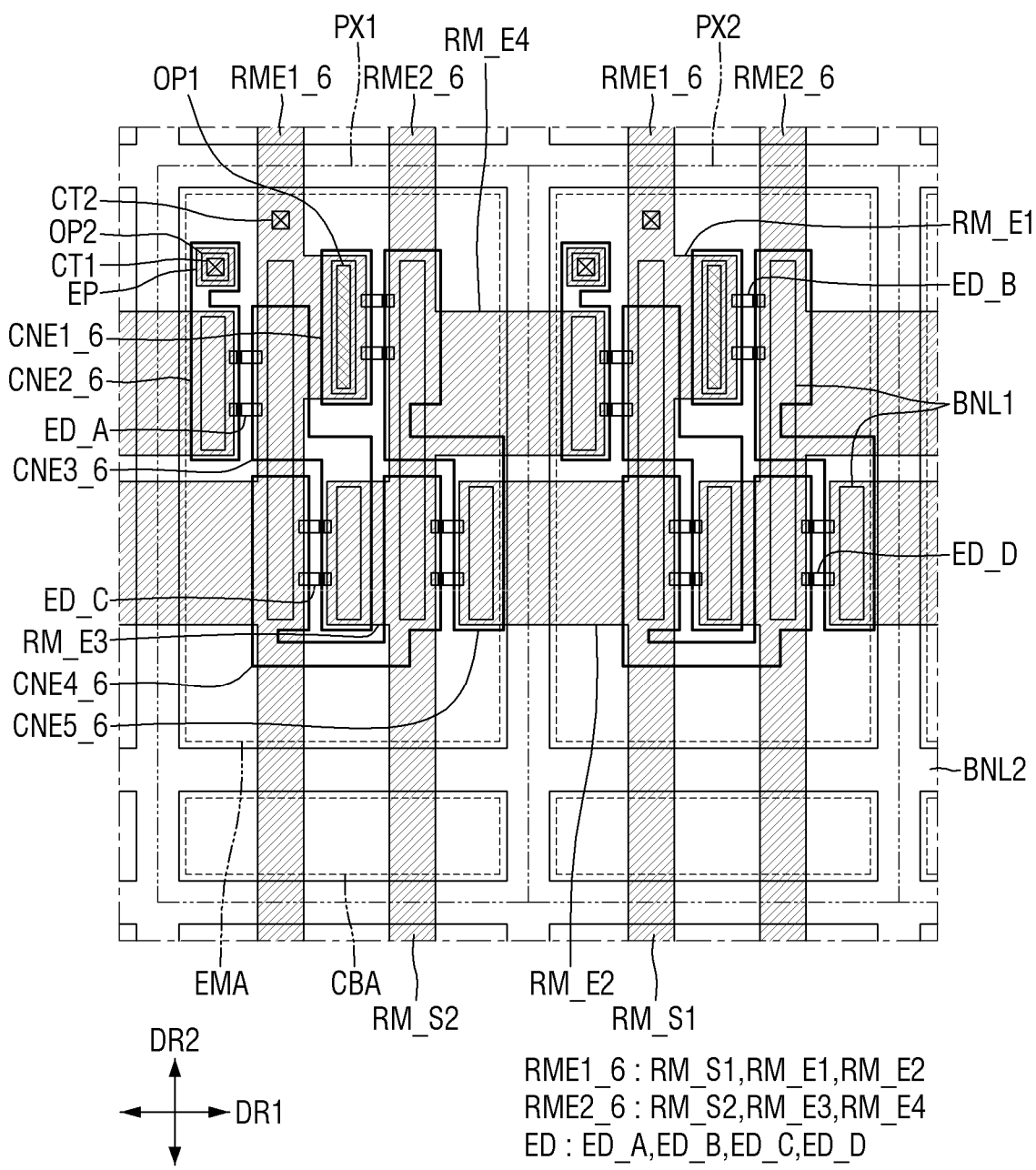
FIG. 18 is a plan view of a pixel of a display device according to an embodiment.

FIG. 18 is a plan view of a pixel of a display device 10 according to an embodiment.

Referring to FIG. 18, in the display device 10 according to the embodiment, respective electrode stem portions RM_S1 and RM_S2 of a first electrode RME1_6 and a second electrode RME2_6 may be disposed in the same subpixel PXn. The first electrode RME1_6 and the second electrode RME2_6 may include electrode extension portions RM_E1, RM_E2, RM_E3 and RM_E4. Some of the electrode extension portions RM_E1, RM_E2, RM_E3 and RM_E4 may be disposed in the corresponding subpixel PXn, and the other expansion portions may be disposed in another subpixel PXn neighboring in the first direction DR1. The current embodiment is different from other embodiments in that the arrangement of light emitting elements ED and contact electrodes is changed as the structures and arrangement of the electrodes RME1_6 and RME2_6 are changed. Hereinafter, any redundant description will be omitted, and the arrangement relationship between the light emitting elements ED and the contact electrodes will be described based on the structures of the first electrode RME1_6 and the second electrode RME2_6.

A first electrode stem portion RM_S1 of the first electrode RME1_6 and a second electrode stem portion RM_S2 of the second electrode RME2_6 may be disposed in each subpixel PXn to extend in the second direction DR2. The first electrode stem portion RM_S1 and the second electrode stem portion RM_S2 may be disposed over an emission area EMA and a cut area CBA. The first electrode stem portion RM_S1 and the second electrode stem portion RM_S2 may be spaced apart from each other in the first direction DR1. Some of the electrode extension portions RM_E1, RM_E2, RM_E3 and RM_E4 may be disposed between the first electrode stem portion RM_S1 and the second electrode stem portion RM_S2, and the light emitting elements ED may be disposed between the electrode extension portions RM_E1, RM_E2, RM_E3 and RM_E4 and the electrode stem portions RM_S1 and RM_S2.

The first electrode stem portion RM_S1 may be electrically connected to a second voltage wire VL2 through a second contact hole CT2, and the second electrode stem portion RM_S2 may be disposed in a floating state without being connected to a circuit layer thereunder. The first electrode stem portion RM_S1 may not be connected to the circuit layer thereunder.

A first electrode extension portion RM_E1 of the first electrode RME1_6 protrudes from a first side of the first electrode stem portion RM_S1 in the first direction DR1 and is disposed between the first electrode stem portion RM_S1 and the second electrode stem portion RM_S2. A second electrode extension portion RM_E2 of the first electrode RME1_6 protrudes from a second side of the first electrode stem portion RM_S1 in the first direction DR1 and is disposed between the first electrode stem portion RM_S1 and the second electrode stem portion RM_S2 disposed in another subpixel PXn. The second electrode extension portion RM_E2 may be disposed over subpixels PXn neighboring in the first direction DR1. The first electrode extension portion RM_E1 and the second electrode extension portion RM_E2 may protrude in a staggered manner so as not to overlap each other in the second direction DR2.

A third electrode extension portion RM_E3 of the second electrode RME2_6 protrudes from a second side of the second electrode stem portion RM_S2 in the first direction DR1 and is disposed between the first electrode stem portion RM_S1 and the second electrode stem portion RM_S2. The third electrode extension portion RM_E3 may be spaced apart from the first electrode extension portion RM_E1 in the second direction DR2. A fourth electrode extension portion RM_E4 of the second electrode RME2_6 protrudes from a first side of the second electrode stem portion RM_S2 in the first direction DR1 and is disposed between the second electrode stem portion RM_S2 and the first electrode stem portion RM_S1 disposed in another subpixel PXn. The fourth electrode extension portion RM_E4 may be disposed over subpixels PXn neighboring in the first direction DR1. The third electrode extension portion RM_E3 and the fourth electrode extension portion RM_E4 may protrude in a staggered manner so as not to overlap each other in the second direction DR2.

Widths of the first electrode extension portion RM_E1 and the third electrode extension portion RM_E3 may be smaller than widths of the second electrode extension portion RM_E2 and the fourth electrode extension portion RM_E4 in the first direction DR1. In addition, the first electrode extension portion RM_E1 and the fourth electrode extension portion RM_E4 may be staggered with each other in the first direction DR1.

The first electrode extension portion RM_E1 and the second electrode stem portion RM_S2 may be spaced apart from each other, the second electrode extension portion RM_E2 and the second electrode stem portion RM_S2 may be spaced apart from each other, and the light emitting elements ED may be disposed between them. In addition, the third electrode extension portion RM_E3 and the first electrode stem portion RM_S1 may be spaced apart from each other, the fourth electrode extension portion RM_E4 and the first electrode stem portion RM_S1 may be spaced apart from each other, and the light emitting elements ED may be disposed between them.

An electrode contact portion EP spaced apart from each of the first electrode stem portion RM_S1 and the fourth electrode extension portion RM_E4 is disposed in each subpixel PXn. The position of the electrode contact portion EP is the same as that described above.

The light emitting elements ED have first ends disposed on the first electrode RME1_6 and second ends disposed on the second electrode RME2_6. For example, the first ends of the light emitting elements ED may be disposed on the first electrode stem portion RM_S1, the first electrode extension portion RM_E1 or the second electrode extension portion RM_E2, and the second ends may be disposed on the second electrode stem portion RM_S2, the third electrode extension portion RM_E3 or the fourth electrode extension portion RM_E4.

First light emitting elements ED_A are disposed on the first electrode stem portion RM_S1 and the fourth electrode extension portion RM_E4. Second light emitting elements ED_B are disposed on the first electrode extension portion RM_E1 and the second electrode stem portion RM_S2, third light emitting elements ED_C are disposed on the first electrode stem portion RM_S1 and the third electrode extension portion RM_E3, and fourth light emitting elements ED_D are disposed on the second electrode extension portion RM_E2 and the second electrode stem portion RM_S2.

A first contact electrode CNE1_6 may be disposed on the first electrode extension portion RM_E1 to contact first ends of the second light emitting elements ED_B. In addition, the first contact electrode CNE1_6 may directly contact the first electrode extension portion RM_E1 through a first opening OP1 and transmit a second power supply voltage received through the first electrode RME1_6 to the second light emitting elements ED_B.

A second contact electrode CNE2_6 may be disposed on the fourth electrode extension portion RM_E4 to contact second ends of the first light emitting elements ED_A. In addition, the second contact electrode CNE2_6 may directly contact the electrode contact portion EP through a second opening OP2 and transmit a first power supply voltage received through the electrode contact portion EP to the first light emitting elements ED_A.

A third contact electrode CNE3_6 may be disposed over the first electrode stem portion RM_S1 and the third electrode extension portion RM_E3 and may contact first ends of the first light emitting elements ED_A and second ends of the third light emitting elements ED_C. A fourth contact electrode CNE4_6 may be disposed over the first electrode stem portion RM_S1 and the second electrode stem portion RM_S2 and may contact first ends of the third light emitting elements ED_C and second ends of the fourth light emitting elements ED_D. The fourth contact electrode CNE4_6 may bypass a portion of the third contact electrode CNE3_6 which is disposed on the third electrode extension portion RM_E3 to surround the portion. A fifth contact electrode CNE5_6 may be disposed over the second electrode extension portion RM_E2 and the second electrode stem portion RM_S2 and may contact first ends of the fourth light emitting elements ED_D and the second ends of the first light emitting elements ED_A.

The first light emitting elements ED_A, the second light emitting elements ED_B, the third light emitting elements ED_C and the fourth light emitting elements ED_D may be connected to each other through the contact electrodes CNE1_6, CNE2_6, CNE3_6, CNE4_6 and CNE5_6. The display device 10 including the electrodes RME1_6 and RME2_6 and the contact electrodes CNE1_6, CNE2_6, CNE3_6, CNE4_6 and CNE5_6 may have a 4-series structure in each subpixel PXn.

Figure 19:
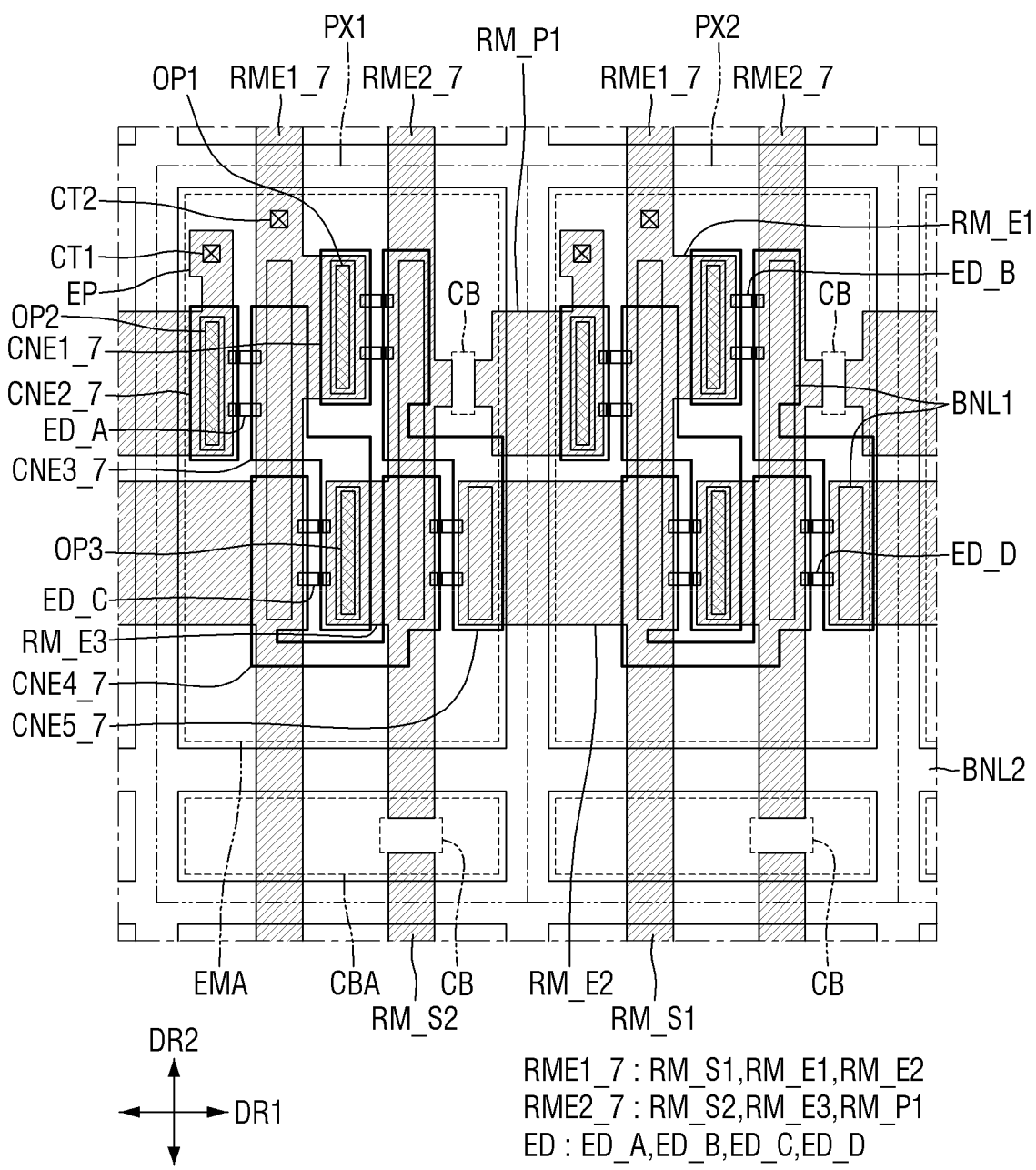
FIG. 19 is a plan view of a pixel of a display device according to an embodiment.

FIG. 19 is a plan view of a pixel of a display device 10 according to an embodiment.

Referring to FIG. 19, in the display device 10, a second electrode stem portion RM_S2 of a second electrode RME2_7 may be split in a cut portion CB of a cut area CBA, and the second electrode RME2_7 may include a first electrode pattern RM_P1 separated from the second electrode stem portion RM_S2 and disposed over subpixels PXn neighboring in the first direction DR1. The current embodiment is different from the embodiment of FIG. 18 in that a fourth electrode extension portion RM_E4 of the second electrode RME2_7 is replaced with the first electrode pattern RM_P1 separated from the second electrode stem portion RM_S2. The arrangement of a first electrode RME1_7, a plurality of contact electrodes CNE1_7, CNE2_7, CNE3_7 and CNE4_7, and light emitting elements ED is substantially the same as that of the embodiment of FIG. 18. Thus, any redundant description will be omitted, and the structure of the second electrode RME2_7 will be described below.

The first electrode pattern RM_P1 of the second electrode RME2_7 may be integrated with an electrode contact portion EP disposed in each subpixel PXn. A first power supply voltage may be applied to the first electrode pattern RM_P1 through the electrode contact portion EP. A second contact electrode CNE2_7 may be disposed on a first electrode facing portion RM_F1 to directly contact the first electrode pattern RM_P1 through a second opening OP2. The first power supply voltage applied to the first electrode pattern RM_P1 may be transmitted to second ends of first light emitting elements ED_A through the second contact electrode CNE2_7.

Since the second electrode stem portion RM_S2 is split in the cut portion CB of the cut area CBA and a cut portion CB of an emission area EMA, an electrical signal may not be directly transmitted from a circuit layer. However, a portion of a third contact electrode CNE3_7 which is disposed on a third electrode extension portion RM_E3 may directly contact the third electrode extension portion RM_E3 through a third opening OP3, and an electrical signal flowing through the third contact electrode CNE3_7 may be transmitted to the second electrode stem portion RM_S2. In the current embodiment, the first power supply voltage and a second power supply voltage for driving the light emitting elements ED may flow through the first electrode RME1_7 and the second electrode RME2_7. Accordingly, each electrode in each subpixel PXn may not be disposed in a floating state, unlike in the embodiment of FIG. 18.

Figure 20:
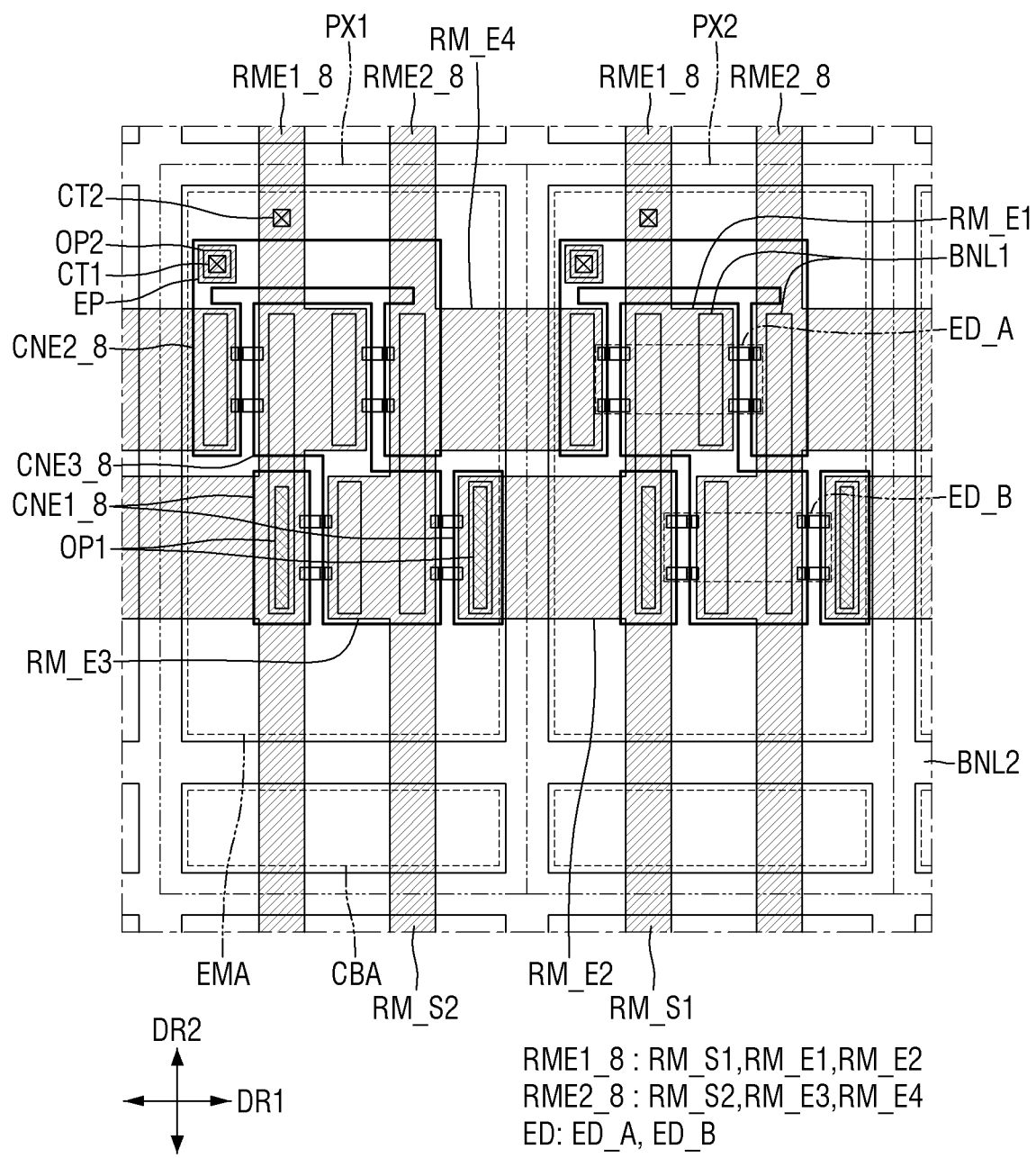
FIG. 20 is a plan view of a pixel of a display device according to an embodiment.

FIG. 20 is a plan view of a pixel of a display device 10 according to an embodiment.

Referring to FIG. 20, the display device 10 is the same as the embodiment of FIG. 18 in the structure of each electrode RME1_8 or RME2_8, but contact electrodes CNE1_8, CNE2_8 and CNE3_8 disposed in each subpixel PXn may simultaneously contact different light emitting elements ED. The light emitting elements ED disposed in each subpixel PXn may be partially connected to each other in series or in parallel. The current embodiment is different from the embodiment of FIG. 18 in that some of the light emitting elements ED are connected in parallel by changing the structures and arrangement of the contact electrodes CNE1_8, CNE2_8 and CNE3_8.

A first electrode extension portion RM_E1 of a first electrode RME1_8 and a fourth electrode extension portion RM_E4 of a second electrode RME2_8 may be disposed side by side in the first direction DR1.

The light emitting elements ED include first light emitting elements ED_A whose first ends are disposed on the first electrode extension portion RM_E1 or on an opposite side of a first electrode stem portion RM_S1 from the first electrode extension portion RM_E1. Second ends of some of the first light emitting elements ED_A are disposed on the fourth electrode extension portion RM_E4, and second ends of the other first light emitting elements ED_A are disposed on a second electrode stem portion RM_S2. In addition, the light emitting elements ED include second light emitting elements ED_B whose second ends are disposed on a third electrode extension portion RM_E3 or on an opposite side of the second electrode stem portion RM_S2 from the third electrode extension portion RM_E3. First ends of some of the second light emitting elements ED_B are disposed on the first electrode stem portion RM_S1, and first ends of the other second light emitting elements ED_B are disposed on a second electrode extension portion RM_E2.

A first contact electrode CNE1_8 may be disposed on the first electrode stem portion RM_S1 or the second electrode extension portion RM_E2 to contact the first ends of the second light emitting elements ED_B. The first contact electrode CNE1_8 may directly contact the first electrode stem portion RM_S1 or the second electrode extension portion RM_E2 through a first opening OP1. A second power supply voltage applied to the first electrode RME1_8 may be transmitted to the first ends of the second light emitting elements ED_B through the first contact electrode CNE1_8.

A second contact electrode CNE2_8 may be disposed over the second electrode stem portion RM_S2 and the fourth electrode extension portion RM_E4 and may contact the second ends of the first light emitting elements ED_A. The second contact electrode CNE2_8 may be disposed on an electrode contact portion EP and may contact the electrode contact portion EP through a second opening OP2. A first power supply voltage applied to the electrode contact portion EP may be transmitted to the second ends of the first light emitting elements ED_A through the second contact electrode CNE2_8.

A third contact electrode CNE3_8 may be disposed over the first electrode stem portion RM_S1, the first electrode extension portion RM_E1, the third electrode extension portion RM_E3 and the second electrode stem portion RM_S2 and may contact the first ends of the first light emitting elements ED_A and the second ends of the second light emitting elements ED_B.

Since the first light emitting elements ED_A and the second light emitting elements ED_B are connected through the third contact electrode CNE3_8, they may be connected in series to each other. The second ends of some of the first light emitting elements ED_A may be disposed on the second electrode stem portion RM_S2 or the fourth electrode extension portion RM_E4 but may simultaneously contact the second contact electrode CNE2_8. The first ends of some of the second light emitting elements ED_B may be disposed on the first electrode stem portion RM_S1 or the second electrode extension portion RM_E2 but may simultaneously contact the first contact electrode CNE1_8. Thus, the second power supply voltage may be applied through the first electrode RME1_8. Accordingly, the first light emitting elements ED_A may be connected in parallel to each other, and the second light emitting elements ED_B may be connected in parallel to each other. In the display device 10 according to the embodiment, the light emitting elements ED may be connected in a 2-series and 2-parallel structure by changing the structures of the electrodes RME1_8 and RME2_8 and the contact electrodes CNE1_8, CNE2_8 and CNE3_8.

Figure 21:
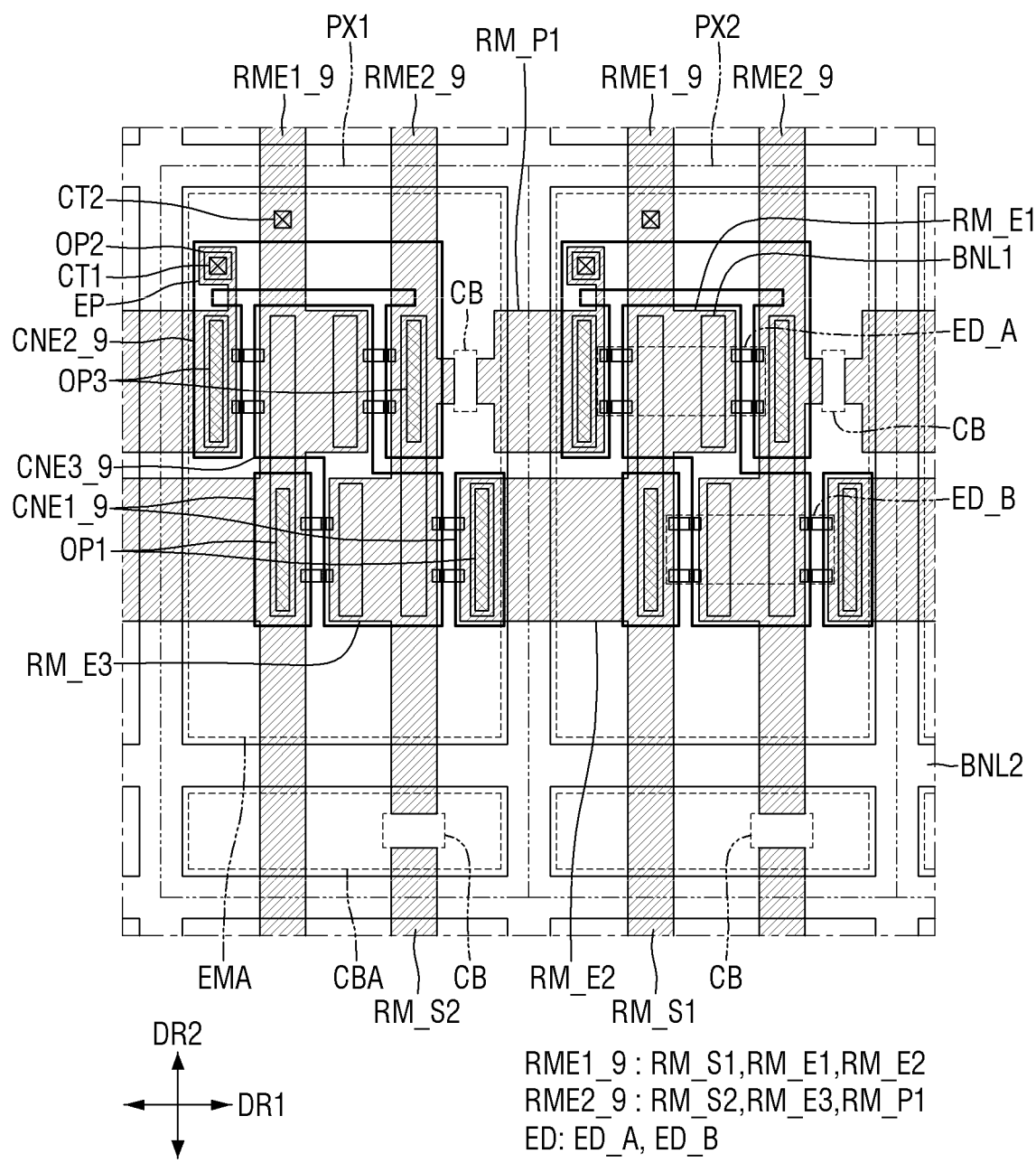
FIG. 21 is a plan view of a pixel of a display device according to an embodiment.

FIG. 21 is a plan view of a pixel of a display device 10 according to an embodiment.

Referring to FIG. 21, the display device 10 is the same as the embodiment of FIG. 19 in the structure of each electrode RME1_8 or RME2_8, but may be the same as the embodiment of FIG. 20 in the arrangement of contact electrodes CNE1_8, CNE2_8 and CNE3_8 disposed in each subpixel PXn. That is, the display device 10 of FIG. 21 is different from the embodiment of FIG. 19 in that some light emitting elements ED are connected in parallel by changing the structures and arrangement of the contact electrodes CNE1_8, CNE2_8 and CNE3_8. The embodiment of FIG. 21 is also different from the embodiment of FIG. 20 in that a fourth electrode extension portion RM_E4 of a second electrode RME2_8 is separated from a second electrode stem portion RM_S2 and disposed as a first electrode pattern RM_P1, and a second contact electrode CNE2_8 contacts each of the second electrode stem portion RM_S2 and the first electrode pattern RM_P1 through a third opening OP3. Other details are the same as those described above.

In a display device according to an embodiment, one electrode is disposed over neighboring subpixels. Thus, the number of electrode lines disposed over the entire display area of the display device can be reduced, thereby preventing a potential short circuit between wires.

In the display device, an emission area can be maximized, and light emitting elements can be connected in series. In a display device according to an embodiment, even if a unit area of each subpixel is minimized, the luminous efficiency of each subpixel can be optimized. Therefore, an ultra-high resolution display device can be implemented.

Many variations and modifications can be made to the example embodiments without departing from the scope defined by the claims.

What is claimed is:
1. A display device comprising:
  subpixels comprising a plurality of first type subpixels and a plurality of second type subpixels which neighbor each other in a first direction and are alternately and repeatedly arranged;
  a plurality of electrodes, each comprising an electrode stem portion which is disposed in each of the subpixels and extends in a second direction and at least one electrode protrusion portion which is connected to the electrode stem portion and disposed over another subpixel neighboring in the first direction;
  a plurality of light emitting elements having a shape of extending in one direction and disposed on the electrode stem portion of the one electrode and the electrode protrusion portion of the other electrode; and
  a plurality of first contact electrodes contacting a first end of the light emitting elements and a plurality of second contact electrodes contacting a second end of the light emitting elements,
  wherein the light emitting elements comprise first type light emitting elements disposed in each of the first type subpixels and of which the first end is disposed on the electrode stem portion and second type light emitting elements disposed in each of the second type subpixels and of which the first end is disposed on the electrode protrusion portion, the first ends of the first type light emitting elements and the second type light emitting elements face in opposite directions, and one electrode of the plurality of electrodes and an other electrode of the plurality of electrodes which are adjacent to each other are disposed over two subpixels neighboring in the first direction.

2. The display device of claim 1, wherein the plurality of electrodes comprises the one electrode whose electrode stem portion is disposed in each of the first type subpixels and the other electrode whose electrode stem portion is disposed in each of the second type subpixels, wherein the electrode protrusion portion of the one electrode is spaced apart from the electrode stem portion of the other electrode in each of the second type subpixels, and the electrode protrusion portion of the other electrode is spaced apart from the electrode stem portion of the one electrode in another the first type subpixels.

3. The display device of claim 2, wherein a first contact electrode disposed in each of the first type subpixels is disposed on the electrode stem portion of the one electrode, a first contact electrode disposed in each of the second type subpixels is disposed on the electrode protrusion portion of the one electrode, a second contact electrode disposed in each of the first type subpixels is disposed on the electrode protrusion portion of the other electrode, and a second contact electrode disposed in each of the second type subpixels is disposed on the electrode stem portion of the other electrode.

4. The display device of claim 2, further comprising a plurality of electrode contact portions, each disposed in each of the first type subpixels and the second type subpixels and spaced apart from the one electrode and the other electrode.

5. The display device of claim 4, wherein each of the first contact electrodes and the second contact electrodes comprises a portion extending in the second direction, and each of the second contact electrodes further comprises a portion contacting an electrode contact portion.

6. The display device of claim 5, wherein a first power supply voltage is applied to each of the electrode contact portions, a second power supply voltage is applied to the the one electrode, the first power supply voltage is transmitted to the second ends of the light emitting elements through each of the second contact electrodes, and the second power supply voltage is transmitted to the first ends of the light emitting elements through each of the first contact electrodes.

7. The display device of claim 2, wherein each of the one electrode and the other electrode comprises a first electrode protrusion portion protruding toward a first side of the first direction and a second electrode protrusion portion protruding toward a second side of the first direction, wherein the first electrode protrusion portion of the one electrode is spaced apart from the electrode stem portion of the other electrode in each of the second type subpixels, the second electrode protrusion portion of the other electrode is spaced apart from the electrode stem portion of the one electrode in each of the first type subpixels, and the first electrode protrusion portion of the one electrode is spaced apart from the second electrode protrusion portion of the other electrode in the second direction.

8. The display device of claim 7, wherein the first type light emitting elements comprise a first light element whose the second end is disposed on the first electrode protrusion portion of the other electrode and a second light emitting element whose the second end is disposed on the second electrode protrusion portion of the the other electrode, and the second type light emitting elements comprise a third light emitting element whose the first end is disposed on the first electrode protrusion portion of the one electrode and a fourth light emitting element whose the first end is disposed on the second electrode protrusion portion of the one electrode.

9. The display device of claim 8, wherein the first contact electrode disposed in each of the first type subpixels is disposed on the electrode stem portion of the one electrode and contacts the first end of the second light emitting element, the second contact electrode disposed in each of the first type subpixels is disposed on the first electrode protrusion portion of the other electrode and contacts the second end of the first light emitting element, and further comprising a third contact electrode which is disposed to contact the first end of the first light emitting element and the second end of the second light emitting element.

10. The display device of claim 9, wherein the third contact electrode is disposed over the electrode stem portion of the one electrode and the second electrode protrusion portion of the other electrode.

11. The display device of claim 8, wherein each of the one electrode and the other electrode further comprises a third electrode protrusion portion which protrudes toward the first side of the first direction, the first type light emitting elements further comprise a fifth light emitting element whose the second end is disposed on the third electrode protrusion portion of the other electrode, and the second type light emitting elements further comprise a sixth light emitting element whose the first end is disposed on the third electrode protrusion portion of the one electrode.

12. The display device of claim 11, wherein the first contact electrode disposed in each of the first type subpixels is disposed on the electrode stem portion of the one electrode and contacts the first end of the fifth light emitting element, the second contact electrode disposed in each of the first type subpixels is disposed on the first electrode protrusion portion of the other electrode and contacts the second end of the first light emitting element, and further comprising a third contact electrode which is disposed to contact the first end of the first light emitting element and the second end of the second light emitting element and a fourth contact electrode which is disposed to contact the first end of the second light emitting element and the second end of the fifth light emitting element.

13. A display device comprising:

subpixels comprising a plurality of first type subpixels and a plurality of second type subpixels which neighbor each other in a first direction and are alternately and repeatedly arranged;

a plurality of electrodes, each comprising an electrode stem portion which is disposed in each of the subpixels and extends in a second direction and at least one electrode protrusion portion which is connected to the electrode stem portion and disposed over another subpixel neighboring in the first direction;

a plurality of light emitting elements having a shape of extending in one direction and disposed on the electrode stem portion of one electrode and the electrode protrusion portion of an other electrode; and a plurality of first contact electrodes contacting a first end of the light emitting elements and a plurality of second contact electrodes contacting a second end of the light emitting elements, wherein the light emitting elements comprise first type light emitting elements disposed in each of the first type subpixels and of which the first end is disposed on the electrode stem portion and second type light emitting elements disposed in each of the second type subpixels and of which the first end is disposed on the electrode protrusion portion, and the first ends of the first type light emitting elements and the second type light emitting elements face in opposite directions, wherein the plurality of electrodes comprises the one electrode whose electrode stem portion is disposed in each of the first type subpixels and the other electrode whose electrode stem portion is disposed in each of the second type subpixels, wherein the electrode protrusion portion of the one electrode is spaced apart from the electrode stem portion of the other electrode in each of the second type subpixels, the electrode protrusion portion of the other electrode is spaced apart from the electrode stem portion of the one electrode in another the first type subpixels a first contact electrode disposed in each of the first type subpixels is disposed on the electrode stem portion of the one electrode, a first contact electrode disposed in each of the second type subpixels is disposed on the electrode protrusion portion of the one electrode, a second contact electrode disposed in each of the first type subpixels is disposed on the electrode protrusion portion of the other electrode, and a second contact electrode disposed in each of the second type subpixels is disposed on the electrode stem portion of the other electrode, and wherein each of the first contact electrodes directly contacts the one electrode, and each of the second contact electrodes does not contact the other electrode.

14. A display device comprising:
a plurality of first subpixels and a plurality of second subpixels which neighbor each other in a first direction and are alternately and repeatedly arranged;
a first electrode which comprises a first electrode stem portion disposed in each of the first subpixels and extending in a second direction, a first electrode facing portion disposed in each of the second subpixels and extending in the second direction, and an electrode connection portion connecting the first electrode stem portion and the first electrode facing portion;
a second electrode which comprises a second electrode stem portion disposed in each of the second subpixels and extending in the second direction, a second electrode facing portion disposed in each of the first subpixels and extending in the second direction, and an electrode separation portion connected to the second electrode facing portion but is separated from the second electrode stem portion;
a plurality of light emitting elements which have a first end disposed on the first electrode and a second end disposed on the second electrode; and a plurality of first contact electrodes which are disposed on the first electrode and contacts the first end of the light emitting elements, and a plurality of second contact electrodes which are disposed on the second electrode to contacts the second end of the light emitting elements, wherein the light emitting elements comprise a first light emitting elements disposed in each of the first subpixels and of which the first end is disposed on the first electrode stem portion and the second end is disposed on the second electrode facing portion and a second light emitting elements disposed in each of the second subpixels and of which the first end is disposed on the first electrode facing portion and the second end is disposed on the second electrode stem portion, and each of the first electrode and the second electrode which are adjacent to each other is disposed over two subpixels neighboring in the first direction.

15. The display device of claim 14, wherein a first contact electrode disposed in each of the first subpixels is disposed on the first electrode stem portion,
a first contact electrode disposed in each of the second subpixels is disposed on the first electrode facing portion,
a second contact electrode disposed in each of the first subpixels is disposed on the second electrode facing portion, and
a second contact electrode disposed in each of the second subpixels is disposed on the second electrode stem portion.

16. The display device of claim 15, wherein each of the first contact electrodes directly contacts the first electrode stem portion or the first electrode facing portion and
each of the second contact electrodes directly contacts the second electrode stem portion or the second electrode facing portion.

17. The display device of claim 14, wherein the first electrode comprises a plurality of electrode connection portions connected to a first side and a second side of the first electrode stem portion in the first direction and a plurality of first electrode facing portions respectively connected to the electrode connection portions and disposed on the first side or the second side of the first electrode stem portion in the first direction, and
the second electrode comprises a plurality of second electrode facing portions disposed on a first side or a second side of the second electrode stem portion in the first direction and spaced apart from the second electrode stem portion.

18. The display device of claim 17, wherein the light emitting elements further comprise a third light emitting element disposed in each of the first subpixels and of which the first end is disposed on the first electrode stem portion and the second end is disposed on a second electrode facing portion disposed on the second side of the second electrode stem portion in the first direction.

19. The display device of claim 18, further comprising a third contact electrode which is disposed to contact the first end of the first light emitting element and the second end of the third light emitting element.

20. The display device of claim 19, wherein the third contact electrode directly contacts the second electrode facing portion disposed on the second side of the second electrode stem portion in the first direction.

* * * * *